(12) United States Patent
Abe et al.

(10) Patent No.: US 10,361,358 B2
(45) Date of Patent: Jul. 23, 2019

(54) SPIN ORBIT TORQUE (SOT) MRAM HAVING A SOURCE LINE CONNECTED TO A SPIN ORBIT CONDUCTIVE LAYER AND ARRANGED ABOVE A MAGNETORESISTIVE ELEMENT

(71) Applicant: KABUSHIKI KAISHA TOSHIBA, Minato-ku (JP)

(72) Inventors: Keiko Abe, Yokohama (JP); Kazutaka Ikegami, Inagi (JP); Shinobu Fujita, Koto (JP); Katsuhiko Koui, Yokohama (JP); Tomoaki Inokuchi, Yokohama (JP); Satoshi Shirotori, Yokohama (JP); Yuichi Ohsawa, Yokohama (JP); Hideyuki Sugiyama, Kawasaki (JP); Hiroaki Yoda, Kawasaki (JP); Naoharu Shimomura, Meguro (JP); Yuuzo Kamiguchi, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/704,867

(22) Filed: Sep. 14, 2017

(65) Prior Publication Data
US 2018/0277746 A1 Sep. 27, 2018

(30) Foreign Application Priority Data
Mar. 21, 2017 (JP) .................. 2017-055168

(51) Int. Cl.
*G11C 11/16* (2006.01)
*H01L 27/22* (2006.01)
(Continued)

(52) U.S. Cl.
CPC ............ *H01L 43/02* (2013.01); *G11C 11/161* (2013.01); *G11C 11/1659* (2013.01);
(Continued)

(58) Field of Classification Search
CPC ....... H01L 43/00–14; H01L 27/22–228; G11C 11/02–18
See application file for complete search history.

(56) References Cited

U.S. PATENT DOCUMENTS

| 8,416,618 B2 * | 4/2013 | Gaudin | G11C 11/18 |
| | | | 365/148 |
| 8,963,222 B2 * | 2/2015 | Guo | H01L 43/04 |
| | | | 257/295 |

(Continued)

FOREIGN PATENT DOCUMENTS

| JP | 2014-045196 | 3/2014 |
| JP | 5486731 | 5/2014 |

(Continued)

OTHER PUBLICATIONS

U.S. Appl. No. 15/453,626, filed Mar. 8, 2017, Noguchi, et al.

*Primary Examiner* — Marc Anthony Armand
*Assistant Examiner* — Younes Boulghassoul
(74) *Attorney, Agent, or Firm* — Oblon, McClelland, Maier & Neustadt, L.L.P.

(57) ABSTRACT

A magnetic memory includes: first to fourth wirings; first and second terminals; a first conductive layer including first to third regions, the second region being between the first region and the third region, the first region being electrically connected to the first terminal, and the third region being electrically connected to the second terminal; a first magnetoresistive element including a first and a second magnetic layer, and a first nonmagnetic layer disposed between the first and the magnetic layer; a first transistor including a third terminal electrically connected to the first magnetic layer, a fourth terminal electrically connected to the third wiring, and a first control terminal electrically connected to the first wiring; and a second transistor including a fifth terminal electrically connected to the first terminal, a sixth terminal electrically connected to the second wiring, and a second control terminal electrically connected to the first wiring.

10 Claims, 74 Drawing Sheets

(51) Int. Cl.
  *H01L 43/02* (2006.01)
  *H01L 43/08* (2006.01)
  *H01L 43/12* (2006.01)

(52) U.S. Cl.
  CPC ........ *G11C 11/1675* (2013.01); *H01L 27/228* (2013.01); *H01L 43/08* (2013.01); *G11C 11/165* (2013.01); *H01L 43/12* (2013.01)

(56) References Cited

U.S. PATENT DOCUMENTS

| | | | |
|---|---|---|---|
| 9,076,537 B2 | 7/2015 | Khvalkovskiy et al. | |
| 9,082,497 B2 | 7/2015 | Suzuki | |
| 9,105,830 B2 | 8/2015 | Khvalkovskiy et al. | |
| 2012/0241881 A1* | 9/2012 | Daibou | H01L 43/10 257/421 |
| 2014/0001524 A1* | 1/2014 | Manipatruni | H01L 43/08 257/295 |
| 2016/0042778 A1 | 2/2016 | Manipatruni et al. | |
| 2016/0064650 A1* | 3/2016 | Wang | H01L 27/228 257/427 |
| 2016/0225423 A1* | 8/2016 | Naik | H01L 43/08 |
| 2016/0232958 A1* | 8/2016 | Bandiera | H01F 10/3254 |
| 2016/0276006 A1* | 9/2016 | Ralph | G11C 11/18 |
| 2017/0077177 A1* | 3/2017 | Shimomura | H01L 27/11582 |
| 2017/0169872 A1* | 6/2017 | Yoda | G11C 11/1675 |
| 2018/0040358 A1* | 2/2018 | Noguchi | G11C 11/161 |
| 2018/0114557 A1* | 4/2018 | Park | H01L 43/06 |
| 2018/0114898 A1* | 4/2018 | Lee | G11C 11/161 |
| 2018/0151210 A1* | 5/2018 | Li | G11C 11/161 |

FOREIGN PATENT DOCUMENTS

| | | |
|---|---|---|
| JP | 5985728 | 9/2016 |
| JP | 2017-059679 | 3/2017 |
| JP | 2017-112351 | 6/2017 |
| JP | 6271655 B1 | 1/2018 |

\* cited by examiner

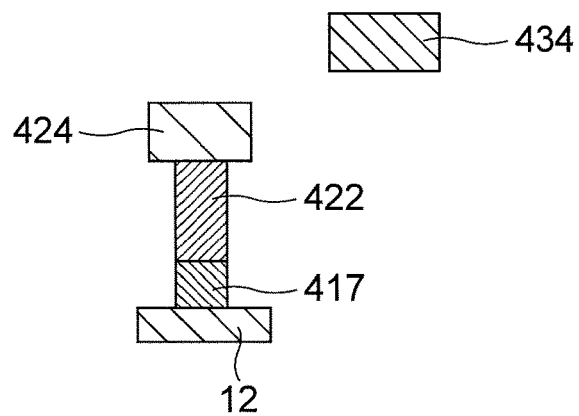
FIG.56B
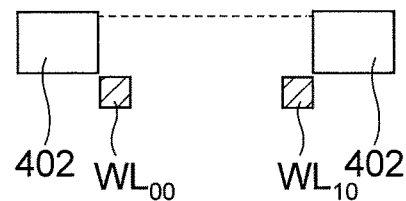
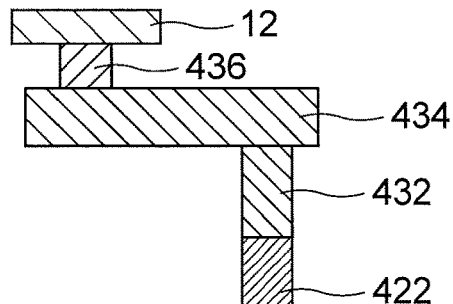
FIG.56C
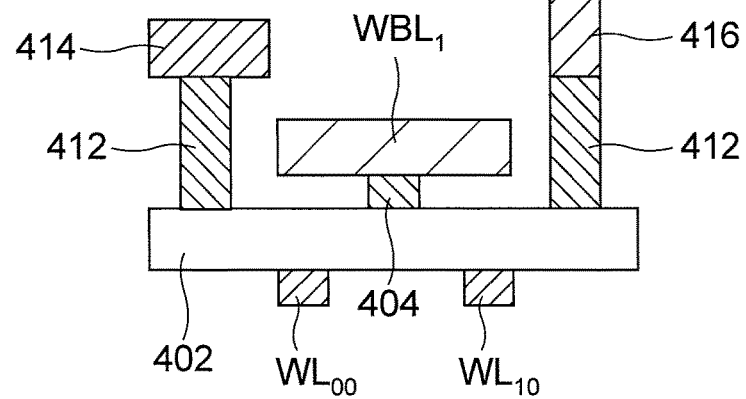

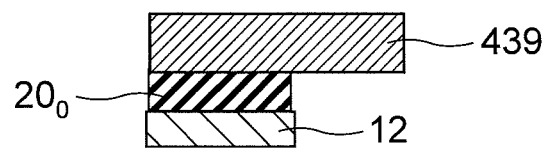
FIG.56D
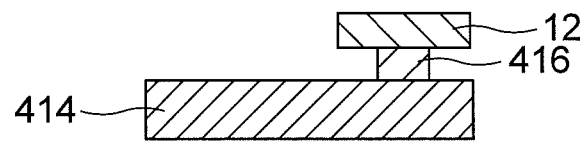
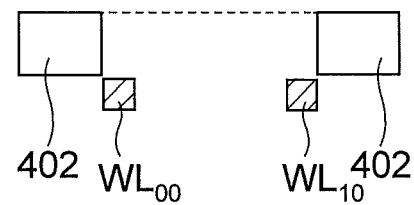

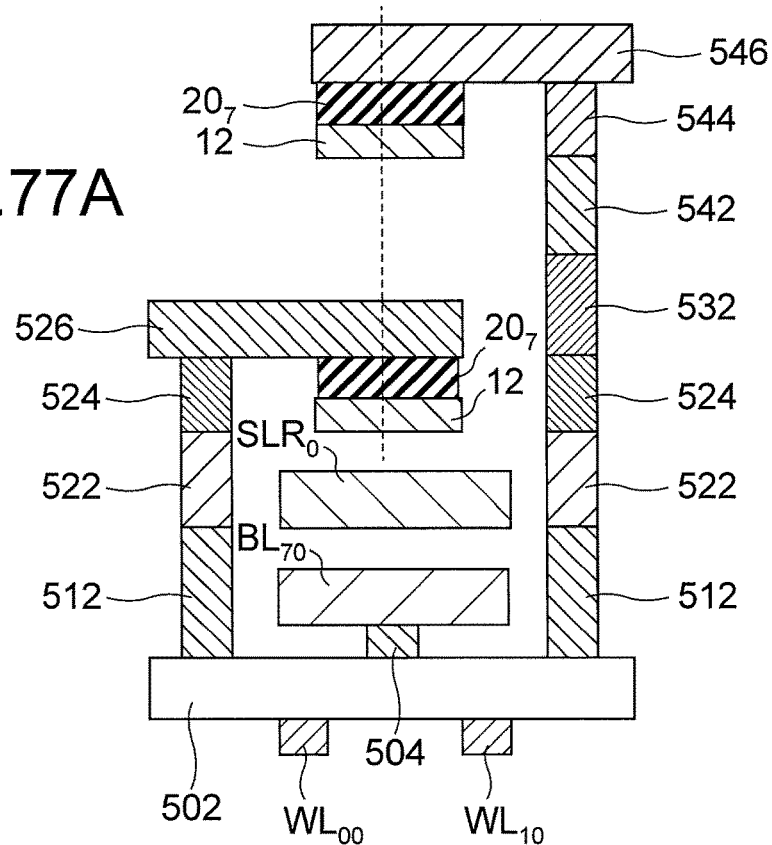
FIG.77A
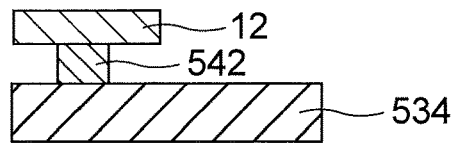
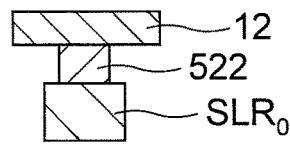
FIG.77B
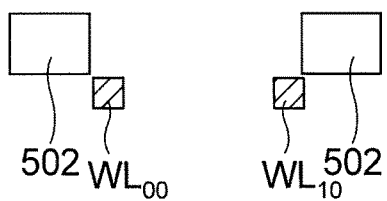

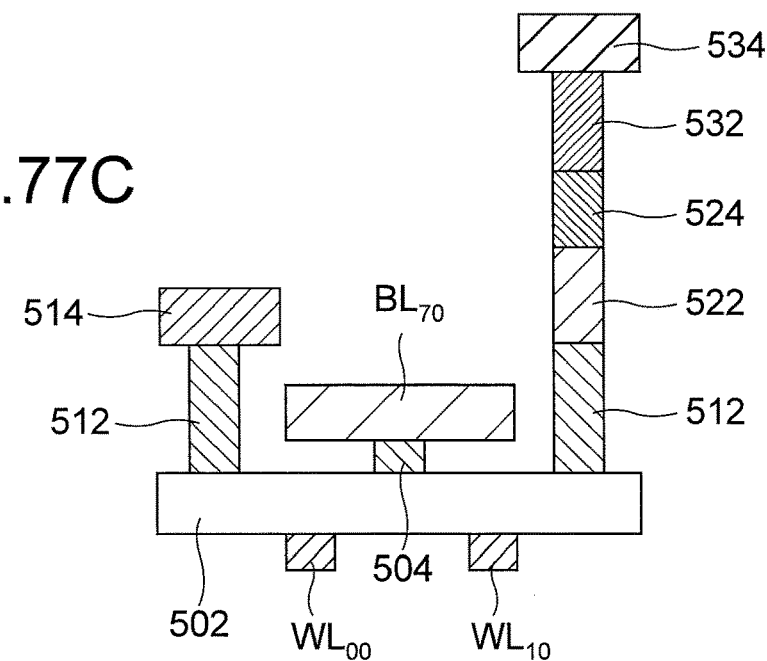
FIG.77C
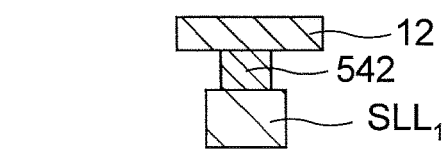
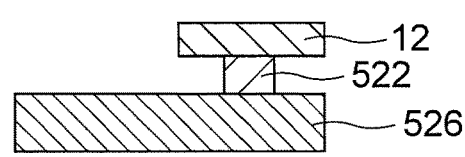
FIG.77D
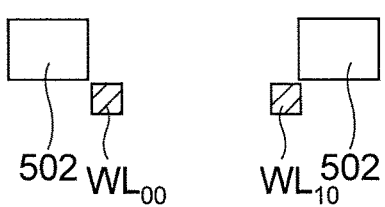

SPIN ORBIT TORQUE (SOT) MRAM HAVING A SOURCE LINE CONNECTED TO A SPIN ORBIT CONDUCTIVE LAYER AND ARRANGED ABOVE A MAGNETORESISTIVE ELEMENT

CROSS REFERENCE TO RELATED APPLICATIONS

This application is based upon and claims the benefit of priority from the prior Japanese Patent Application No. 2017-055168, filed on Mar. 21, 2017, the entire contents of which are incorporated herein by reference.

FIELD

Embodiments described herein relate generally to magnetic memories.

BACKGROUND

Spin orbit torque-magnetic random access memories (SOT-MRAMs) have been proposed, which are magnetic memories operating on the principle that data "0" is switched to data "1," or vice versa, by reversing the spin direction in a storage layer of a magnetic tunnel junction (MTJ) element using spin orbit torque.

As the memory capacity increases, the cost per one bit (bit cost) of memory cells is required to be reduced as much as possible. One option for reducing the bit cost is reducing the area of a one-bit cell.

Examples of physical layout for forming an MTJ selection transistor for selecting an MTJ element in an SOT-MRAM, which is a planar transistor, have been known. A planar transistor here means a transistor in which the channel (current path) extends along the surface of a semiconductor substrate. No layout example for forming an SO (Spin Orbit) layer selection transistor for selecting an SO layer, which is a conductive layer providing the spin orbit torque, has been disclosed.

BRIEF DESCRIPTION OF THE DRAWINGS

FIG. 56B is a cross-sectional view taken along line B-B in FIG. 55.

FIG. 56C is a cross-sectional view taken along line C-C in FIG. 55.

FIG. 56D is a cross-sectional view taken along line D-D in FIG. 55.

FIG. 77A is a cross-sectional view taken along line A-A in FIG. 76.

FIG. 77B is a cross-sectional view taken along line B-B in FIG. 76.

FIG. 77C is a cross-sectional view taken along line C-C in FIG. 76.

FIG. 77D is a cross-sectional view taken along line D-D in FIG. 76.

DETAILED DESCRIPTION

A magnetic memory according to an embodiment includes: a first wiring, a second wiring, a third wiring, and a fourth wiring; a first terminal, and a second terminal electrically connected to the fourth wiring; a first conductive layer including a first region, a second region, and a third region, the second region being between the first region and the third region, the first region being electrically connected to the first terminal, and the third region being electrically connected to the second terminal; a first magnetoresistive element disposed corresponding to the second region and including a first magnetic layer, a second magnetic layer disposed between the first magnetic layer and the second region, and a first nonmagnetic layer disposed between the first magnetic layer and the second magnetic layer; a first transistor including a third terminal electrically connected to the first magnetic layer, a fourth terminal electrically connected to the third wiring, and a first control terminal electrically connected to the first wiring; and a second transistor including a fifth terminal electrically connected to the first terminal, a sixth terminal electrically connected to the second wiring, and a second control terminal electrically connected to the first wiring.

Embodiments will now be described with reference to the accompanying drawings.

First Embodiment

Figure 1:
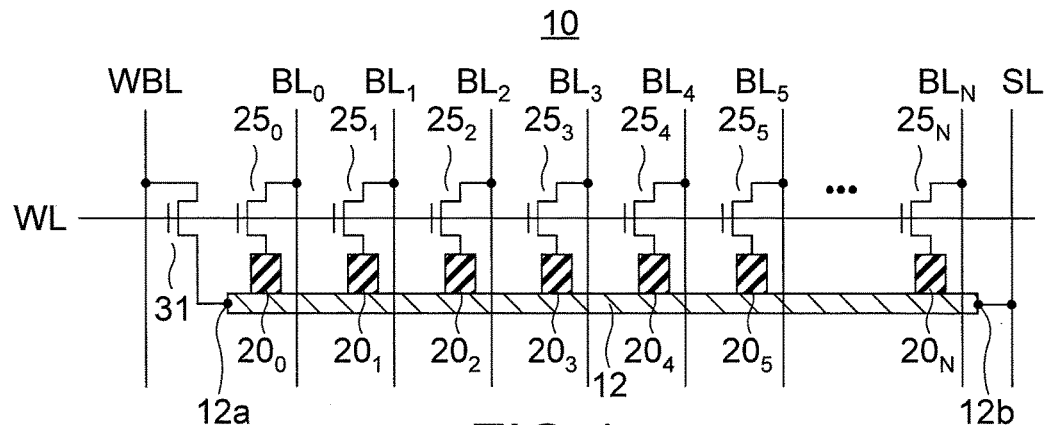
FIG. 1 is a circuit diagram illustrating an example of a memory cell of a magnetic memory according to a first embodiment.

FIG. 1 shows a magnetic memory according to a first embodiment. The magnetic memory according to the first embodiment includes at least one memory cell. FIG. 1 shows the memory cell. The memory cell 10 includes a nonmagnetic conductive layer 12, N+1 magnetoresistive elements (memory elements) $20_0$ to $20_N$, selection transistors $25_0$ to $25_N$, and a selection transistor 31. The conductive layer 12 has a first terminal 12a and a second terminal 12b.

Figure 2:
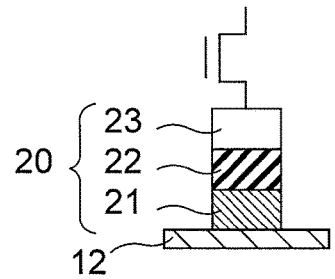
FIG. 2 is a cross-sectional view showing a configuration of a magnetoresistive element.

Each magnetoresistive element $20_i$ (i=0, ..., N) is a memory element disposed in a region of the conductive layer 12 between the first terminal 12a and the second terminal 12b, and including a magnetic layer 21, a nonmagnetic layer 22, and a magnetic layer 23, as shown in FIG. 2. The magnetic layer 21 is disposed between the conductive layer 12 and the magnetic layer 23, and the nonmagnetic layer 22 is disposed between the magnetic layer 21 and the magnetic layer 23. The magnetization direction of the magnetic layer 23 (first magnetic layer 23), which is called "reference layer," is fixed. The magnetization direction of the magnetic layer 21 (second magnetic layer 21), which is called "storage layer," is changeable. The "changeable" magnetization direction here means that the magnetization direction may be changed after a write operation, and the "fixed" magnetization direction here means that the magnetization direction is not changed after a write operation. If the nonmagnetic layer 22 is an insulating layer, the magnetoresistive element is an MTJ element, and if the nonmagnetic layer 22 is a conductive layer, the magnetoresistive element is a giant magneto resistive effect (GMR) element.

Although the magnetoresistive elements $20_i$ (i=0, ..., N) are disposed on the conductive layer 12 in FIG. 1, they may be disposed under the conductive layer 12 as long as the stacking relationship among the conductive layer 12, the magnetic layer 21, the nonmagnetic layer 22, and the magnetic layer 23 is unchanged. In other words, the magnetic layer 21 may be disposed under the conductive layer 12, the nonmagnetic layer 22 may be disposed under the magnetic layer 21, and the magnetic layer 23 may be disposed under the nonmagnetic layer 22. Each magnetoresistive element may store one bit, or one of data "0" and data "1." The memory cell 10 shown in FIG. 1 therefore may store N+1-bit information.

Each selection transistor $25_i$ (i=0, ..., N) has a source and a drain, one (terminal) of which is electrically connected to the reference layer 23 of the magnetoresistive element $20_i$, and the other (terminal) of which is electrically connected to a bit line $BL_i$, and a gate (control terminal), which is electrically connected to a word line WL. In the descriptions herein, the feature that "A is electrically connected to B" may either mean that A is directly connected to B or that A is connected to B via a conductor. Each selection transistor $25_i$ (i=0, ..., N) selectively supplies an electrical signal to the corresponding magnetoresistive element $20_i$.

The selection transistor 31 has a source and a drain, one (terminal) of which is electrically connected to the first terminal 12a and the other of which is electrically connected to a write bit line WBL, and a gate (control terminal), which is electrically connected to the word line WL. The second terminal 12b of the conductive layer 12 is connected to a source line SL.

The conductive layer 12 is a nonmagnetic layer that causes spin orbit interaction when a current from the selection transistor 31 flows through it, and includes a material and has a size with which the magnetization state of the magnetoresistive elements $20_0$ to $20_N$ may be changed due to the spin orbit interaction (Rashba effect) generated by a write current. The magnetoresistive elements $20_0$ to $20_N$ share the conductive layer 12.

Figure 3:
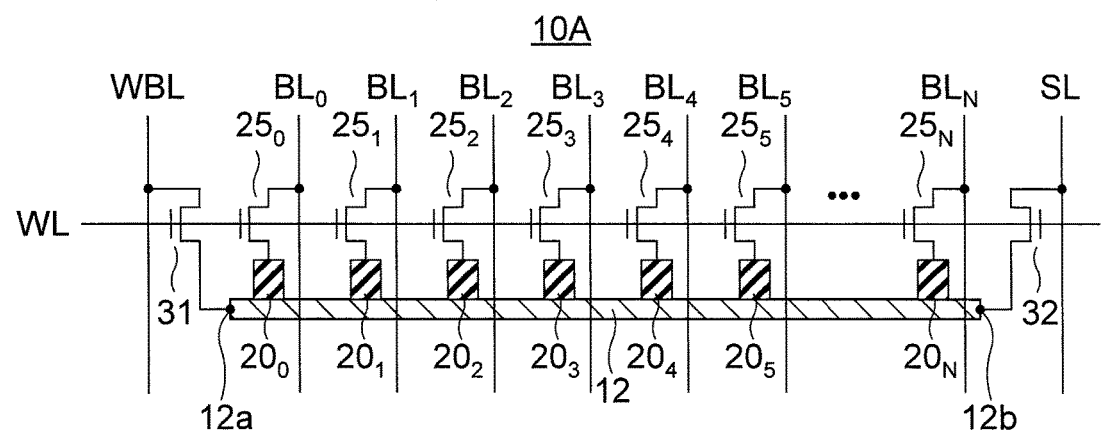
FIG. 3 is a circuit diagram illustrating another example of the memory cell of the magnetic memory according to the first embodiment.

The memory cell 10 of the magnetic memory according to the first embodiment may be replaced by a memory cell 10A shown in FIG. 3. The memory cell 10A is obtained by adding a selection transistor 32 to the memory cell 10, the selection transistor 32 having a source and a drain, one (terminal) of which is electrically connected to the second terminal 12b of the conductive layer 12 and the other of which is electrically connected to the source line SL, and a gate that is electrically connected to the word line WL.

Each of the selection transistors $25_0$ to $25_N$ and the selection transistors 31 and 32 is an n-channel field effect transistor (FET). The control terminals of all of the transistors in the memory cell are connected to the same word line WL. The controllability may be improved if the control terminal of each selection transistor is connected to a different wiring line. However, as the width of each selection transistor decreases, unnecessary regions are formed, which increase the entire cell area.

Connecting the control terminals of the selection transistors to the same wiring line as in this embodiment allows the selection transistors to be aligned in a straight line along the long side direction of the wiring line. This decreases the cell area. As a result, the memory cell may be formed with a high density.

The memory cell 10 and the memory cell 10A according to this embodiment are in a form of spin orbit torque-magnetic random access memories (SOT-MRAMs). A SOT-MRAM is a memory in which the current path of a write current flowing in a write operation is different from the current path of a read current flowing in a read operation. In a write operation, a current is caused to flow through the conductive layer 12 from the write bit line WBL to the source line SL or from the source line SL to the write bit line WBL. In a read operation, a current is caused to flow, via a magnetoresistive element, from the bit line BL to the source line SL or from the source line SL to the bit line BL. Since no current directly flows through the magnetoresistive element in the write operation, the design conditions for the ratio between the read current and the write current are eased, which makes it easier to manufacture large-capacity memories, and to improve the reliability since the electrical stress applied to the magnetoresistive elements decreases.

In this embodiment, the magnetoresistive elements in a memory cell share the conductive layer 12, unlike an ordinary SOT-MRAM. As a result, a write operation may be performed on more than one magnetoresistive element at the same time. Since no write assist voltage is applied to bit lines BL to which magnetoresistive elements that are not the target of the write operation are connected, the write operation may be controlled to be selectively performed on a plurality of magnetoresistive elements. A write assist voltage is applied to the magnetoresistive element to reduce the energy barrier in a write operation. A selective write operation may be performed on a memory cell in which a plurality of magnetoresistive elements share a conductive layer by designing the device to cause a current to flow through the conductive layer first, and data is caused to be written to a selected magnetoresistive element when a write assist voltage is applied to it.

(Write Operation)

A write operation to write data to the memory cell 10 will then be described.

As an example, a write operation to write data "1" to all of the memory elements (magnetoresistive elements) $20_0$ to $20_N$, and then to write data "0" to a selected memory element will be described below. First, a write voltage $V_{SO}$ for the conductive layer 12 is applied to the write bit line WBL to which the target memory cell is connected, and 0 V is applied to the source line SL. A write assist voltage $V_{ASSIST}$ is applied to the bit lines $BL_0$ to $BL_N$ for all of the memory elements $20_0$ to $20_N$. A signal is supplied to word line WL to which the target memory cell is connected to turn on all of the selection transistors $25_0$ to $25_N$ and the selection transistor 31 in the target memory cell. As a result, a write current $I_{SO}$ flows through the conductive layer 12 of the target memory cell from the write bit line WBL to the source line SL, and data "1" is written to all of the memory elements.

Subsequently, 0 V is applied to the write bit line WBL of the target memory cell, and the write voltage $V_{SO}$ for the conductive layer 12 is applied to the source line SL. The write assist voltage $V_{ASSIST}$ is applied to the bit line connecting to the memory element to which data "0" is to be written, and 0 V is applied to the bit lines connecting to the memory elements that need to hold data "1.". For example, if data "0" is to be written to the memory elements $20_0$, $20_2$, and $20_3$, the write assist voltage $V_{ASSIST}$ is applied to the bit lines $BL_0$, $BL_2$, and $BL_3$. A signal is supplied to the word line WL of the target memory cell to turn on the selection transistors $25_0$, $25_2$, and $25_3$ and the selection transistor 31. As a result, while the assist voltage is being applied to the target memory elements $20_0$, $20_2$, and $20_3$, the write current $I_{SO}$ flows through the conductive layer 12 from the source line SL to the write bit line WBL to write data "0" to the memory elements $20_0$, $20_2$, and $20_3$.

Although data "1" is first written to all of the memory elements $20_0$ to $20_N$ and then data "0" is written to the selected memory elements in the above-described write operation, data "0" may be written to all of the memory elements first, and then data "1" may be written to the selected memory elements. Furthermore, data of all of the memory elements may be read before a write operation and compared with data to be written, and then data "1" or data "0" may be selectively written to memory elements that store data different from data of the final state.

(Read Operation)

A read operation to read data from the memory cell 10 will be described below.

A read voltage $V_{READ}$ is applied to a bit line, for example a bit line $BL_2$, connecting to a target memory element from which data is read, for example the memory element $20_2$, 0 V is applied to the source line SL, and the write bit line WBL and the bit lines connected to the memory elements except for the target memory cell, for example the bit lines except for the bit line $BL_2$, are brought into a floating state. A signal is supplied to the word line WL connecting to the target memory cell to turn on the selection transistors $25_0$ to $25_N$ and the selection transistor 31. As a result, a read current $I_{READ}$ flows through the memory element $20_2$, and data is read by a readout circuit (not shown) connecting to the source line SL, and whether the read data is data "1" or data "0" is determined.

(Memory Cell Array)

Figure 4:
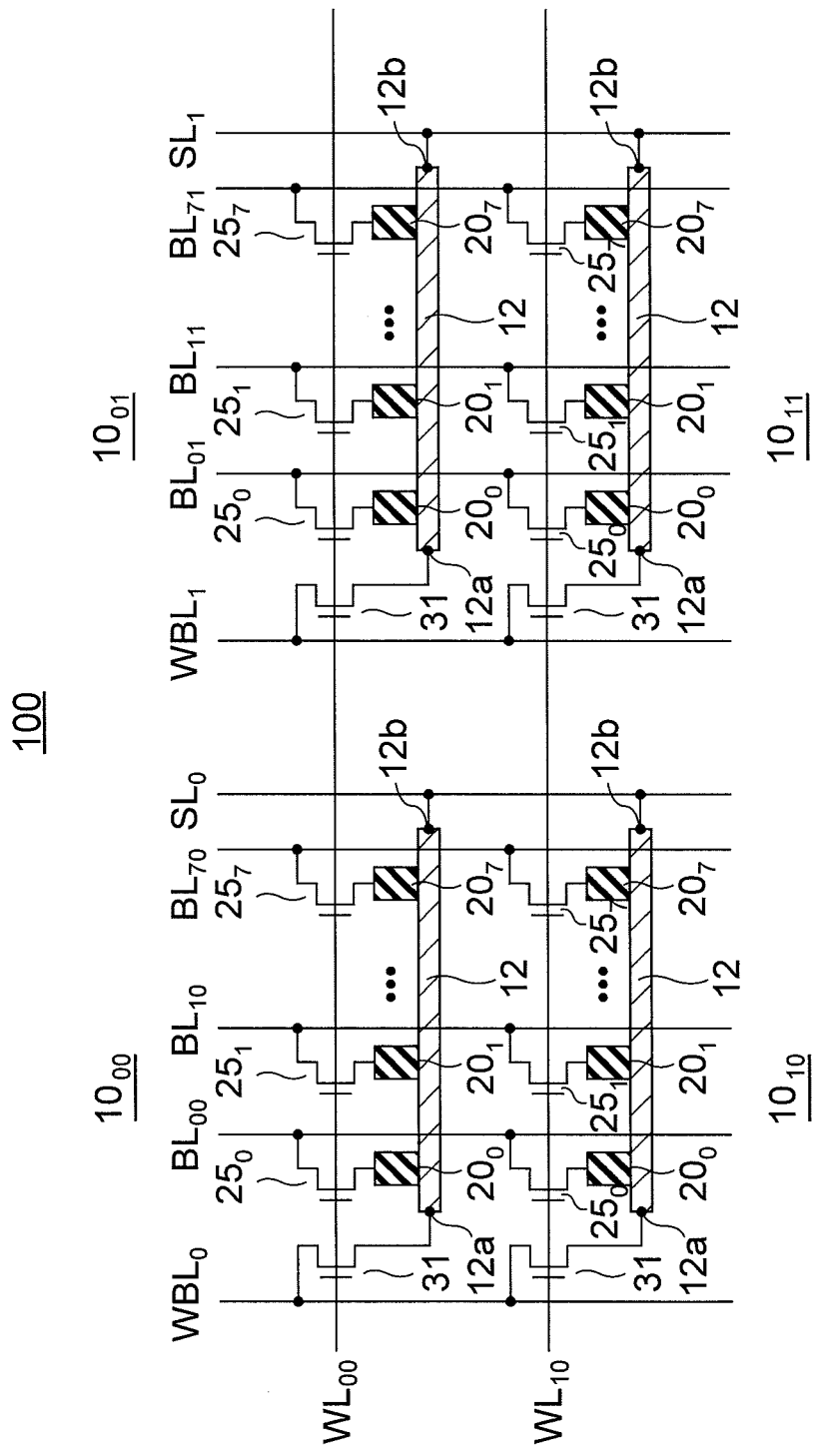
FIG. 4 is a circuit diagram illustrating the magnetic memory according to the first embodiment.

FIG. 4 illustrates a magnetic memory according to the first embodiment including memory cells $10_{00}$, $10_{01}$, $10_{10}$, and $10_{11}$ arranged in a 2×2 array form. Each memory cell $10_{ij}$ (i,j=0, 1) has a configuration obtained by replacing the N+1 (N+1-bit) memory elements $20_0$ to $20_N$ of the memory cell 10 shown in FIG. 1 with eight (eight bit) memory elements $20_0$ to $20_7$. Although the memory cells are arranged in a 2×2 array form in the first embodiment, the memory cells may be arranged in an m×n array form where m and n are natural numbers.

In the memory cell $10_{i0}$ (i=0, 1), one of the source and the drain of the selection transistor $25_j$ (j=0, . . . , 7) is electrically connected to the reference layer of the corresponding memory element $25_j$, the other is electrically connected to the bit line $BL_{j0}$, and the gate is electrically connected to the word line $WL_{i0}$. One of the source and the drain of the selection transistor 31 is electrically connected to the first terminal 12a of the conductive layer 12, the other is electrically connected to the write bit line $WBL_0$, and the gate is electrically connected to the word line $WL_{i0}$. The second terminal 12b of the conductive layer 12 is electrically connected to the source line $SL_0$.

In the memory cell $10_{i1}$ (i=0, 1), one of the source and the drain of the selection transistor $25_j$ (j=0, . . . , 7) is electrically connected to the reference layer of the corresponding memory element $25_j$, the other is electrically connected to the bit line $BL_{j1}$, and the gate is electrically connected to the word line $WL_{i0}$. One of the source and the drain of the selection transistor 31 is electrically connected to the first terminal 12a of the conductive layer 12, the other is electrically connected to the write bit line $WBL_1$, and the gate electrically connected to the word line $WL_{i0}$. The second terminal 12b of the conductive layer 12 is electrically connected to the source line $SL_1$.

In the magnetic memory according to the first embodiment including the memory cells $10_{00}$, $10_{01}$, $10_{10}$, and $10_{11}$ arranged in a 2×2 array form, as shown in FIG. 4, the memory cells adjacent to each other in the top-and-bottom direction in the drawing share a write bit line, bit lines, and a source line. Each of the memory cells adjacent to each other in the top-and-bottom direction is connected to a different word line. Each of the memory cells adjacent to each other in the left-and-right direction in the drawing is connected to different bit lines, a different write bit line, and a different source line. The memory cells adjacent to each other in the left-and-right direction share a word line. The range of the shared word line may be elongated or shortened in accordance with the specification of the memory chip. The memory cells may be arranged in a layered structure.

If each of the memory cells $10_{00}$, $10_{01}$, $10_{10}$, and $10_{11}$ shown in FIG. 4 is replaced with the memory cell 10A shown in FIG. 3, the selection transistor 32 is electrically connected the second terminal 12b of the corresponding conductive layer 12 and the corresponding source line $SL_0$ or $SL_1$.

Figure 5:
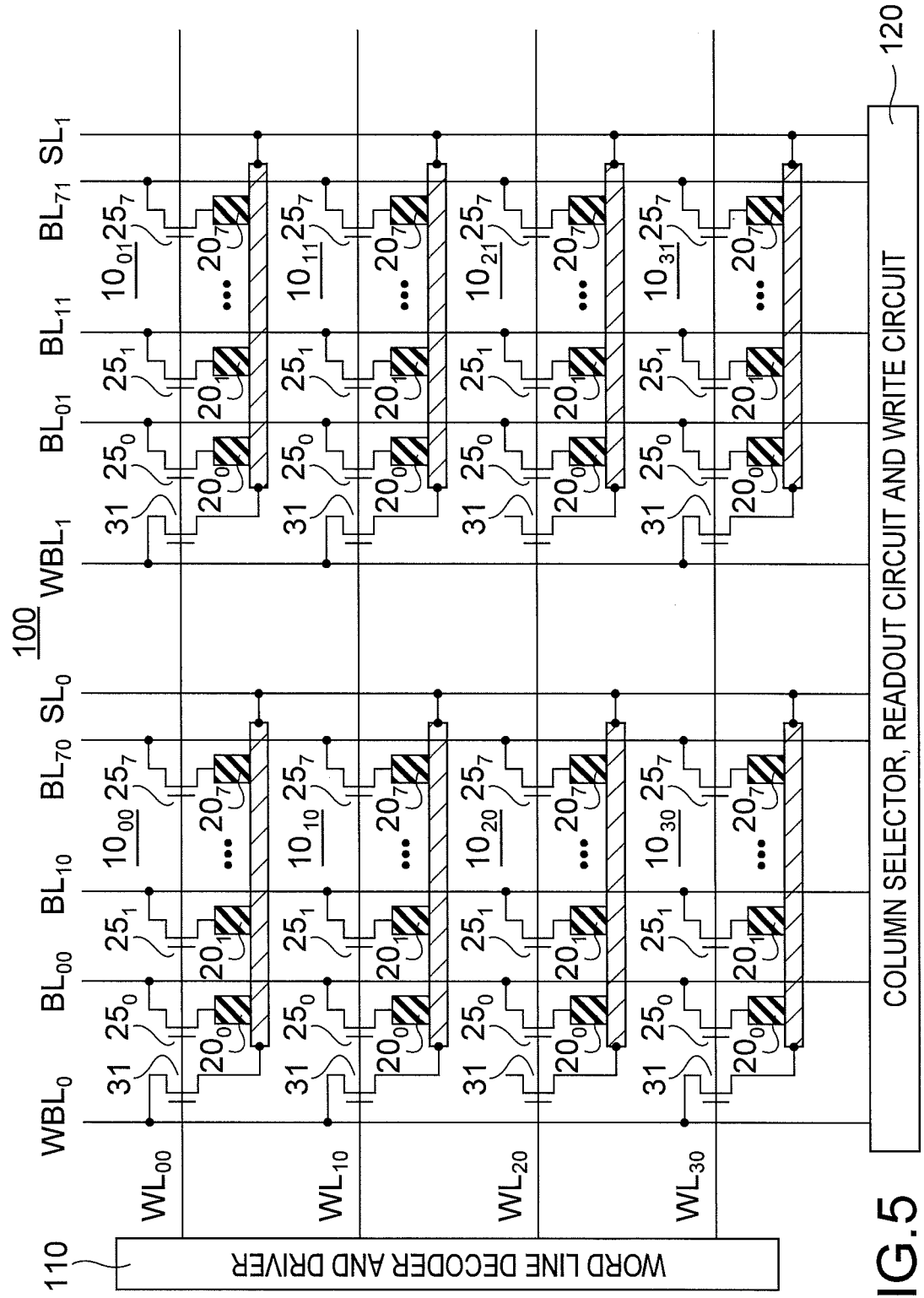
FIG. 5 is a circuit diagram illustrating the magnetic memory according to the first embodiment, which includes a memory cell array with 4×2 memory cells arranged in an array form, and peripheral circuits.

FIG. 5 illustrates a magnetic memory including a memory cell array 100, in which memory cells $10_{00}$, $10_{01}$, $10_{10}$, $10_{11}$, $10_{20}$, $10_{21}$, $10_{30}$, and $10_{31}$ are arranged in a 4×2 array form, and peripheral circuits. Each memory cell $10_{ij}$ (i=0, 1, 2, 3, j=0, 1) has a configuration obtained by replacing the N+1 (N+1-bit) memory elements $20_0$ to $20_N$ in the memory cell 10 shown in FIG. 1 with eight (eight-bit) memory elements $20_0$ to $20_7$.

The magnetic memory shown in FIG. 5 includes the memory cell array 100, a word line decoder and driver 110, and a column selector, readout circuit and write circuit 120.

The word lines $WL_{00}$, $WL_{10}$, $WL_{20}$, and $WL_{30}$ are connected to the word line decoder and driver 110, and the bit lines $BL_{00}$ to $BL_{71}$, the write bit lines $WBL_0$ and $WBL_1$, and the source lines $SLL_0$, $SLR_0$, $SLL_1$, and $SLR_1$ are connected to the column selector, readout circuit and write circuit 120. The write operation and the read operation described above are performed by using the word line decoder and driver 110 and the column selector, readout circuit and write circuit 120.

(Three-Dimensional Structure)

Figure 6:
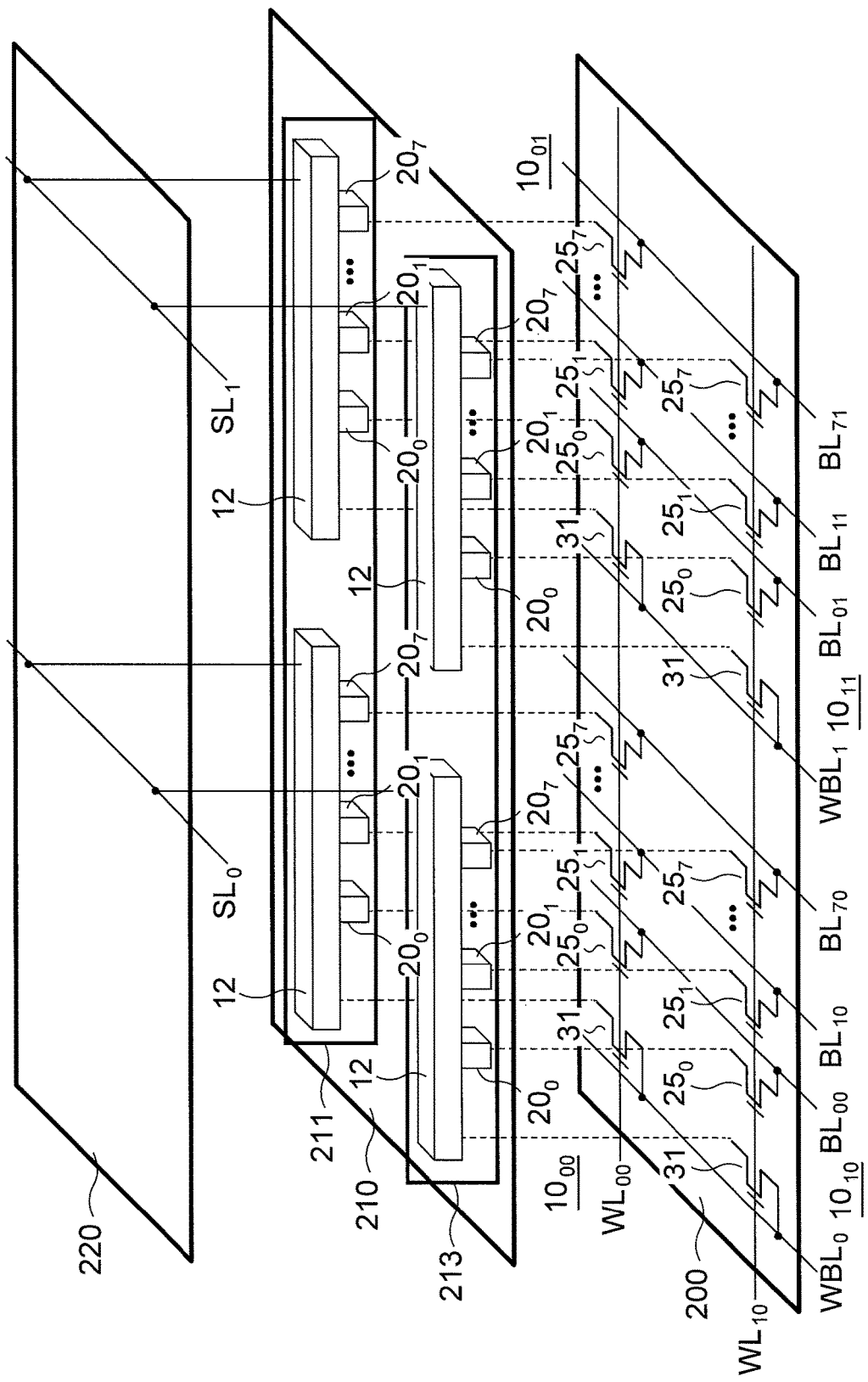
FIG. 6 is a diagram illustrating a three-dimensional structure of the magnetic memory according to the first embodiment.

FIG. 6 illustrates a three-dimensional structure of the magnetic memory according to the first embodiment including memory cells arranged in a 2×2 array form as shown in FIG. 4. As can be understood from FIG. 6, the memory cells $10_{00}$, $10_{01}$, $10_{10}$, and $10_{11}$ of the magnetic memory are formed over first to third levels 200, 210, and 220. Each memory cell includes eight memory elements (magnetoresistive elements) $20_0$ to $20_7$ disposed under the conductive layer 12.

The selection transistors $25_0$ to $25_7$ and the selection transistor 31 of each memory cell $10_{ij}$ (i, j=0, 1), the word lines $WL_{00}$ and $WL_{10}$, the write bit lines $WBL_0$ and $WBL_1$, and the bit lines $BL_{00}$ to $BL_{71}$ are disposed on a first level 200.

Vias and wiring lines connecting to the first level 200, and the memory elements $20_0$ to $20_7$ and the conductive layer 12 of each memory cell $10_{ij}$ (i, j=0, 1) are disposed on a second level 210. A solid line 211 indicates a region including the memory elements $20_0$ to $20_7$ and the conductive layer 12 of each of the memory cell $10_{00}$ and $10_{01}$ and, and a solid line 213 indicates a region including the memory elements $20_0$ to $20_7$ and the conductive layer 12 of each of the memory cells $10_{10}$ and $10_{11}$.

Vias and wiring lines connecting to the second level 210 and the source lines $SL_0$ and $SL_1$ are disposed on a third level 220.

Since each magnetoresistive element $20_i$ (i=0, ..., N) is disposed under the corresponding conductive layer 12, a terminal of the memory element $20_j$ (j=0, ..., 7) on the reference layer side, which connects to the selection transistor $25_j$, is located below the conductive layer 12. As a result, the terminal may be connected to the selection transistor $25_j$ without unnecessarily elongating the wiring line, and the memory element $20_j$ may be disposed substantially immediately above the selection transistor $25_j$.

The third level 220 in which the source lines $SL_0$ is disposed may be located above the second level 210. The third level 220 in which the source lines $SL_0$ is disposed may be located between the first level 200 and the second level 210.

A method of manufacturing a magnetic memory having the above-described three-dimensional structure will be described with reference to FIGS. 7 to 15. The magnetic memory manufactured by this method includes the memory cell array 100 shown in FIG. 5, with the memory cells $10_{00}$ to $10_{31}$ arranged in a 4×2 array form.

(Manufacturing Method)

DRAMs, which are classified into the category of large-capacity working memories, have a structure in which a one-bit memory cell includes one transistor and one capacitor that is a storage element. A DRAM memory cell, which is manufactured by a cutting edge process, includes a memory cell array in which memory cells are arranged with a high density achieved by disposing a capacitor above a planar transistor having an area of about 6 $F^2$, where F means minimum feature size. In order to form the planar transistor and to arrange wiring lines of the memory array in an area of about 6 $F^2$, the active area of the transistor is generally tilted to make an angle of about 20 degrees to 30 degrees with a bit line in the DRAM memory cell. In the manufacturing method according to this embodiment, a selection transistor with an active area that is tilted relative to a bit line is used. This will be described as an example of selection transistor layout.

Figure 7:
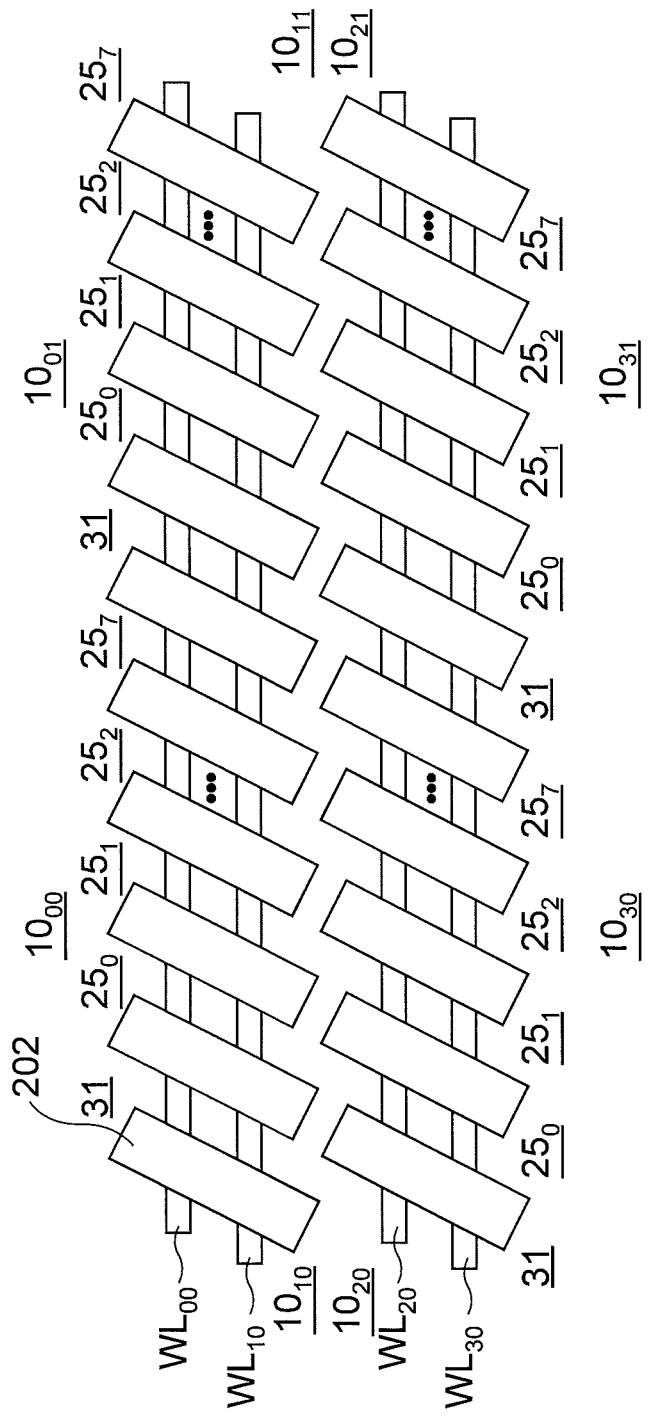
FIGS. 7 to 15 are plan views showing a process for manufacturing the magnetic memory according to the first embodiment.
Figure 8:
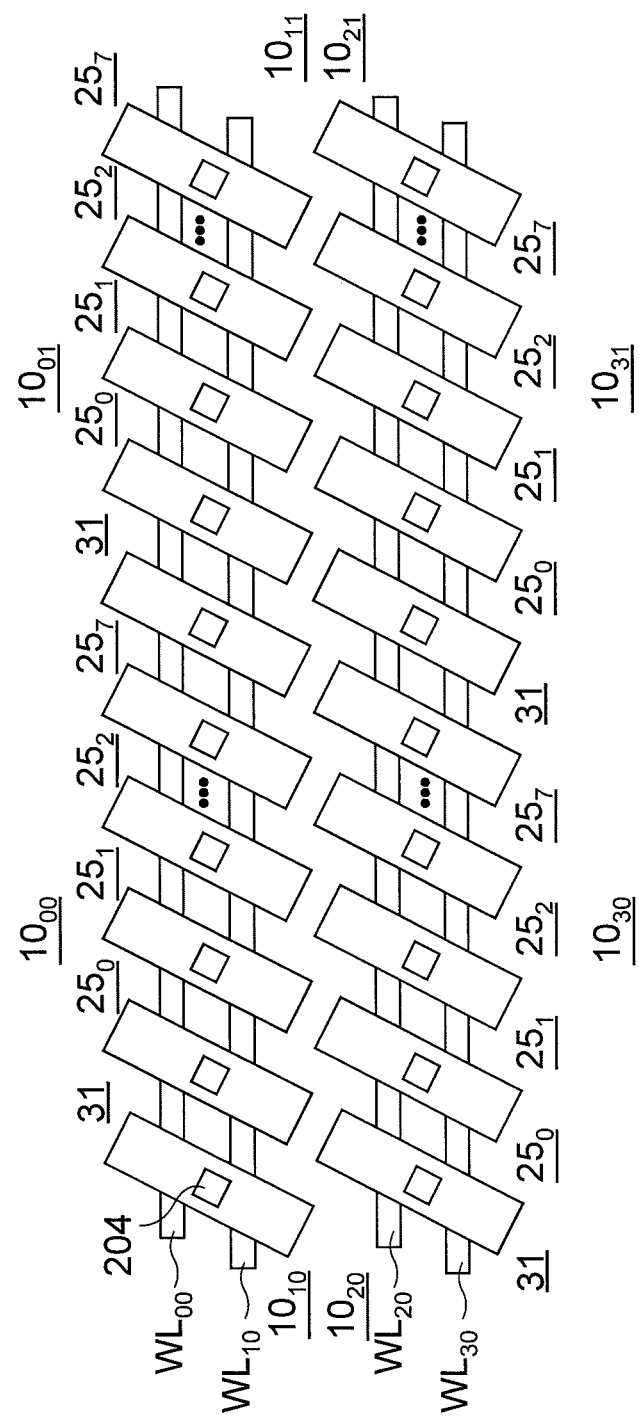
Figure 9:
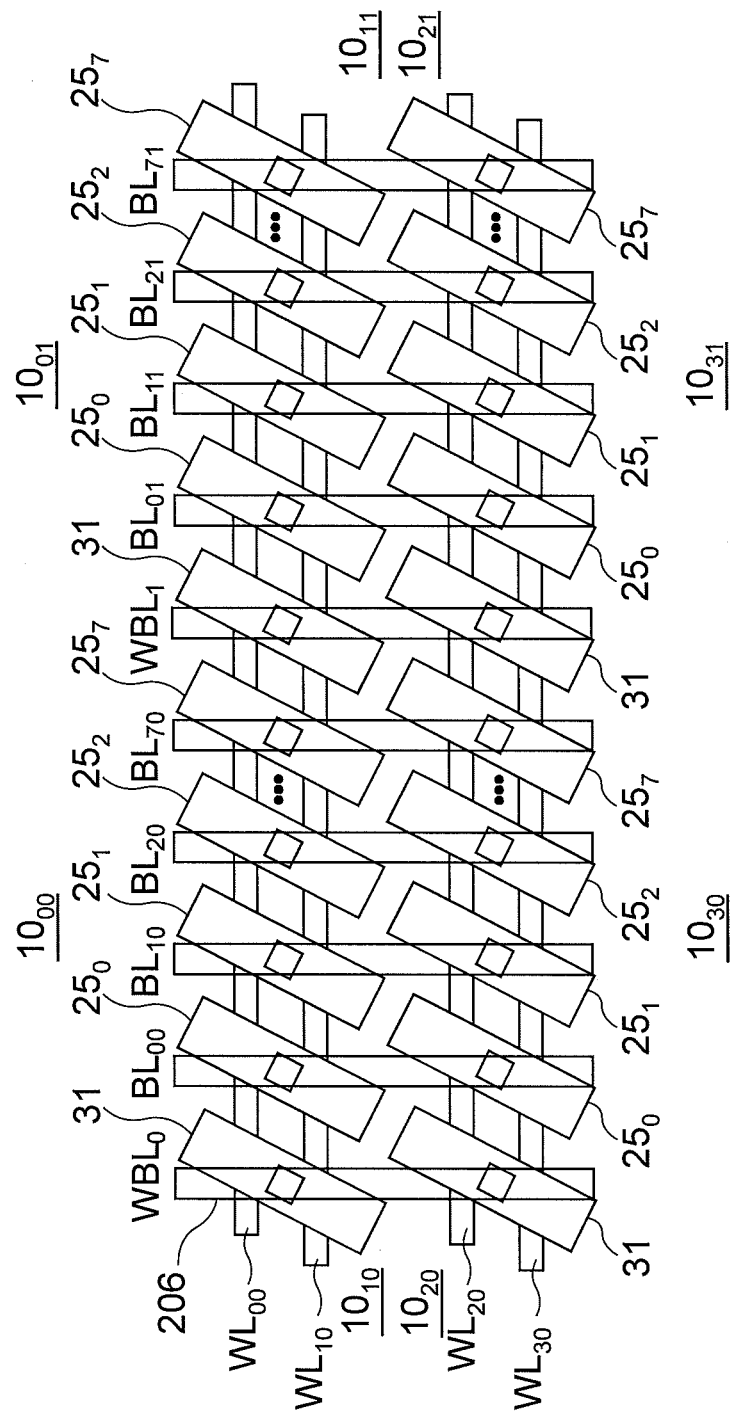

FIGS. 7 to 9 show a process for forming the first level 200. In this process, embedded word lines $WL_{00}$ to $WL_{30}$ are formed, and active areas 202 to become device portions of planar transistors are formed (FIG. 7). The active areas 202 have the same dimensions, and are vertically and horizontally arranged with the same intervals. This is important to form minute devices with a good yield. If required transistor characteristics differ between the selection transistor 31 of the conductive layer and the selection transistors $25_0$ to $25_7$ of the memory elements, the respective transistors may have different features such as different doping concentrations.

Subsequently, vias 204 are formed on common drains of the transistors as shown in FIG. 8.

Thereafter, metal wiring lines 206 corresponding to the bit lines $BL_{00}$ to $BL_{71}$ and the write bit lines $WBL_0$ and $WBL_1$ are formed to connect to the respective vias 204 as shown in FIG. 9. The transistors connecting to the write bit lines $WBL_0$ and $WBL_1$ are selection transistors 31 for selecting the conductive layer, and the transistors connecting to the bit lines $BL_{ij}$ (i=0, 1, j=0, ..., 7) are selection transistors $25_j$. Although the bit lines $BL_{ij}$ (i=0, 1, j=0, ..., 7) have a rectangular shape in FIG. 9, the rectangular shape is simply an example, and they may be bent to have a corrugated shape, for example.

Figure 10:
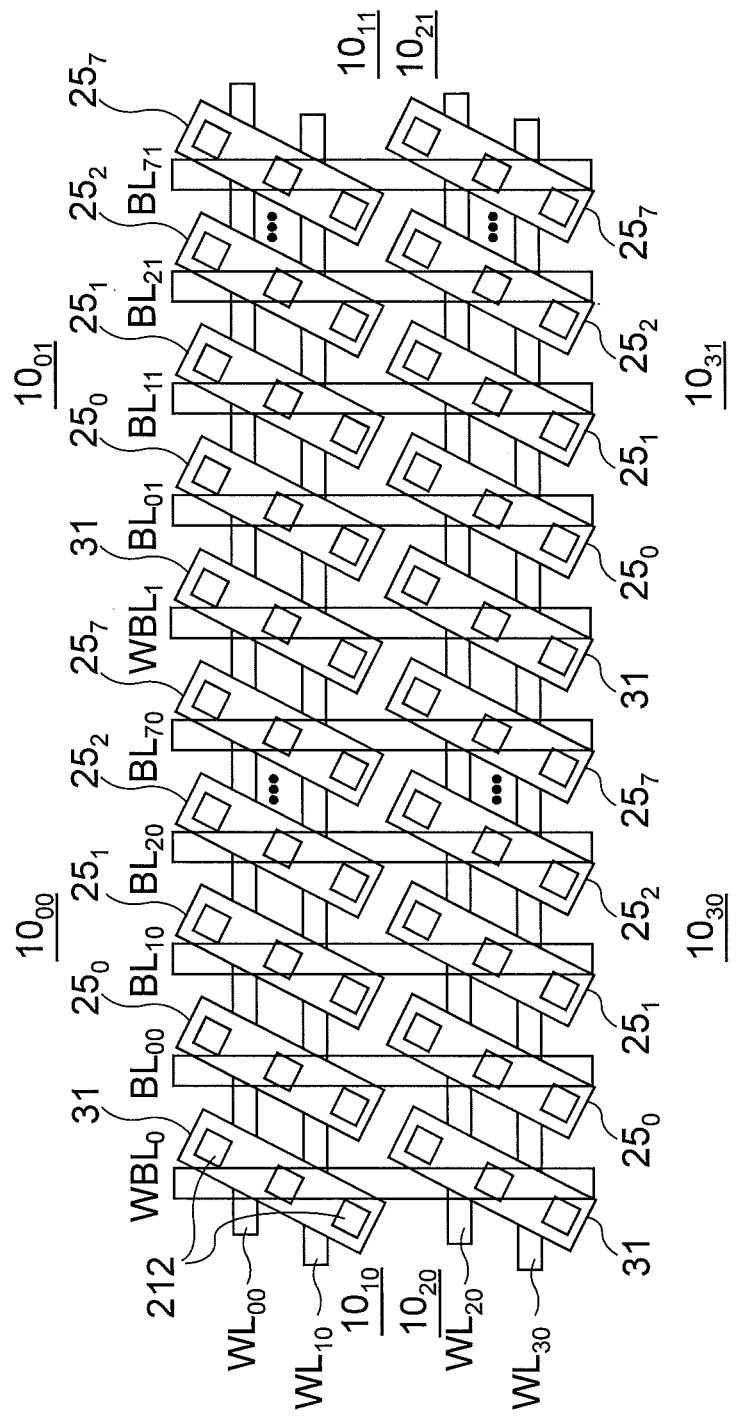

FIGS. 10 to 13 show a process for forming the second level 210. First, vias 212 are formed on the sources of the respective selection transistors as shown in FIG. 10.

Figure 11:
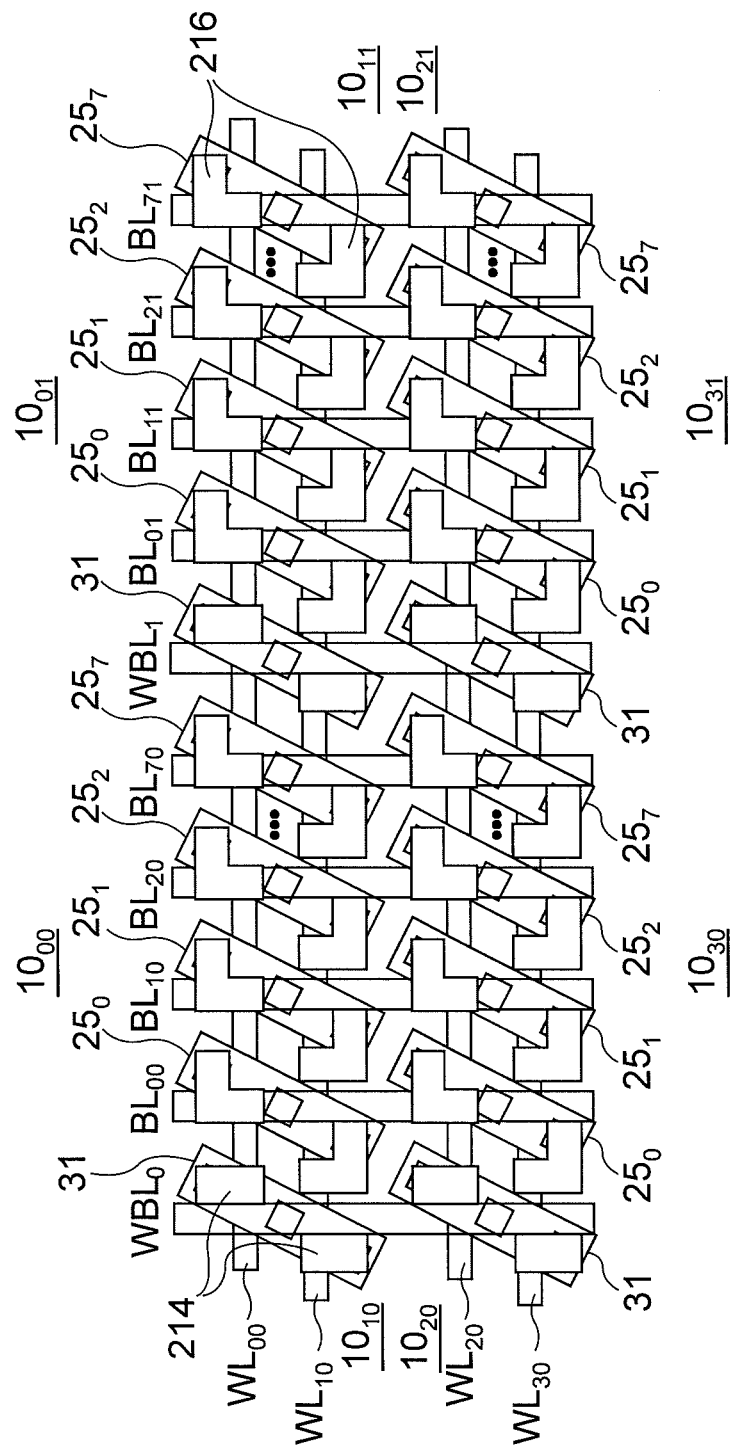

Subsequently, metal wiring lines 214 are formed to connect to the vias 212 further connecting to the sources of the selection transistors 31 and the selection transistors $25_0$ to $25_7$ as shown in FIG. 11. The metal wiring lines 214 connecting to the vias 212 of the selection transistors 31 further connect to the conductive layers 12. The metal wiring lines 214 connecting to the vias 212 of the selection transistors $25_0$ to $25_7$ correspond to lower electrodes 216 of the memory elements $20_0$ to $20_7$. If the material and the size suitable for the lower electrodes 216 of the memory elements $20_0$ to $20_7$ differ from those suitable for the metal wiring lines 214, an independent process for forming the lower electrodes of the memory elements $20_0$ to $20_7$ may be needed.

Figure 12:
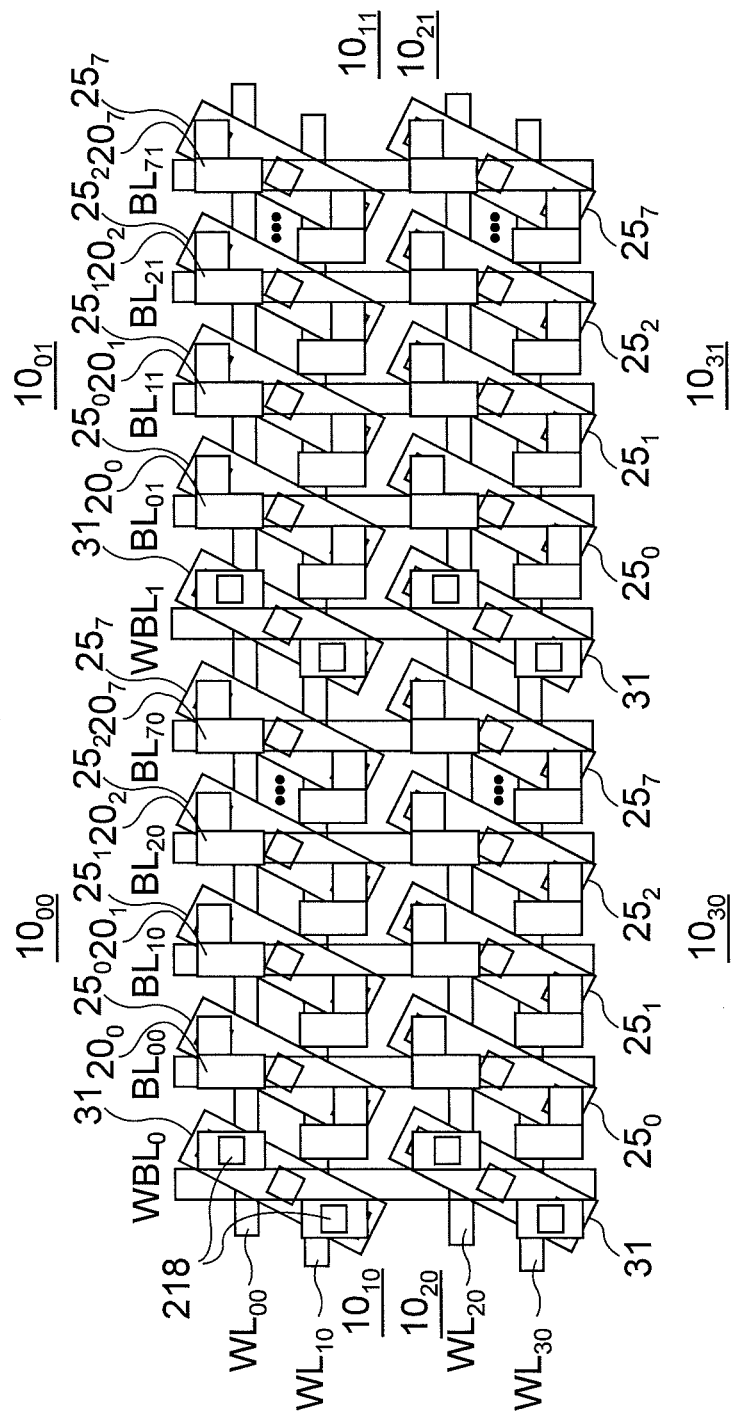

Thereafter, memory elements $20_0$ to $20_7$ are formed on the lower electrodes 216, and vias 218 are formed on the metal wiring lines 214 for the layer selection transistors 31, as shown in FIG. 12.

As the size of the memory elements decreases, the space between adjacent memory elements decreases. The decrease in space may cause interference between devices which may alter the magnetization states of the adjacent memory elements due to the influence of leakage magnetic field from the respective memory elements. Therefore, the diagonal arrangement of the memory elements, instead of the grid arrangement, of this embodiment is preferable from the viewpoint of the interference between memory elements since the distance between adjacent memory elements may be increased.

Figure 13:
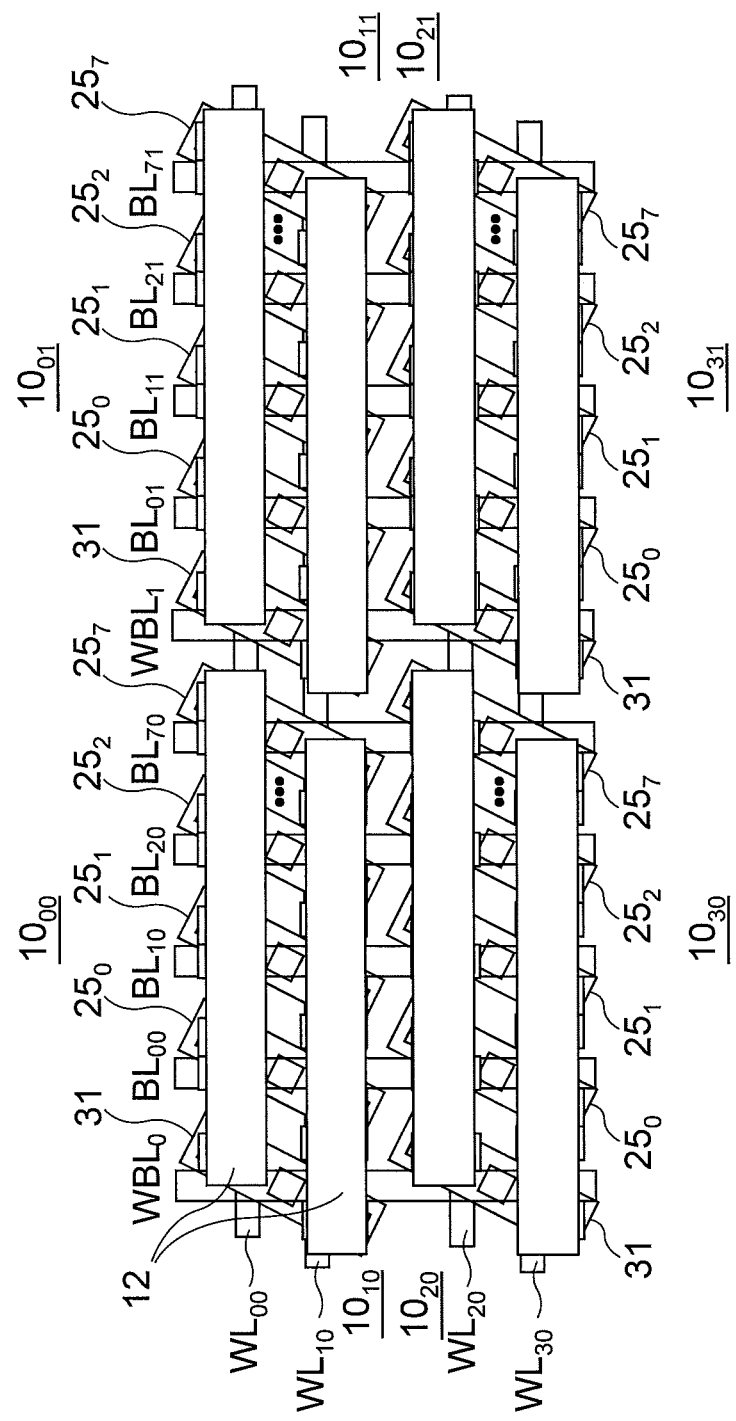

Conductive layers 12 are then formed, each connecting to the via 218 (FIG. 12) and the storage layers of the memory elements $20_0$ to $20_7$ as shown in FIG. 13. The conductive layer may simply be electrically connected to the via 218. However, the conductive layer 12 need to be connected to the storage layers of the memory elements $20_0$ to $20_7$ to cause spin orbit interaction. Although each conductive layer 12 is illustrated to have a rectangular shape in FIG. 13, it may be electrically connected as one wiring line in a memory cell. And the one conductive layer 12 may be separated in a portion between adjacent memory elements in a memory cell.

Figure 14:
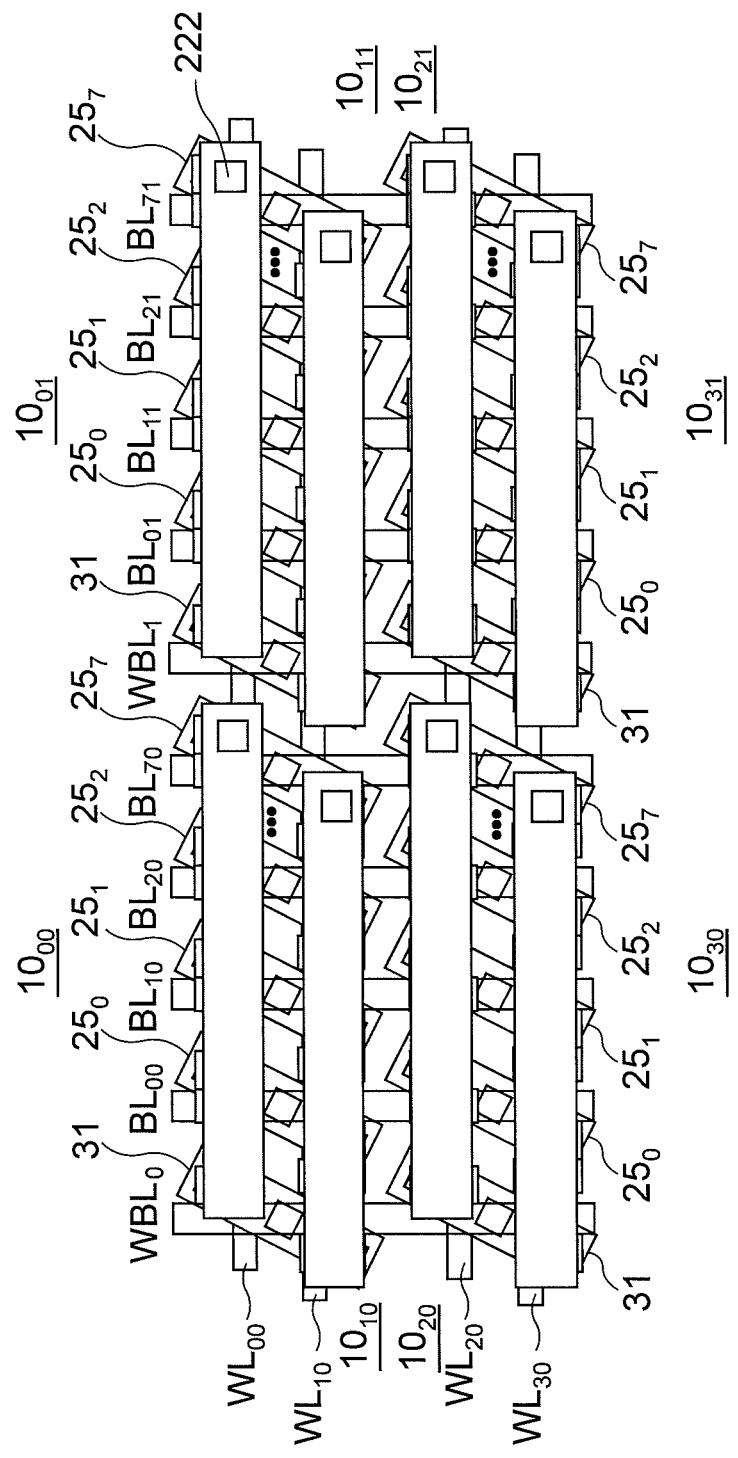
Figure 15:
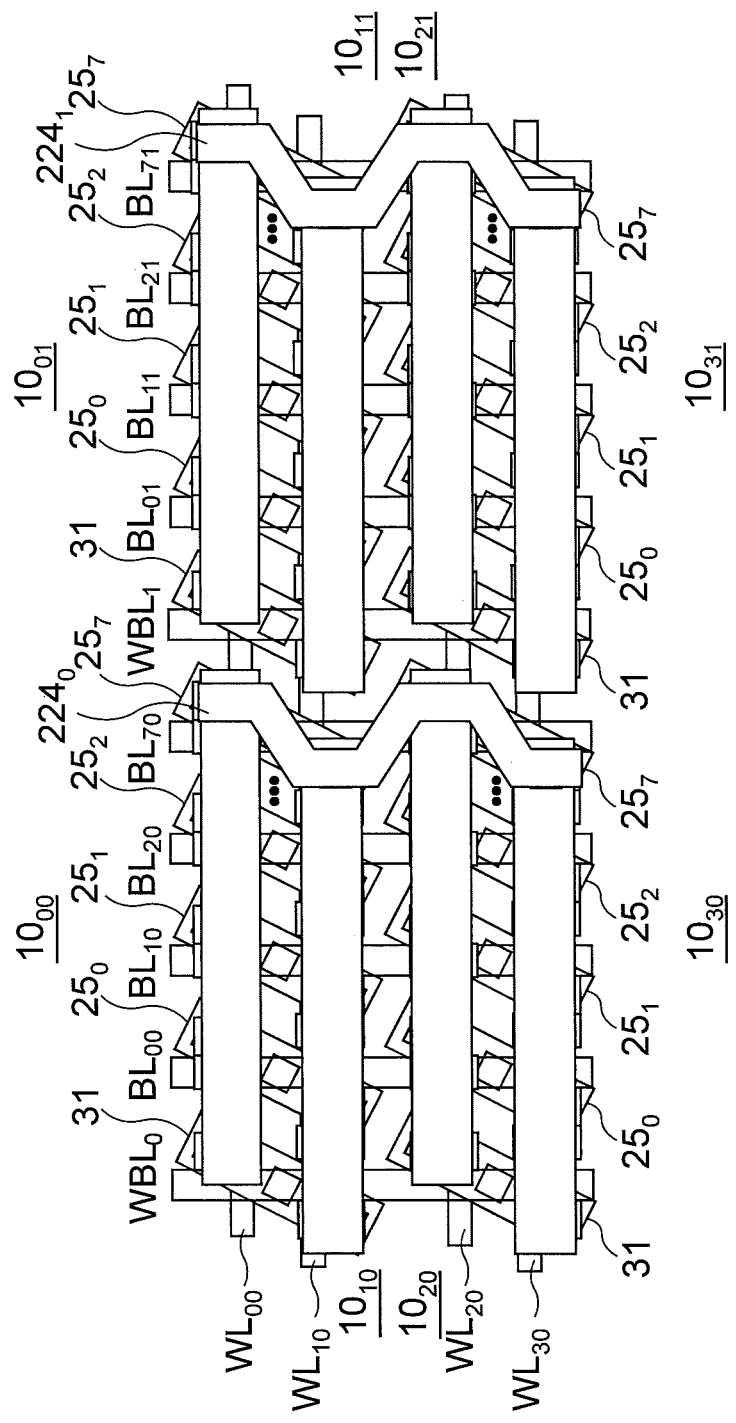

FIGS. 14 and 15 illustrate a process for forming a third level 220. First, vias 222 are formed on the conductive layers 12 on the side opposite to the side where the vias 218 (FIG. 12) are formed, as shown in FIG. 14.

Subsequently, metal wiring lines $224_0$ and $224_1$ corresponding to the source lines $SL_0$ and $SL_1$ are formed to connect to the vias 222 as shown in FIG. 15. Although the metal wiring lines $224_0$ and $224_1$ have a corrugated shape in FIG. 15, they may have a rectangular shape if possible.

Figure 16:
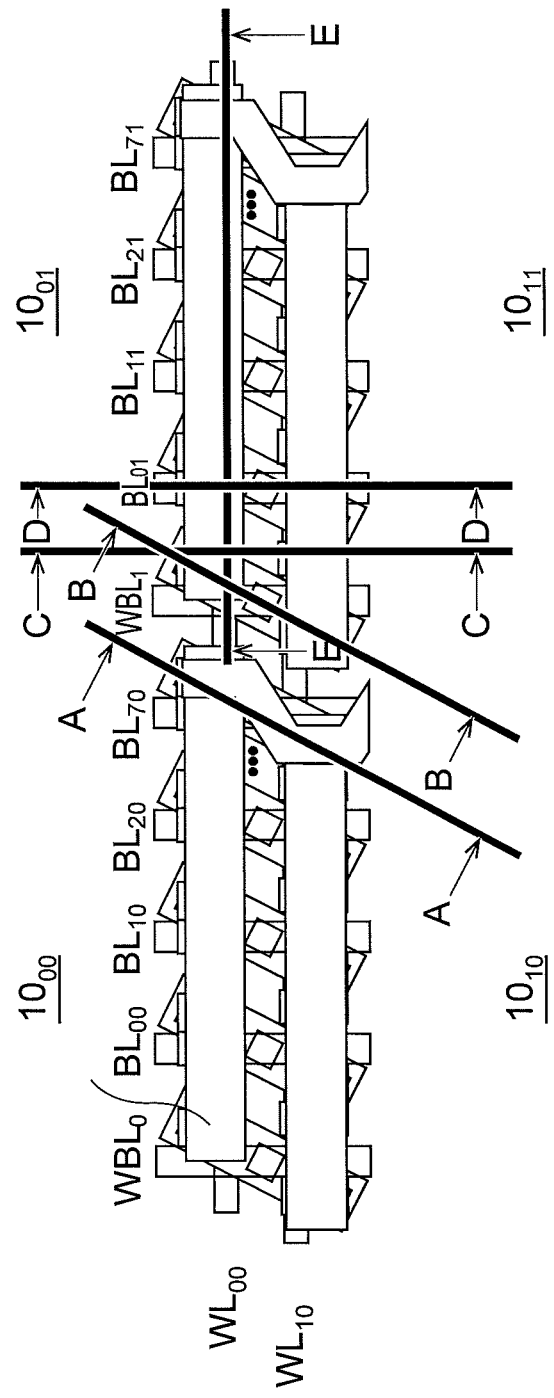
FIG. 16 is a plan view for explaining cross sections of the magnetic memory according to the first embodiment.
Figure 17A:
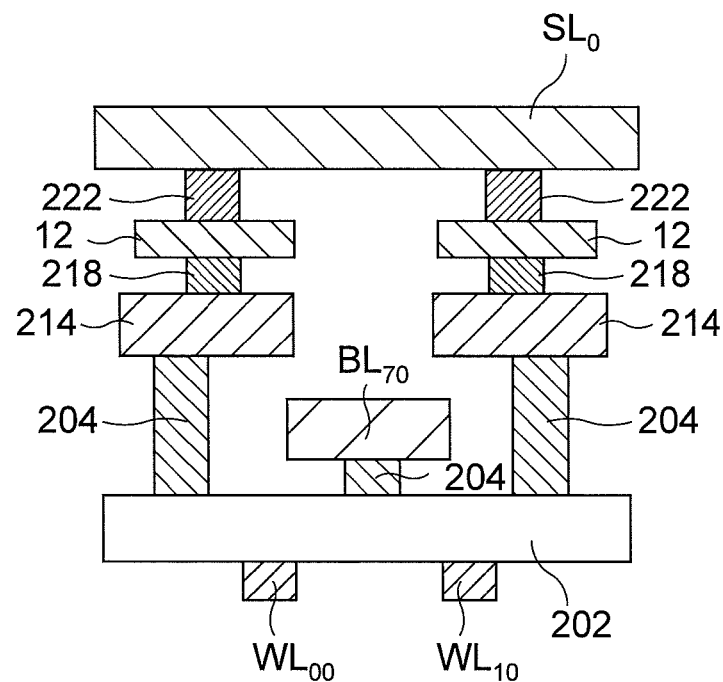
FIG. 17A is a cross-sectional view taken along line A-A in FIG. 16.
Figure 17B:
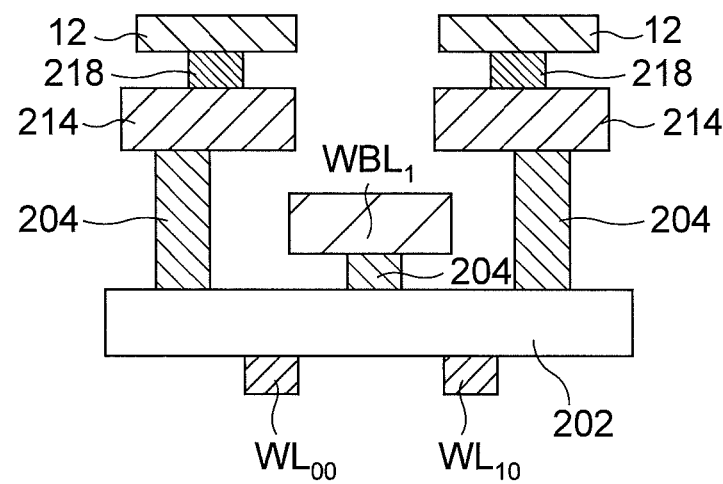
FIG. 17B is a cross-sectional view taken along line B-B in FIG. 16.
Figure 17C:
FIG. 17C is a cross-sectional view taken along line C-C in FIG. 16.
Figure 17C:
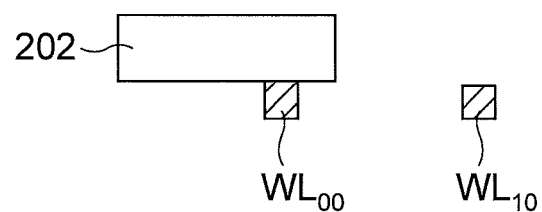
Figure 17D:
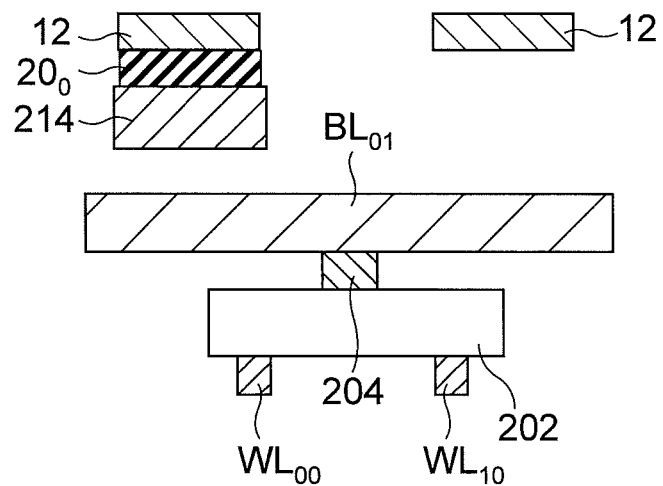
FIG. 17D is a cross-sectional view taken along line D-D in FIG. 16.
Figure 17E:
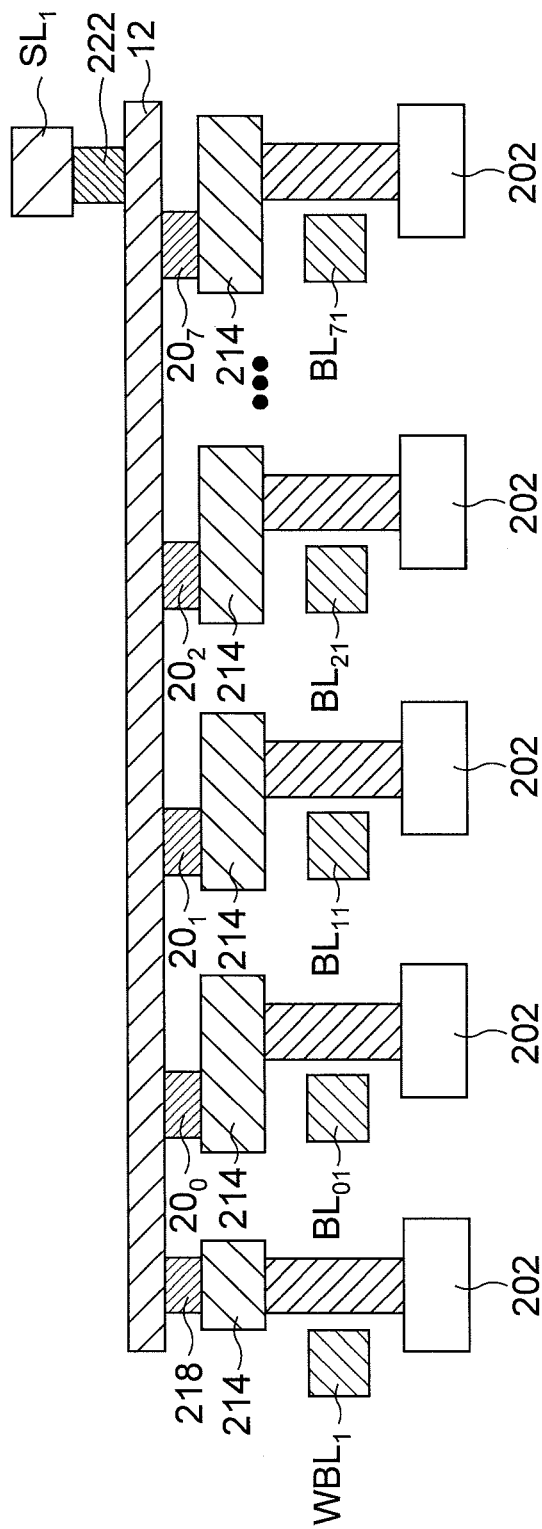
FIG. 17E is a cross-sectional view taken along line E-E in FIG. 16.

In all of the above-described processes, the shapes of the memory elements $20_0$ to $20_7$, the conductive layers 12, the metal wiring lines, and the vias may not be limited to those shown in the drawings. They may not be rectangular as shown in the drawings, and may be oval or corrugated shape as long as the electrical connections among them are correct. FIG. 17A shows a cross section of the magnetic memory thus formed, taken along line A-A of FIG. 16, FIG. 17B shows a cross section taken along line B-B, FIG. 17C shows a cross section taken along line C-C, FIG. 17D shows a cross section taken along line D-D, and FIG. 17E shows a cross section taken along line E-E. These cross-sectional views simply show the positional relationships among the elements in the layered structure, but do not define any physical dimensions. In the actual process, the size and the shape of them are designed to meet the alignment accuracy required for the device and the process so as to ensure the connections among the vias and the metal wiring lines.

FIG. 17A is a cross-sectional view sectioned along the active area 202 of the selection transistor $25_7$ connecting to the bit line $BL_{70}$ and the source line $SL_0$. The word lines $WL_{00}$ and $WL_{10}$ are disposed under the active areas 202. The bit line $BL_{70}$ and the metal wiring lines 214 are disposed above the active areas 202 and connected to the active areas 202 by the vias 204. The conductive layers 12 are disposed above the metal wiring lines 214, and the source line $SL_0$ is disposed above the conductive layers 12 and connected to the conductive layers 12 by the vias 222.

FIG. 17B is a cross-sectional view sectioned along the active area 202 of the selection transistor 31 and the write bit line $WBL_1$. The write bit line $WBL_1$ is disposed above the active area 202 and connected to the active area 202 by the via 204. The active area 202 is disposed in a region where the word line $WL_{00}$ and the word line $WL_{10}$ are disposed, the metal wiring lines 214 are disposed above the active area 202 and connected to the active area 202 by the vias 204, and the conductive layers 12 are disposed above the metal wiring lines 214 and connected to the metal wiring lines by the vias 218.

FIG. 17C is a cross-sectional view sectioned in a direction parallel to the short sides the conductive layer 12 of the memory cell $10_{01}$ and along the memory element $20_0$ of the memory cell $10_{11}$ connecting to the bit line $BL_{01}$. The active area 202 is disposed on the word line $WL_{00}$, the metal wiring line 214 is disposed above the active area 202, and the conductive layer 12 is disposed above the metal wiring line 214 and connected to the metal wiring line 214 by the via 218. Another metal wiring line 214 is disposed above a region where the word line $WL_{10}$ is disposed. The memory element $20_0$ is disposed above the metal wiring line 214, and another conductive layer 12 is disposed on the memory element $20_0$.

FIG. 17D is a cross-sectional view sectioned in the direction parallel to the short sides of the conductive layer 12 of the memory cell $10_{01}$ and along the memory element $20_0$ of the memory cell $10_{01}$ connecting to the bit line $BL_{01}$. The word lines $WL_{00}$ and $WL_{10}$ are disposed under the active area 202. The bit line $BL_{01}$ is disposed above the active area 202 and connected to the active area 202 by the via 204. The metal wiring line 214 is disposed above the bit line $BL_{01}$ in a region where the word line $WL_{00}$ is disposed below the bit line $BL_{01}$, the memory element $20_0$ is disposed on the metal wiring line 214, and the conductive layer 12 is disposed on the memory element $20_0$.

Another conductive layer 12 is disposed above the bit line $BL_{01}$ in a region where the word line $WL_{10}$ is disposed below the bit line $BL_{01}$.

FIG. 17E is a cross-sectional view sectioned in a direction parallel to the long sides of the conductive layer 12 of the memory cell $10_{01}$. The metal wiring lines 214 are disposed above the active areas 202 of the respective transistors $25_0$ to $25_7$ and connected to the active areas 202 by the vias 214. The via 218 and the memory elements $20_0$ to $20_7$ are disposed on the metal wiring lines 214, and the conductive layer 12 is disposed on and shared by the via 218 and the memory elements $20_0$ to $20_7$. The source line $SL_1$ is disposed above the conductive layer 12 and connected to the conductive layer 12 by the via 222.

As can be understood from FIGS. 17A to 17E, the memory elements $20_0$ to $20_7$ are disposed below the conductive layer 12.

(Memory Cell Area)

Figure 18:
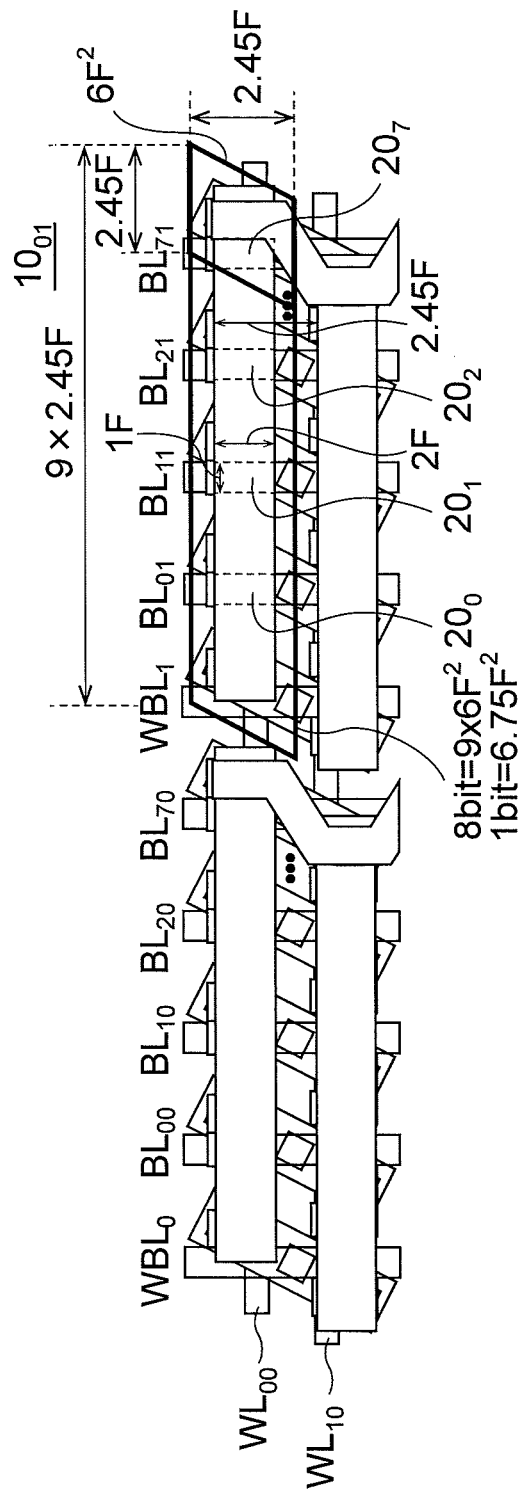
FIG. 18 is a diagram for explaining the area occupied by a memory cell of the magnetic memory according to the first embodiment.

FIG. 18 is an exemplary diagram for calculating the area of the memory cell $10_{01}$. The memory cell $10_{01}$ includes, for example, one selection transistor 31, eight selection transistors $25_0$ to $20_7$, a conductive layer 12, and eight memory elements $20_0$ to $20_7$. If each of the selection transistors 31 and $25_j$ (j=0, . . . , 7) is formed with the size of 2.45 F (length)×2.45 F (width), the area occupied by the selection transistor is 6 $F^2$. Since one memory element stores one-bit information, the memory cell $10_{01}$ stores eight-bit information, and the area of the memory cell $10_{01}$ corresponds to the area of nine selection transistors, i.e., 9×6 $F^2$=54 $F^2$. This means that the area per 1-bit memory element is 54 $F^2$/8=6.75 $F^2$. Thus, if the area of one selection transistor is 6 $F^2$, the area occupied by one-bit memory cell is 6.75 $F^2$ in this embodiment. The area per memory element becomes closer to 6 $F^2$ as the ratio of the number of selection transistors $25_j$ (j=0, . . . , 7) to the number of selection transistor 31 increases, i.e., the number of bits per memory cell increases.

The pitch in the short side direction of the conductive layers 12 included in adjacent memory cells may be 2.45 F. If the distance between adjacent conductive layers 12 is 0.45 F, the width of each conductive layer 12 may be 2 F. The width of the conductive layer 12 corresponds to the long side of the memory element. Therefore, the long side of each memory element is 2 F at a maximum. If the direction of the spin in the magnetic layer of each memory is an in-plane direction, the aspect ratio between the short side and the long side is preferably equal to or greater than 1. Therefore, for example, if the aspect ratio is 2, the long side of the memory element is 2 F at a maximum, and the short side is 1 F at a maximum. The shape of the memory element may be either rectangular or oval.

(Specific Method of Manufacturing Memory Cell)

A specific method of manufacturing a memory cell in which the memory elements $20_0$ to $20_7$ are disposed under the conductive layer 12 will be described with reference to FIGS. 19 to 36.

Figure 19:
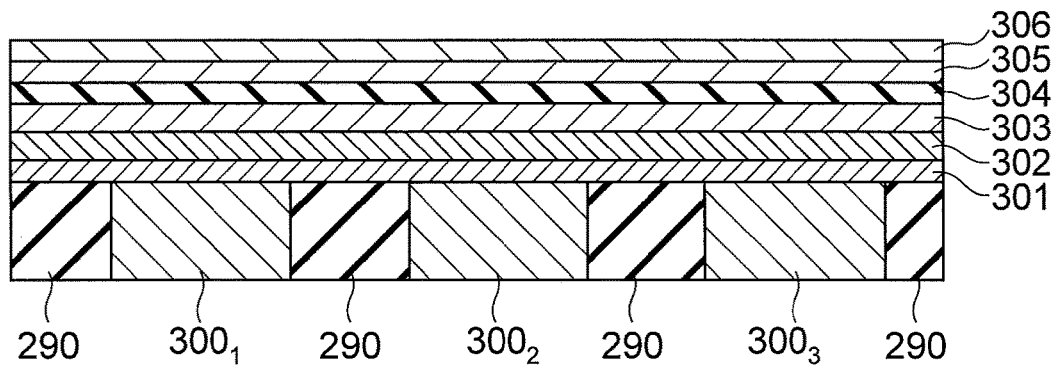
FIGS. 19 to 36 are cross-sectional views showing a specific method of manufacturing a memory cell, by which a memory element is disposed below a conductive layer.

If the conductive layer 12 is disposed above the memory elements, the storage layer of each element needs to be disposed on the top portion. FIG. 19 shows a specific multilayer structure. The layers for forming memory elements are stacked in the order of a base layer 301, a bias layer 302, a reference layer 303, a spacer layer (nonmagnetic layer) 304, a storage layer 305, and a protective layer 306. The base layer 301 is formed on, for example, metal wiring lines $300_1$ to $300_3$ electrically connected to the selection transistors of the memory elements, and interlayer insulating layers 290 each disposed between metal wiring lines.

A material of the base layer 301 is specifically selected so as to grow the base layer 301 on the metal wiring lines $300_1$ to $300_3$ without any problem, and to have a good electric connection with the metal wiring lines $300_1$ to $300_3$. Specifically, the base layer 301 may be a layer containing at least one metal selected from Ta, Cr, a Ni—Cr alloy, a Ni—Fe—Cr alloy, W, Mo, and Nb, or may have a multilayer structure including two or more of the above layers and a metal layer containing at least one element selected from the group consisting of Cu, Ru, Ir, Hf, Os, Pt, Pd, Al, and Mg. As used herein, a phrase referring to "at least one of" a list of items refers to any combination of those items, including a single member. As an example, "at least one of: a, b, or c" is intended to cover a, b, c, a-b, a-c, b-c, and a-b-c."

The bias layer 302 may be an antiferromagnetic metal layer containing at least one selected from IrMn, PtMn, FeMn, NiMn, and PdMn, a hard magnetic material layer containing an alloy of at least one metal selected from Nd, Sm, Dy, Tb, Gd, Cr, Pt, and Pd and at least one metal selected from Fe, Co, and Ni, or a multilayer structure including a magnetic layer containing at least one metal selected from Fe, Co, and Ni, and a metal layer containing at least one of Pt, Pd, and Cr.

The reference layer 303 may be a metal magnetic layer containing at least one of Fe, Co, and Ni, a metal ferromagnetic layer containing at least one of Fe, Co, and Ni and at least one of B, C, N, O, Si, P, Ga, Ge, and Al, or a multilayer structure including two or more metal ferromagnetic layers having different material compositions, or a multilayer structure including a magnetic layer containing at least one of Fe, Co, and N, and a metal layer containing at least one of Pt, Pd, and Cr. The reference layer 303 may have three or more layers in which the metal ferromagnetic layers are disposed on one side or both sides of a nonmagnetic material layer containing at least one of Ru, Ir, Cr, and Rh. If a synthetic antiferromagnetic structure, in which the metal magnetic layers on both sides of the nonmagnetic layer are antiferromagnetically coupled, is achieved, the effective magnetization of the reference layer may be reduced to near zero. Therefore, the static magnetic field that affects the storage layer may be prevented, and therefore variations in write current may be prevented. The magnetic layer included in the reference layer that is in contact with the spacer layer 304 is preferably a metal ferromagnetic layer containing at least one of Fe, Co, and Ni and at least one of B, C, N, O, Si, P, Ga, Ge, and Al. In this case, a better magnetoresistance effect may be obtained.

The spacer layer (nonmagnetic layer) 304 includes an oxide, a nitride, a boride, or a carbide. Among these materials, the oxide is chemically stable, and thus may bring about a high magnetoresistance effect. Specifically, Mg—O, Al—O, Mg—Al—O are preferable. The spacer layer 304 may also be a nonmagnetic metal layer. Specifically, a nonmagnetic metal layer containing at least one of Cu, Ir, Os, Al, Mg, Au, and NiAl may be selected.

The storage layer 305 may be a metal magnetic layer containing at least one of Fe, Co, and Ni, a metal ferromagnetic layer containing at least one of Fe, Co, and Ni and at least one of B, C, N, O, Si, P, Ga, Ge, and Al, a multilayer structure including two or more metal ferromagnetic layers each having a different magnetic material composition, or a multilayer structure including the metal ferromagnetic layer and a metal layer containing at least one of Pt, Pd, and Cr.

The protective layer 306 is formed during a microfabrication process performed after the memory element layers are stacked, in order to protect the storage layer 305 from being damaged during the process (FIG. 19). Therefore, the oxidation from the surface is preferably stopped in the protective layer 306. Specifically, the protective layer 306 may be a metal layer containing at least one of Ta, W, Mo, Nb, Al, Mg, Cr, and Hf, or a multilayer structure including the metal layer and an oxide layer containing an oxide of the above metal layer. The protective layer 306 may also be a multilayer structure including a nonmagnetic metal layer containing at least one of Cu, Ir, Os, Al, Mg, Au, and NiAl, which is disposed between one of the above layers and the storage layer 305. After the microfabrication process, the protective layer 306 needs to be completely removed before the conductive layer 12 is formed. If the protective layer 306 contains at least one of Ta, W, Mo, and Nb, however, these materials may be easily diffused into the storage layer 305 due to the energy generated during the process for etching the protective layer 306. If a nonmagnetic metal layer containing at least one of Cu, Ir, Os, Al, Mg, Au, and NiAl is disposed between the protective layer 306 and the storage layer 305, the protective layer 306 may be removed relatively easily with a reduced interface contamination.

Figure 20:
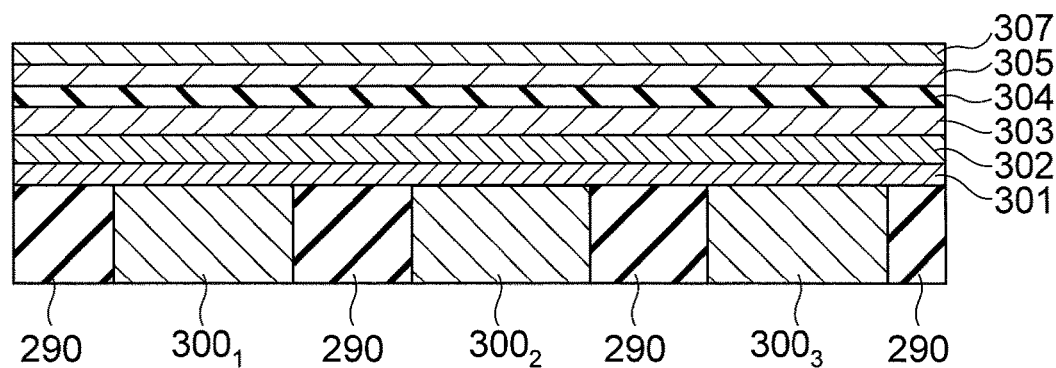

A conductive layer 307 may be formed immediately above the storage layer 305 as shown in FIG. 20. In this case, the conductive layer 307 and the storage layer 305 may be sequentially formed in a deposition apparatus under a vacuum condition. Therefore, the interface between the conductive layer 307 and the storage layer 305 may remain clean. As a result, a stronger spin orbit torque (SOT) may be obtained.

Figure 21:
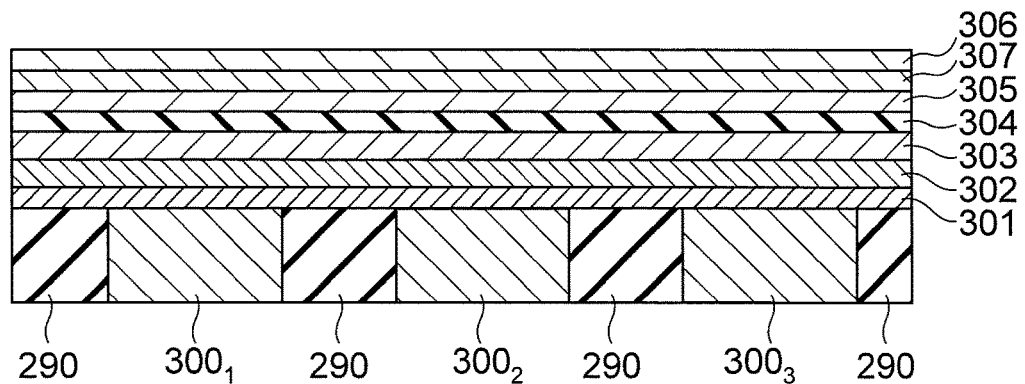

Furthermore, as shown in FIG. 21, the protective layer 306 may be disposed on the conductive layer 307 that is sequentially formed on the storage layer 305.

The memory element microfabrication process is performed by forming etching masks 308 on the protective film 306, on the conductive layer 307, or on the multilayer film including the protective film 306 formed on the conductive layer 307, and etching the layers. The material of the etching masks has an etching rate that is satisfactorily lower than that of the memory element materials. For example, if the memory element is etched by ion beam milling, carbon is preferably used as a main constituent of the etching masks.

After the microfabrication process, each memory element is processed to have an area of one square micrometer or less. The shape of the mask and the milling method may be selected from the following two options.

Figure 23:
Figure 24:
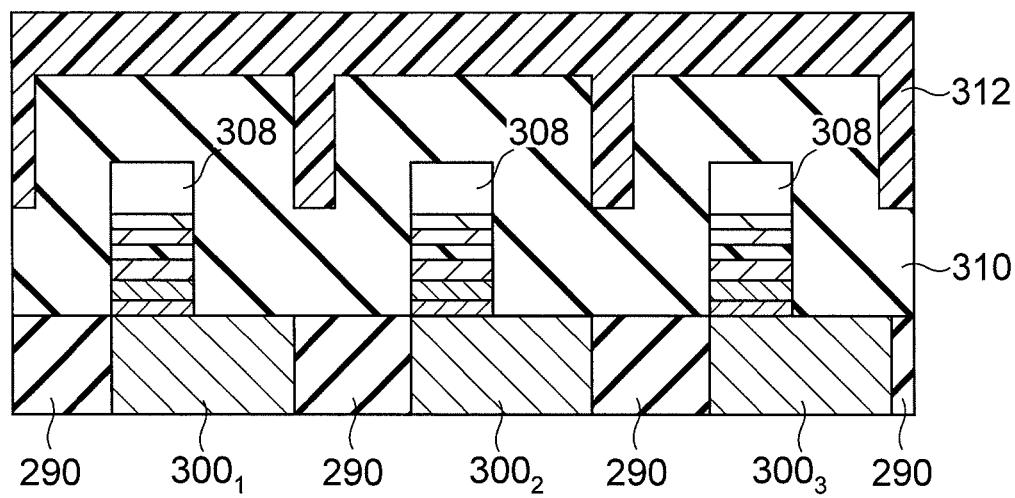
Figure 25:
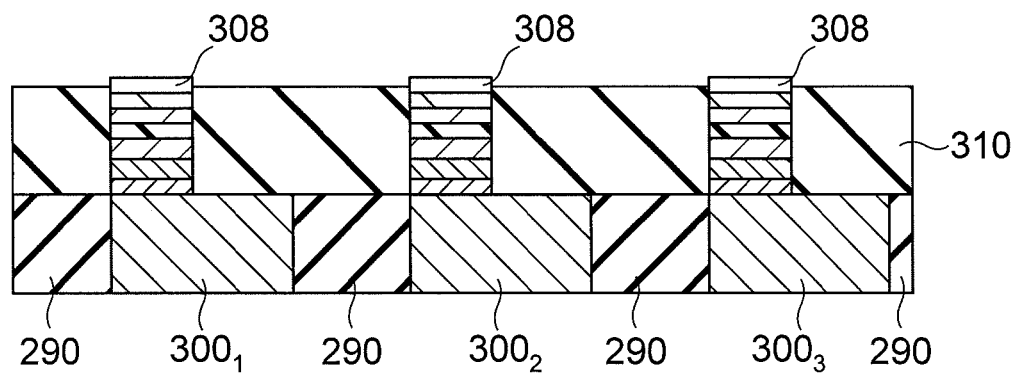
Figure 26:
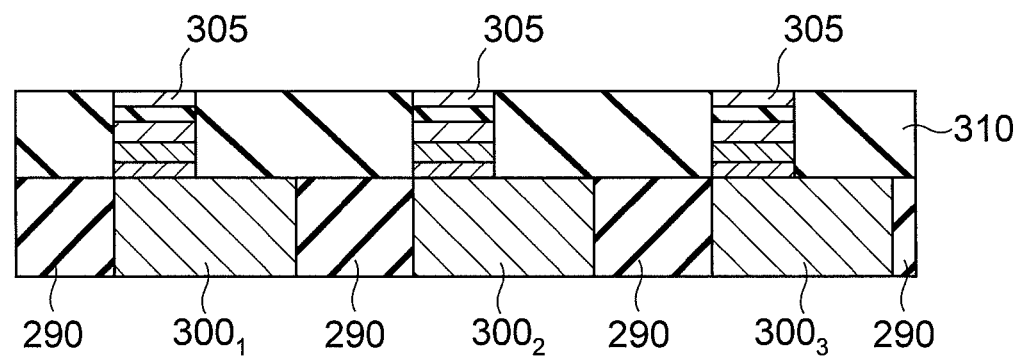

In one option, a mask having a size corresponding to the bit size of the memory element is formed, and the memory elements are patterned by simultaneous etching. FIG. 23 is a cross-sectional view sectioned along a word line to which micirofabricated memory elements that are simultaneously etched are connected. After this process, an interlayer insulating film 310 and a smoothing resist 312 are sequentially formed as shown in FIG. 24. Thereafter, the workpiece is etched to the top surfaces of the memory elements (FIG. 25). Part of the etching mask 308 is left on each memory element. Subsequently, the etching masks 308 are removed by such a process as reactive ion etching (RIE), and a further etching process is performed to remove the protective layer 306 (FIG. 26). As a result, the top surface of each memory element (the top surface of the storage layer 305) is exposed.

Figure 27:
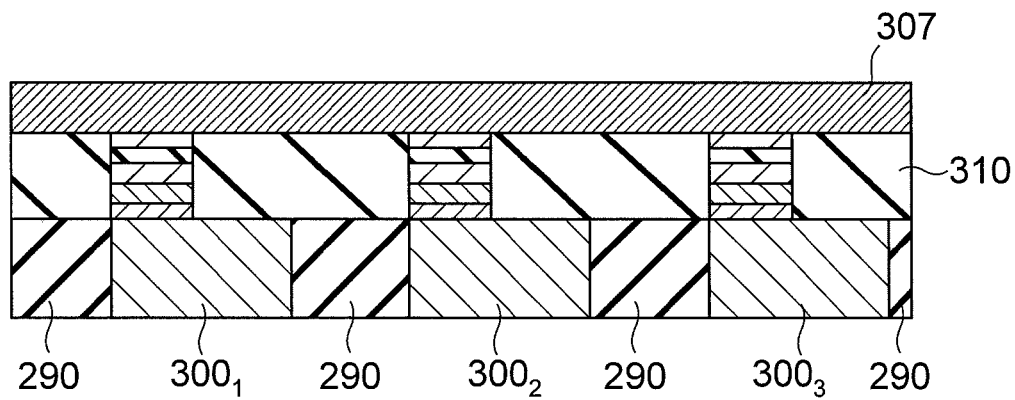
Figure 28:
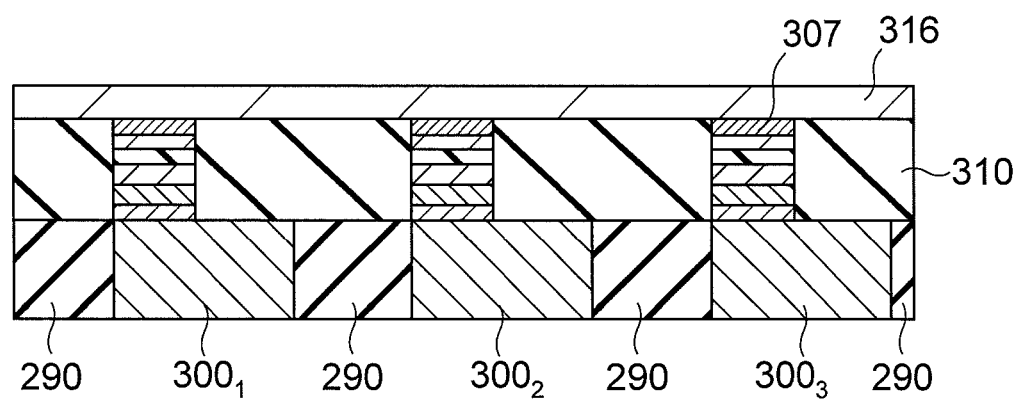
Figure 29:
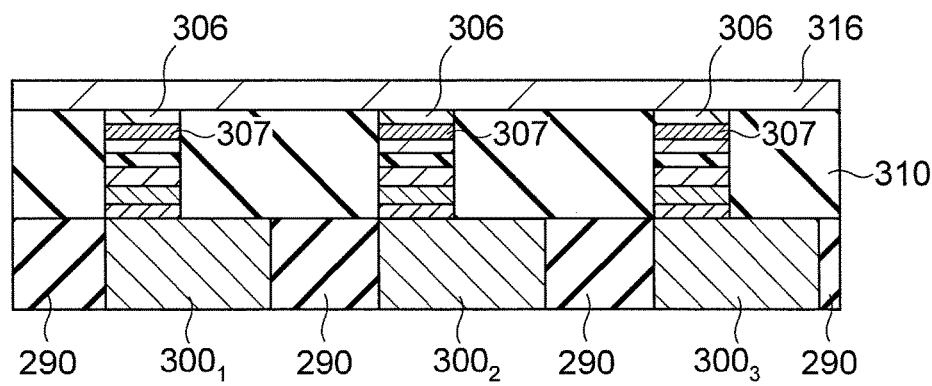

Subsequently, the conductive layer 307 is deposited (FIG. 27). Thereafter, a mask for patterning the conductive layer 307 to have a line shape is formed, and an etching process is performed to obtain the conductive layer 12 as shown in FIG. 18.

However, it is very difficult to completely remove the protective layer 306 by the etching without causing damage to the storage layer 305. As described above, the protective layer 306 may be removed to a certain degree if a nonmagnetic metal layer containing at least one of Cu, Ir, Os, Al, Mg, Au, and NiAl is formed on the storage layer 305 side of the protective layer 306. However, since it is difficult to stop the etching accurately at the interface with the storage layer 305, the characteristics of the storage layer may differ between memory elements.

Figure 22:
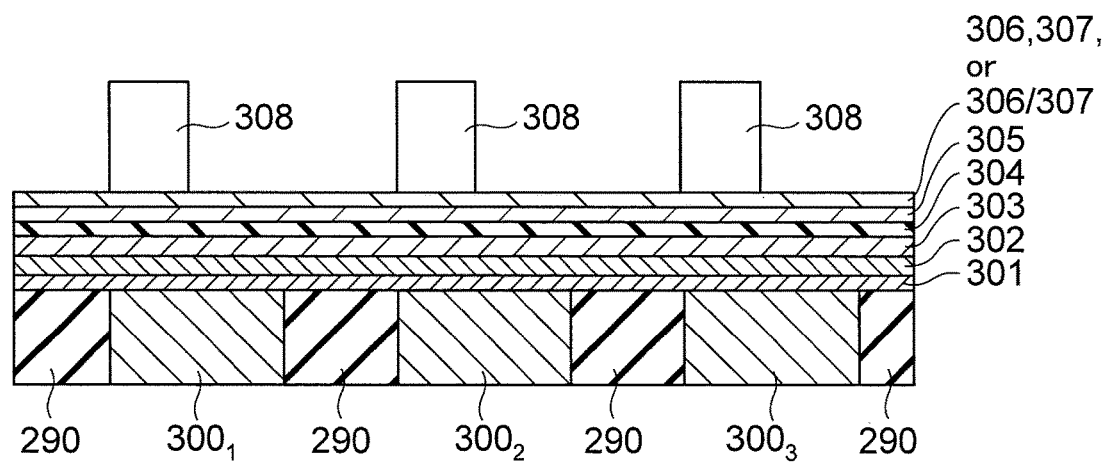

In order to solve this problem, the conductive layer 307 may be deposited in advance as shown in FIG. 22 or FIG. 23. However, in this case, a stable thickness may be obtained for the storage layers 305, but wiring lines connecting the memory elements should not be formed of the material of the conductive layer but should be formed of a metal that has a higher resistance than the material of the conductive layer (FIGS. 28 and 29) since a branch current flowing to wiring layers should be suppressed to be as low as possible in a region where the wiring layers overlap the conductive layers 307, in order to concentrate the write current to the conductive layer 307.

On the other hand, if the wiring lines between bits (memory elements) are formed of a high resistance metal, the resistance load increases when a write current is applied. This makes it difficult to design elements such as sense amplifiers, since the metal materials used for the conductive layer 307 generally have a high resistivity to improve the spin orbit torque (SOT) per current density. Therefore, forming wiring lines with a material that is still higher in resistance has a great influence on the design of elements such as sense amplifiers. Thus, it is difficult to form a wiring line connecting to bits with a material having a higher resistance than the conductive layer 307.

In order to solve this problem, a method of forming a region between bits with a low-resistance layer has been proposed (US2016/0042778A1). However, if the distance between bits is 50 nanometers or less, no stable process can be provided by this method.

A first process and a second process described below may solve the above problems and reduce the resistance between bits.

(First Process)

The first process is performed in the following manner.

Figure 30:
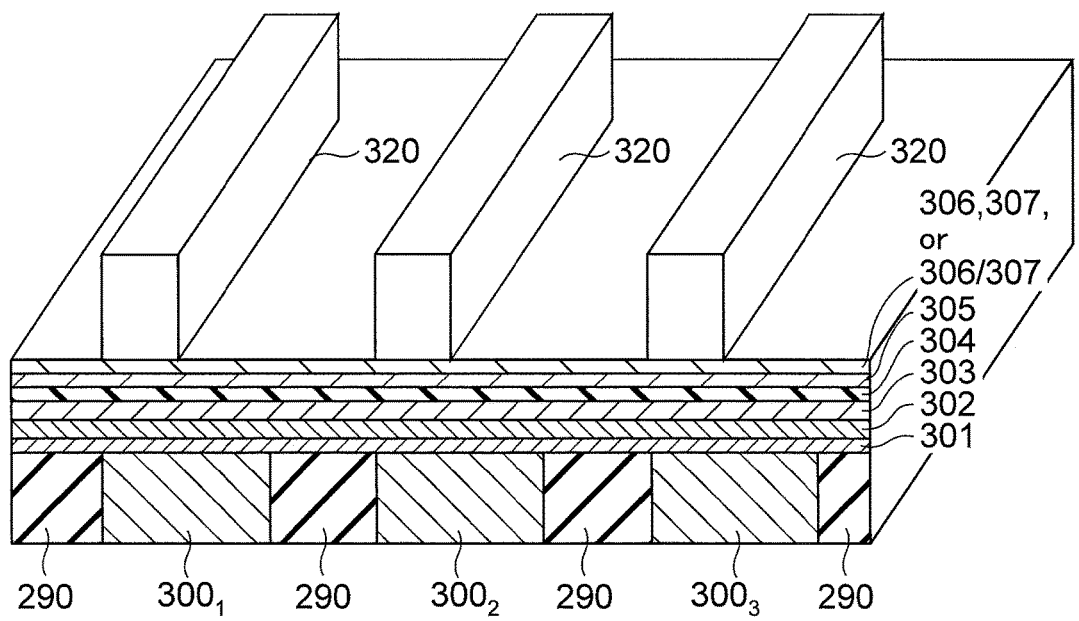

As shown in FIG. 30, the conductive layer 307 is sequentially formed on the storage layer 305. The protective layer 306 may or may not be present on the conductive layer 307. In the first step, masks 320, each having a line shape, for defining the bit size in the word line direction are formed as shown in FIG. 30. The memory elements are then etched to have a line shape. The material of the masks 320 and the etching method are the same as those in the simultaneous etching described above. The cross section of the memory elements patterned to have a line shape is the same as the cross section shown in FIG. 23.

Figure 31:
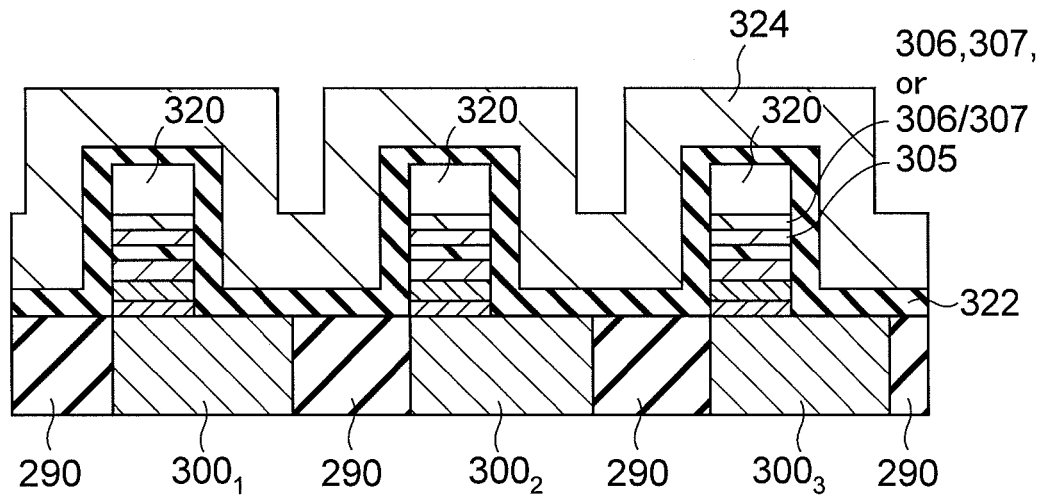

Subsequently, an interlayer insulating film 322 is deposited to cover the memory elements, and a metal film 324 to serve as a stopper in chemical mechanical polishing (CMP) that will be described later is deposited, as shown in FIG. 31. The interlayer insulating film 322 needs to be stably deposited on sidewalls of the memory elements. Therefore, chemical vapor deposition (CVD) or atomic-layer-deposition (ALD) is preferably used to deposit the interlayer insulating film 322. The metal film 324 may be formed of Ru. In order to stop the CMP at the top surface of the conductive layer 307, the thickness of the metal film 324 between bits, or memory elements, is preferably set so that the top surface of the metal film 324 is at the same height as the top surface of the conductive layer 307. However, the CMP may not be precisely performed and may have an error of about 3 nm. Therefore, the top surface of the metal film 324 is preferably higher than the top surface of the storage layer 305 by 3 nm. More preferably, the top surface of the metal film 324 is higher than the top surface of the storage layer 305 by 5 nm or more. Therefore, the height of the conductive layer 307 or the multilayer film including the conductive layer 307 and the protective layer 306 disposed on the storage layer is preferably 5 nm or more. If only the conductive layer 307 is disposed, the conductive layer 307 may be etched to some extent during the CMP, and therefore the thickness of the conductive layer 307 may vary for each memory element. This may lead to differences in current density between conductive layers 307, which causes variations in write current flowing through the bits. Therefore, the layers are preferably designed in a manner that a multilayer film including the conductive layer 307 and the protective layer 306 is disposed on the storage layer 305, and the CMP is stopped in the middle of the protective layer 306. A branch current is prevented from flowing into the protective layer 306 by setting the resistance of the protective layer 306 to be higher than that of the conductive layer 307.

Figure 32:
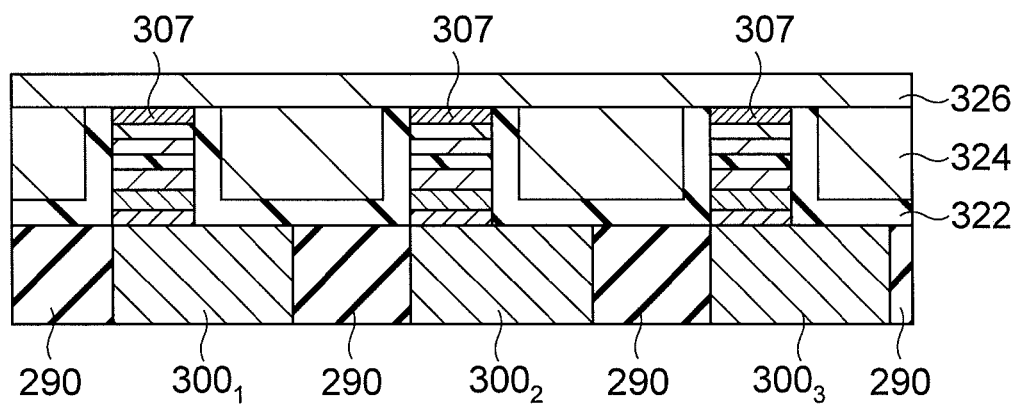

A high-resistance wiring line 326 is formed after the top surface of the conductive layer 307 or the top surface of the protective layer 306 is exposed by the CMP (FIG. 32). As the high-resistance wiring line 326 is formed, the thickness between the bits becomes very thick and the resistance between the bits becomes low. Therefore, a current is concentrated in the conductive layer 307 rather than the wiring line in a region above each bit (memory element). After this structure is formed, masks in a line shape extending along the word line direction are formed, and milling is performed to complete the memory elements. In this manner, a clean interface may be obtained between the storage layer and the conductive layer, and the resistance of the wiring line may be reduced between bits.

(Second Process)

The second process is performed in the following manner.

The same steps as those of the first process are performed until the step shown in FIG. 30. The step of processing the memory elements to have a line shape by etching is also performed in the same manner.

Figure 33:
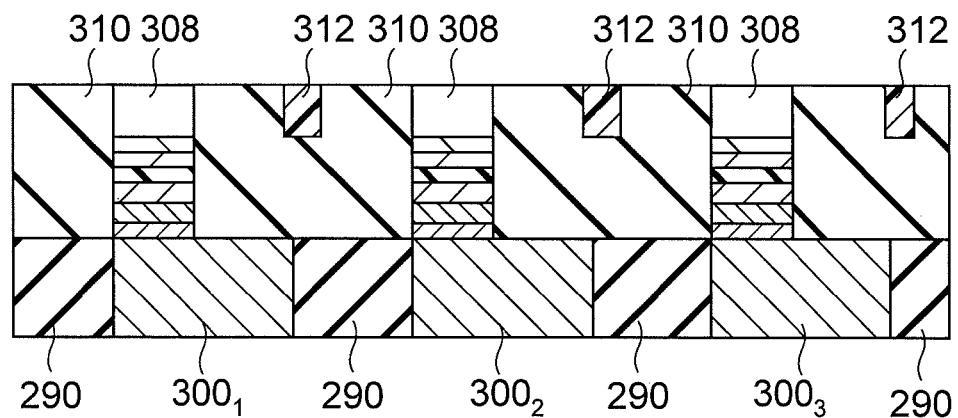

Thereafter, an interlayer insulating film 310 and a smoothing resist 312 are formed. The cross section in this state in the word line direction is the same as the cross section shown in FIG. 24. Subsequently, the workpiece is etched until the top surfaces of the masks 308 are exposed (FIG. 33). The etching may be stopped when, for example, carbon (C) is found in the etched elements if C is contained in the masks. Alternatively, a dummy pattern having the same height as the mask top surface may be disposed to improve the detection accuracy.

Figure 34:
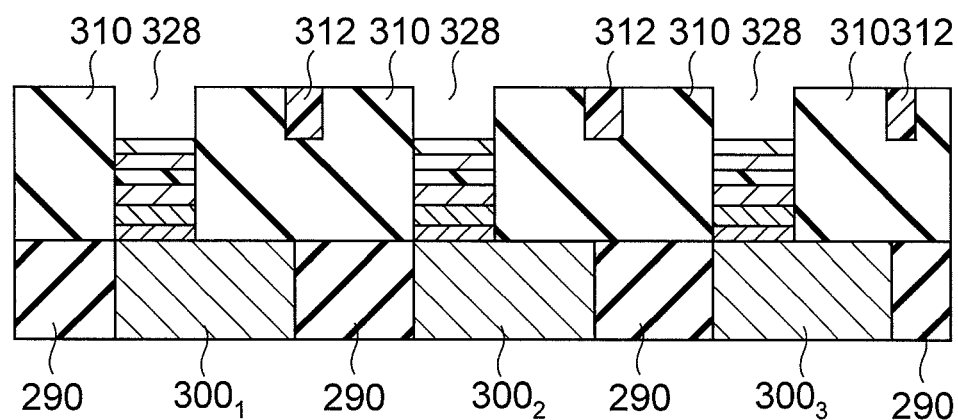

When the top surfaces of the masks 308 are exposed, the masks 308 are removed by, for example, RIE, to have the structure shown in FIG. 34. Recesses 328 are formed by removing the masks 308.

Figure 35:
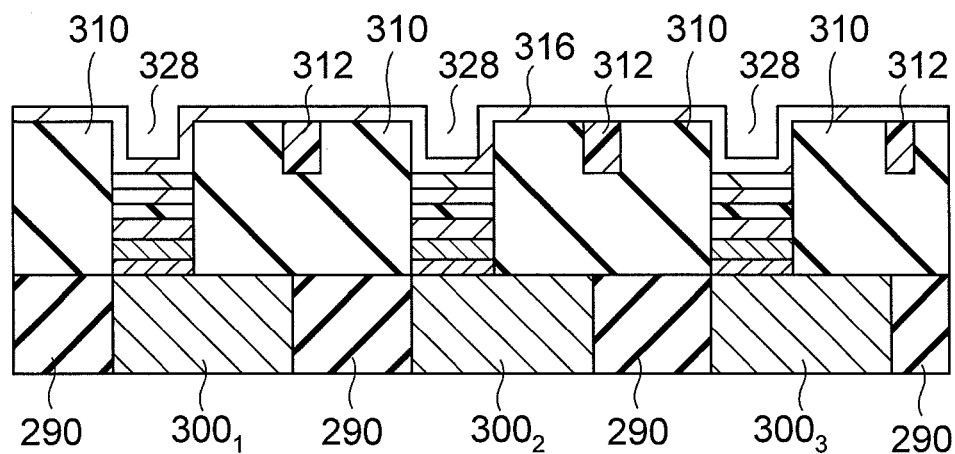

A high resistance wiring layer 316 is then deposited as shown in FIG. 35. The high resistance wiring layer 316 is preferably uniformly disposed on perpendicular walls of the recesses 328. Therefore, CVD or ALD is preferably performed to form the high resistance wiring layer 316.

Figure 36:
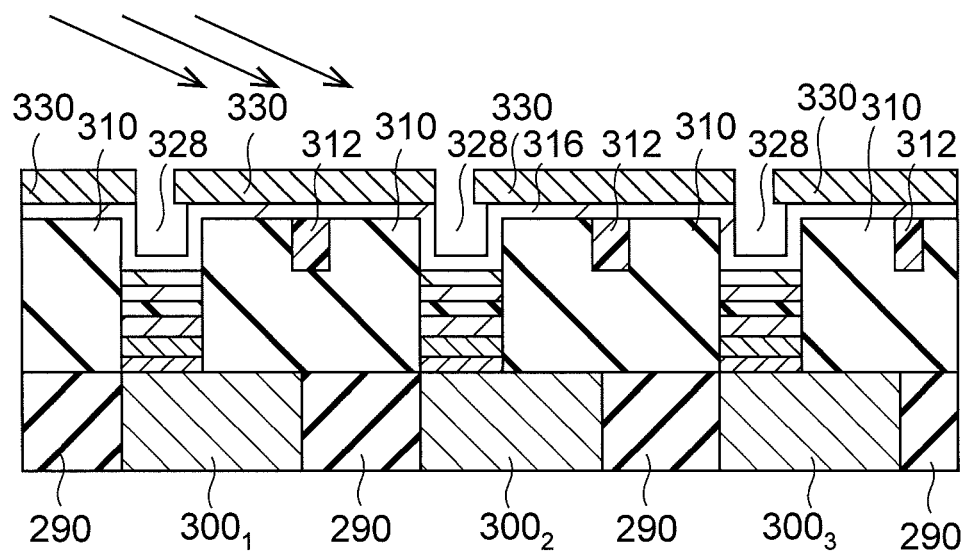

Thereafter, a low resistance layer 330 is deposited as shown in FIG. 36. The low resistance layer 330 may not be deposited on bottoms and side surfaces of the recesses 328, and may be selectively grown on regions between memory elements by using a deposition method having a strong directional characteristic. Specifically, ion-beam-deposition (IBD) may be used. More specifically, the workpiece is positioned such that the substrate surface is substantially parallel to the direction from the target center of the IBD to the substrate center. The angle needs to be adjusted more precisely for each device used since the angle may differ due to the positional relationship between the ion gun and the target. The low resistance material may be a general wiring material. Specifically, the low resistance layer may be a metal layer containing at least one of Cu, Al, Au, Ni, and Co. After the step shown in FIG. 36, each bit may be completed in a manner described in the descriptions of the first process. The respective memory elements may be completed by forming masks in a line shape extending in the word line direction, and performing milling. In this manner a clean interface may be obtained between the storage layer and the conductive layer, and the resistance of the wiring line may be reduced between bits.

As described above, according to the first embodiment, a magnetic memory with memory cells arranged with a high density may be provided.

Second Embodiment

A magnetic memory according to a second embodiment will be described with reference to FIGS. 37 to 56E. The magnetic memory according to the second embodiment includes at least one memory cell. The difference between the memory cell according to the second embodiment and the memory cell according to the first embodiment is that the N+1 magnetoresistive elements $20_0$ to $20_N$ are disposed above the conductive layer 12. Thus, as shown in FIG. 1, the memory cell 10 according to the second embodiment includes a nonmagnetic conductive layer 12, N+1 magnetoresistive elements $20_0$ to $20_N$ disposed above the conductive layer 12, selection transistors $25_0$ to $25_N$, and a selection transistor 31. The conductive layer 12 has a first terminal 12a and a second terminal 12b.

Each magnetoresistive element (memory element) has the same structure as that of the first embodiment as shown in FIG. 2. The connections among the elements are the same as those in the first embodiment. Therefore, the write operation and the read operation are performed in the same manner as the first embodiment.

The circuit diagram of the memory cell array is also the same as that of the first embodiment, and therefore similar to the circuit diagrams shown in FIGS. 3 to 5.

(Three-Dimensional Structure)

Figure 37:
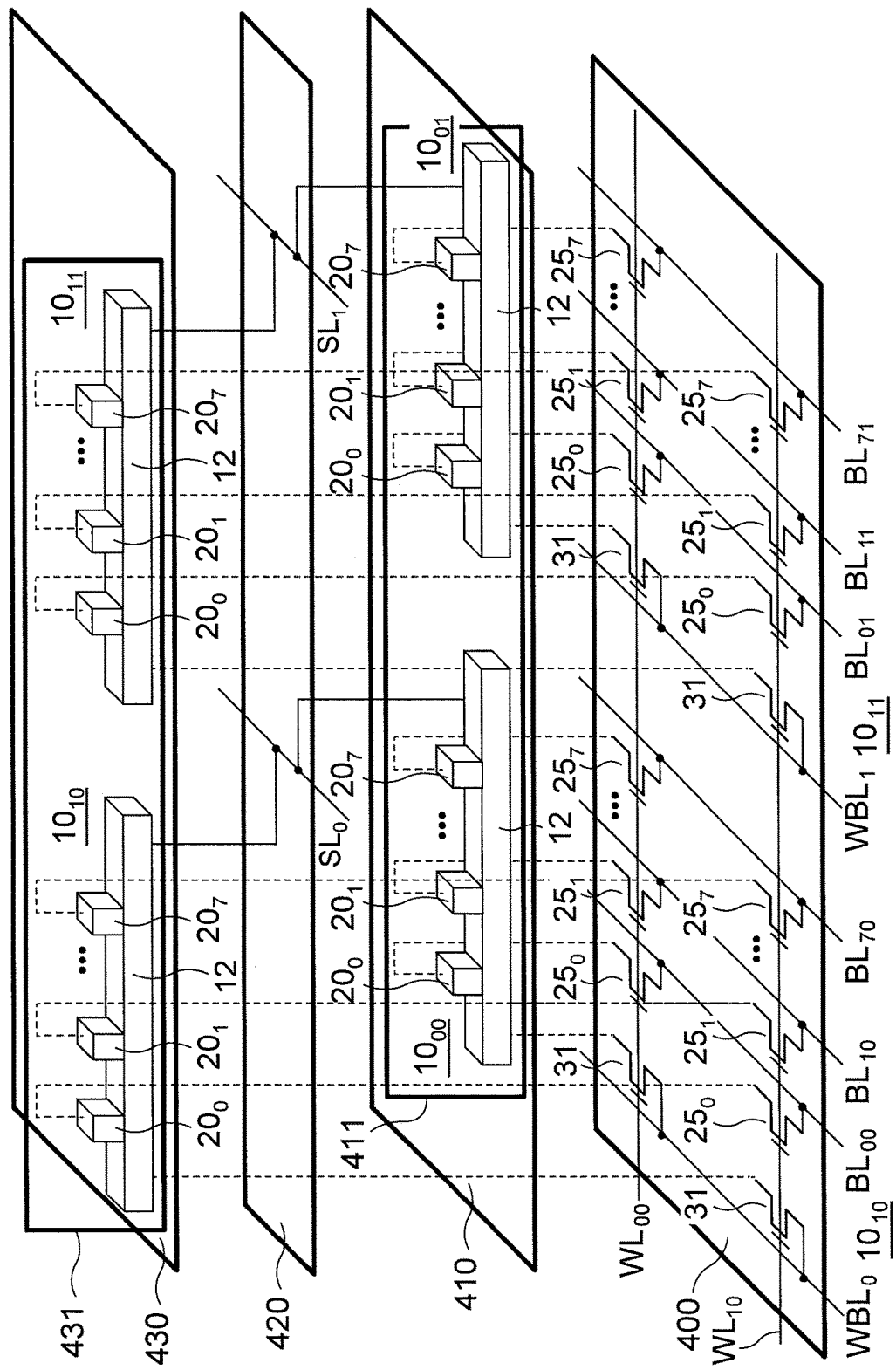
FIG. 37 is a diagram illustrating a three-dimensional structure of a magnetic memory according to a second embodiment.

A three-dimensional structure of the magnetic memory according to the second embodiment will be described with reference to FIG. 37. As can be understood from FIG. 37, the magnetic memory according to the second embodiment includes memory cells $10_{00}$, $10_{01}$, $10_{10}$, and $10_{11}$, formed over first to fourth levels 400, 410, 420, and 430, and memory elements (magnetoresistive elements) $20_0$ to $20_7$ of each memory cell are disposed above the conductive layer 12.

The first level 400 includes the selection transistors $25_0$ to $25_7$ and the selection transistor 31 of each memory cell $10_{ij}$ (i, j=0, 1), word lines $WL_{00}$ and $WL_{10}$, write bit lines $WBL_0$ and $WBL_1$, and bit lines $BL_{00}$ to $BL_{71}$.

The second level 410 includes vias and wiring lines connecting to the first level 400, the memory elements $20_0$ to $20_7$ and the conductive layers 12 of the memory cells $10_{0j}$ (j=0, 1). A region including the memory elements $20_0$ to $20_7$ and the conductive layers 12 of the memory cells $10_{00}$ and $10_{01}$ is indicated by a solid line 411.

The third level 420 includes vias and wiring lines connecting to the second level 410 and the fourth level 430, and source lines $SL_0$ and $SL_1$.

The fourth level 430 includes vias and wiring lines connecting to the third level 420, and the memory elements $20_0$ to $20_7$ and the conductive layers 12 of the memory cell $10_{1j}$ (j=0, 1). A region including the memory elements $20_0$ to $20_7$ and the conductive layers 12 of the memory cells $10_{10}$ and $10_{11}$ is indicated by a solid line 431.

In this embodiment, the memory elements are disposed on each conductive layer 12. Therefore, terminals on the reference layer side, which connect to the selection transistors of the memory elements, are disposed on the top. In order to have this structure, a space is needed to dispose wiring lines. However, unlike the case of the first embodiment shown in FIG. 6, the second level 410 does not have a space in which two sets of memory elements $20_0$ to $20_7$ and conductive layer 12 for the memory cells $10_{10}$ and $10_{11}$ are arranged. Therefore, the memory elements $20_0$ to $20_7$ and the conductive layers 12 for the memory cell $10_{0j}$ (j=0, 1) are disposed on the second level 410, and the memory elements $20_0$ to $20_7$ and the conductive layers 12 for the memory cells $10_{10}$ and $10_{11}$ are disposed on the fourth level 430 in this embodiment, so that the conductive layers 12 and the memory elements $20_0$ to $20_7$ may have the same sizes as those for the first embodiment.

(Manufacturing Method)

A method of manufacturing the magnetic memory according to the second embodiment having the above-described three-dimensional structure will be described with reference to FIGS. 38 to 54. The magnetic memory to be manufactured by the method includes the memory cell array 100 shown in FIG. 5, and thus includes memory cells $10_{00}$ to $10_{31}$ arranged in a 4×2 array form.

Figure 38:
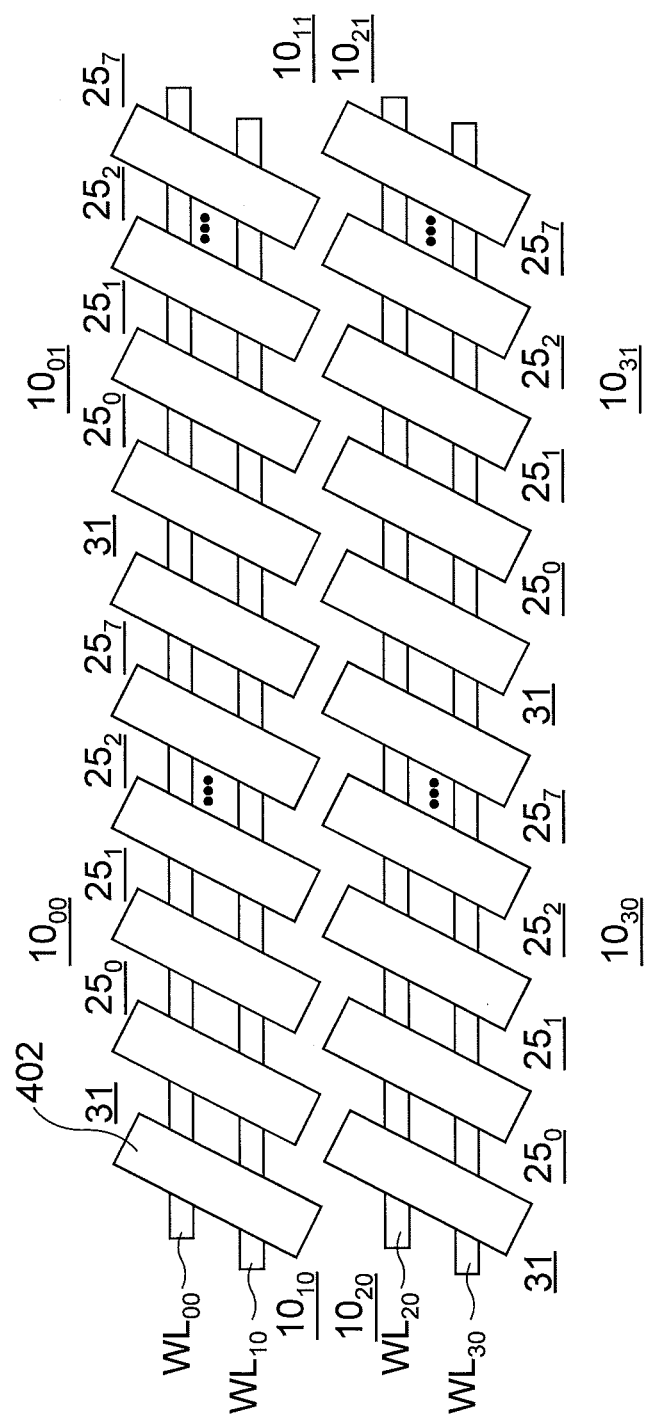
FIGS. 38 to 54 are plan views showing a process for manufacturing the magnetic memory according to the second embodiment.
Figure 39:
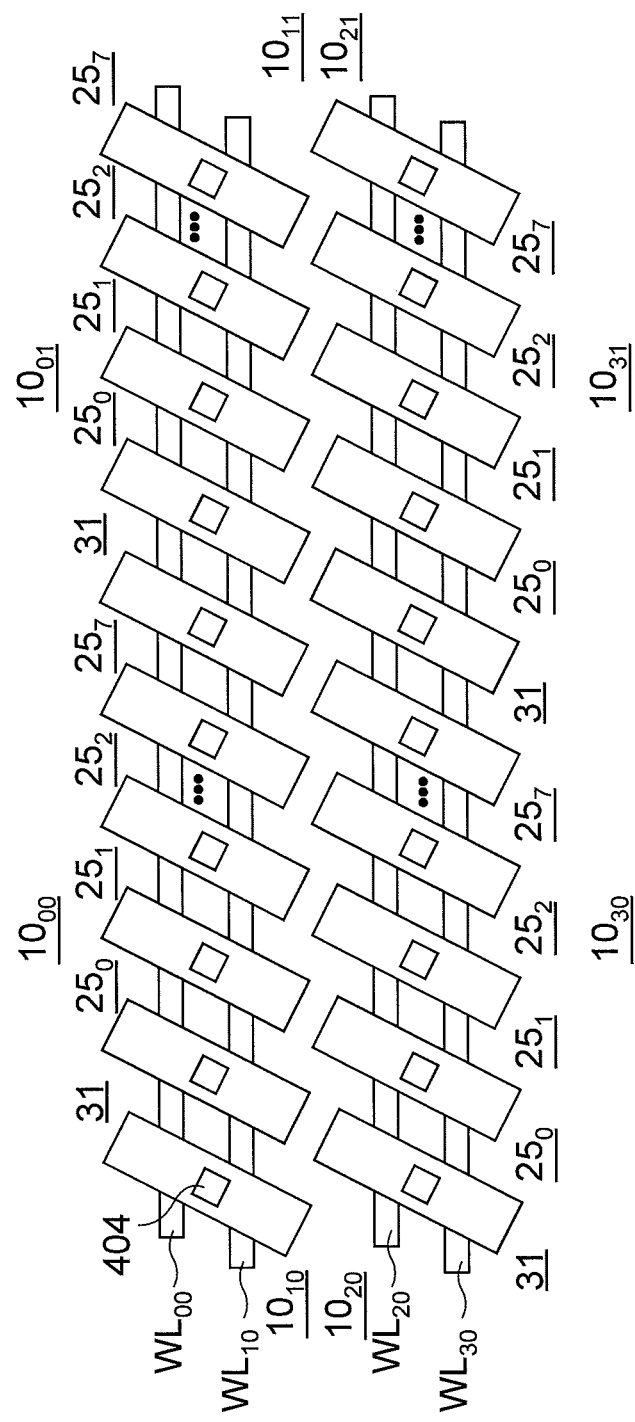
Figure 40:
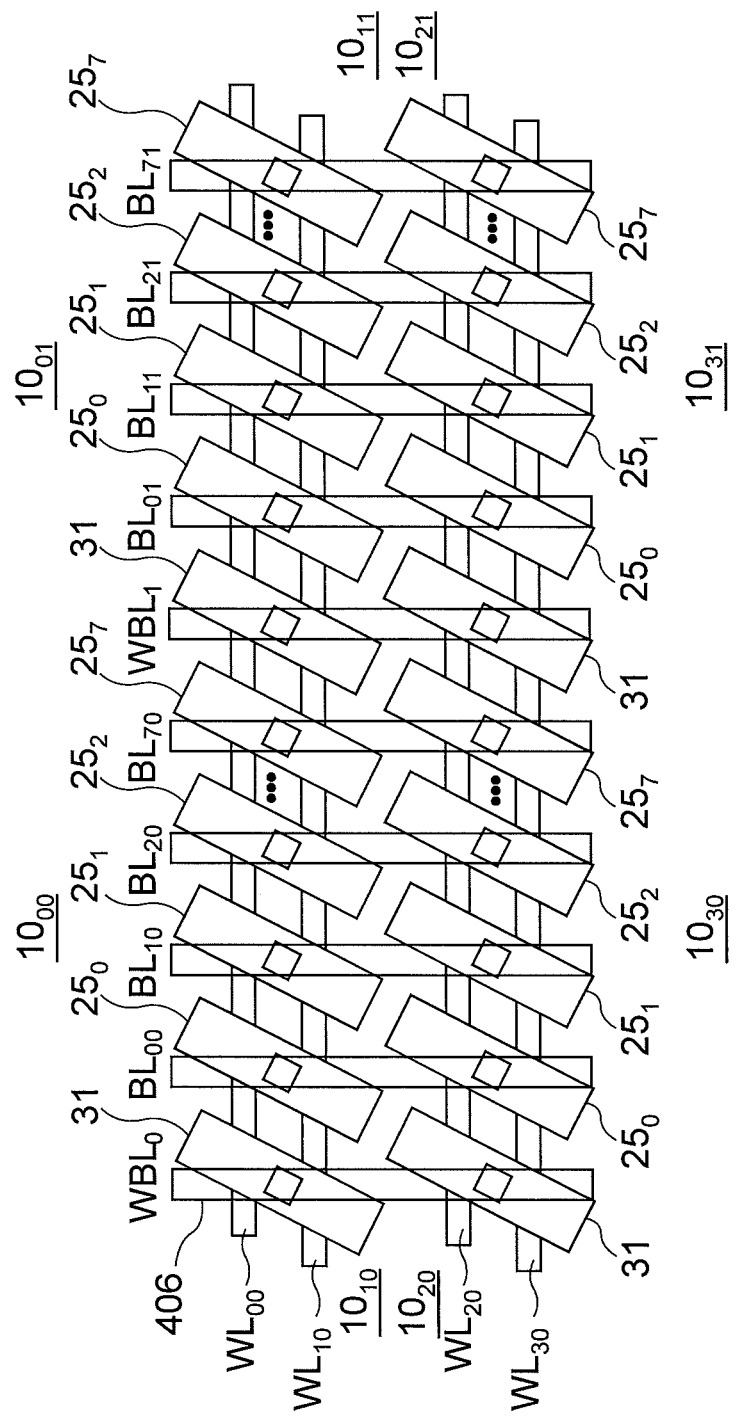

The process for forming the first level 400 is shown in FIGS. 38 to 40. In the process for forming the first level 400, embedded word lines $WL_{00}$ to $WL_{30}$ are first formed, and active areas 402 to serve as device portions of planar transistors are formed (FIG. 38). The active areas 402 have the same size and arranged with the same intervals in the top and bottom direction, and the left and right direction in the drawing. This is important for processing minute devices with a good yield. There is a case where required transistor characteristics differ between the selection transistor 31 for selecting a conductive layers and the selection transistors $25_0$ to $25_7$ for selecting the memory elements. In such a case, the transistors may be formed in a different manner such as with a different doping concentration.

FIG. 39 shows that a via 404 is formed on the common drain of each transistor in the process for forming the first level 400.

FIG. 40 shows that metal wiring lines 406 to become the bit lines $BL_{00}$ to $BL_{17}$ and the write bit lines $WBL_0$ and $WBL_1$ are formed and connected to the corresponding vias 404 in the process for forming the first level 400. The transistors connecting to the write bit lines $WBL_0$ and $WBL_1$ are the selection transistors 31 for selecting the conductive layers, and the transistors connecting to the bit lines $BL_{ij}$ (i=0, 1, j=0, . . . , 7) are the selection transistors $25_j$. In FIG. 40, each bit line $BL_{ij}$ (i=0, 1, j=0, . . . , 7) has a rectangular shape. However, this is simply an example, and it may be bent to have, for example, a corrugated shape.

Figure 41:
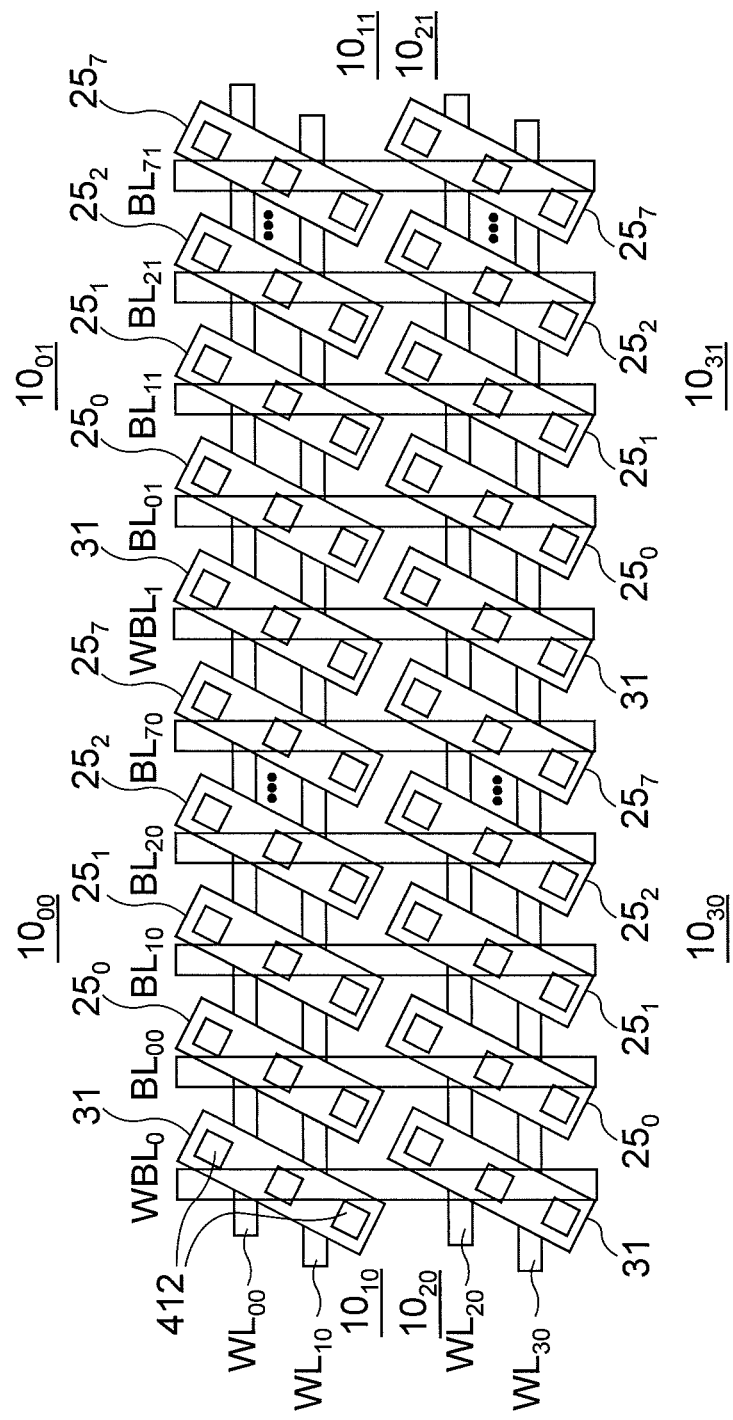

A process for forming the second level 410 will then be described with reference to FIGS. 41 to 46. In the process for forming the second level 410, vias 412 are formed on the sources of the selection transistors as shown in FIG. 41.

Figure 42:
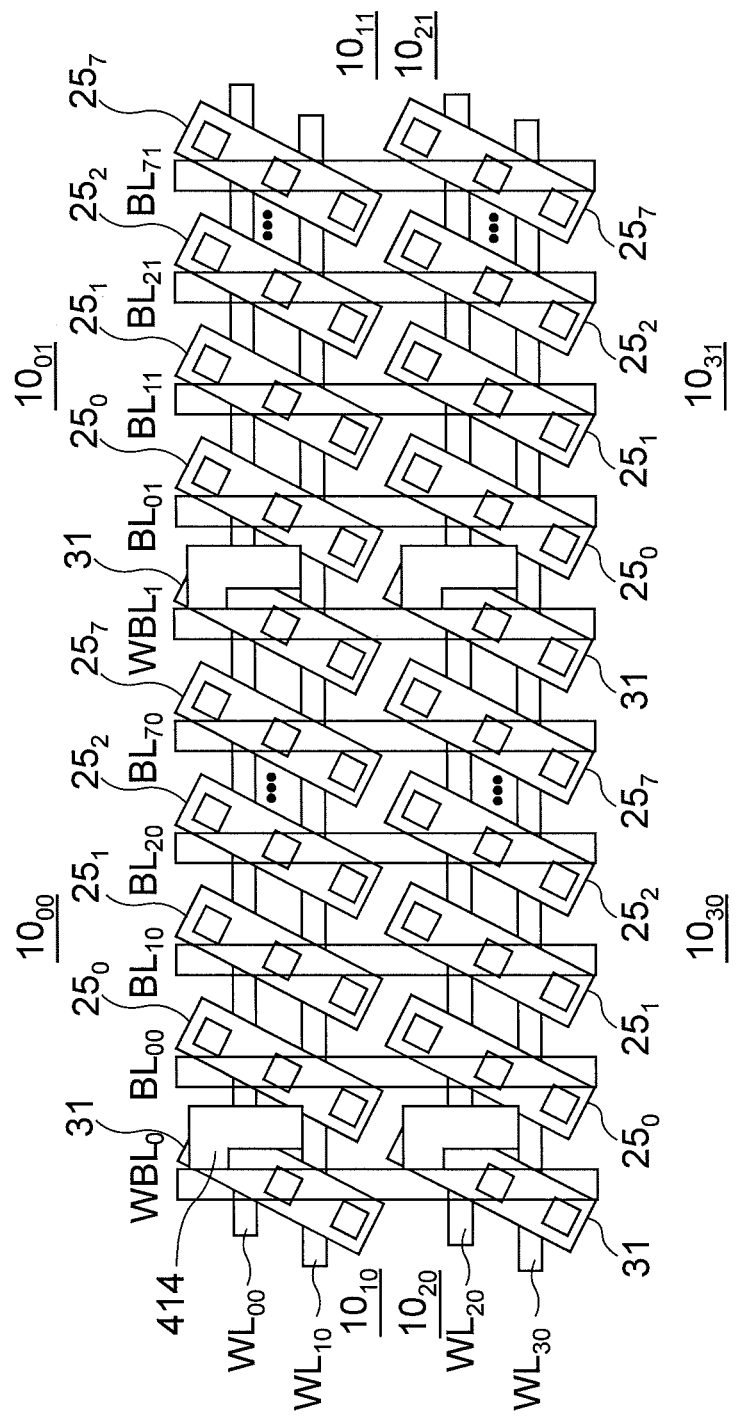

A metal wiring line 414 is then disposed to connect to the via 412 of the source of each selection transistor for selecting the conductive layer, as shown in FIG. 42. This metal wiring line 414 will become a wiring line connecting to the conductive layer that will be formed later and the selection transistor for selecting the conductive layer.

Figure 43:
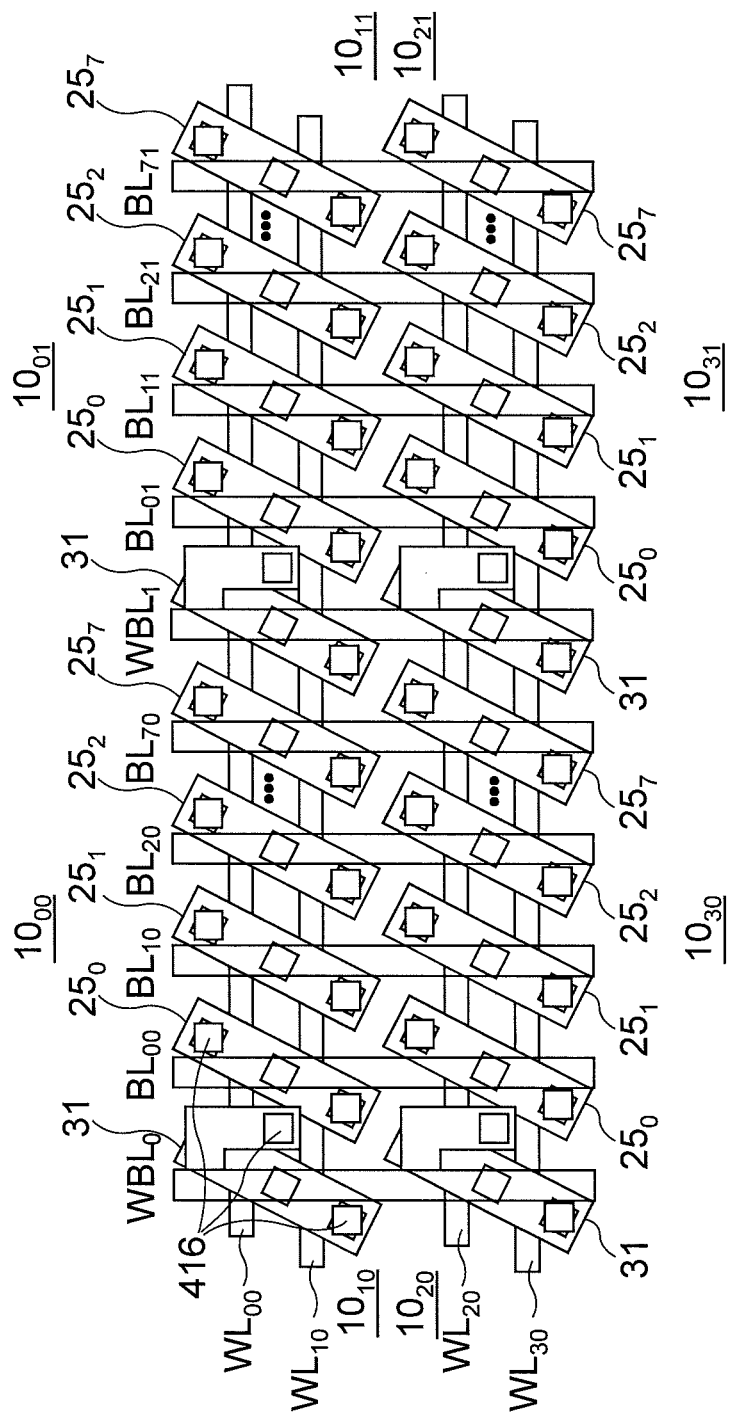

Vias 416 are then formed on the vias 412 connecting to the selection transistors $25_0$ to $25_7$ for selecting the memory elements and the metal wiring line 414 connecting to the selection transistor 31 for selecting the conductive layer, as shown in FIG. 43.

Figure 44:
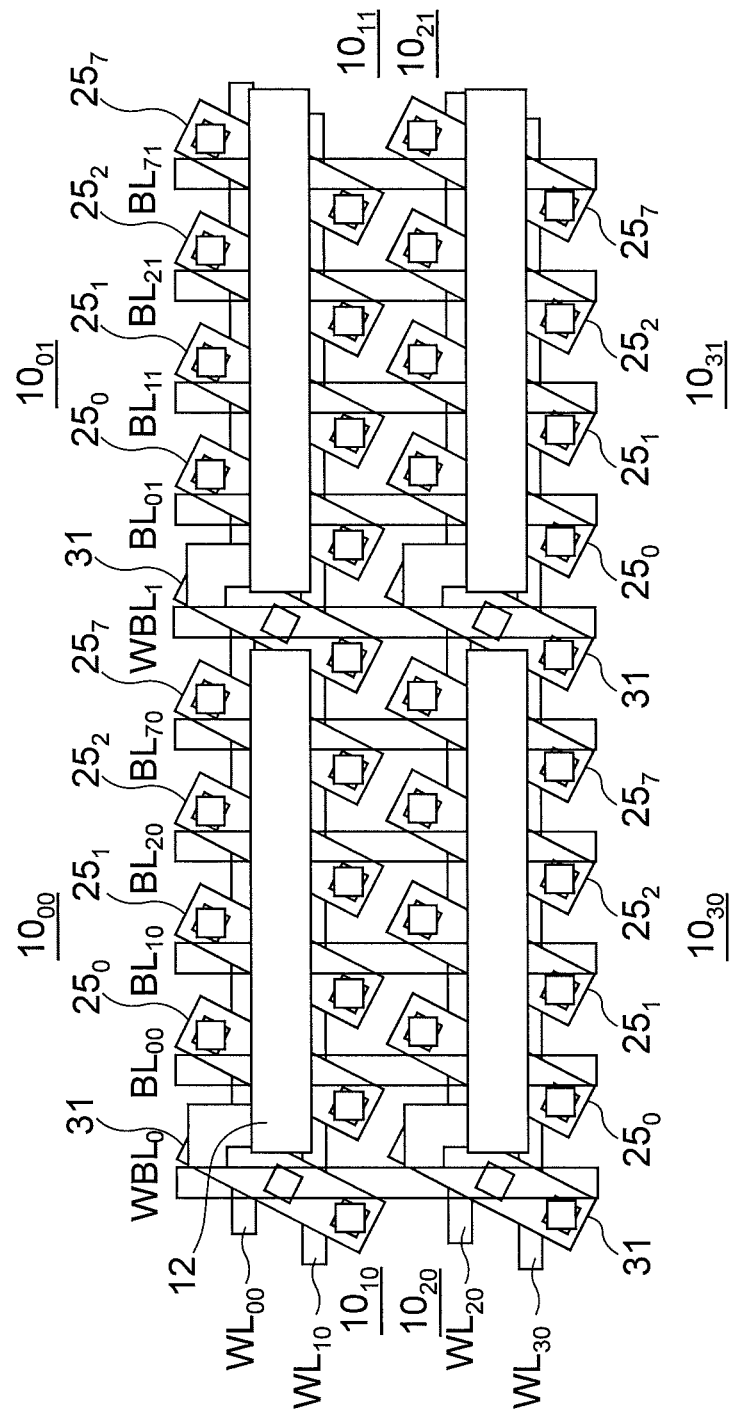

Thereafter, as shown in FIG. 44, a conductive layer 12 of each the memory cells $10_{00}$, $10_{01}$, $10_{20}$, and $10_{21}$ is formed so as to cover and connect to the via 416 connecting to the selection transistor 31. Subsequently, the memory elements of the memory cells $10_{00}$, $10_{01}$, $10_{20}$, and $10_{21}$ are formed on the conductive layers 12 of the memory cells $10_{00}$, $10_{01}$, $10_{20}$, and $10_{21}$. The conductive layers and the memory elements may be formed and processed at the same time or different times.

Figure 45:
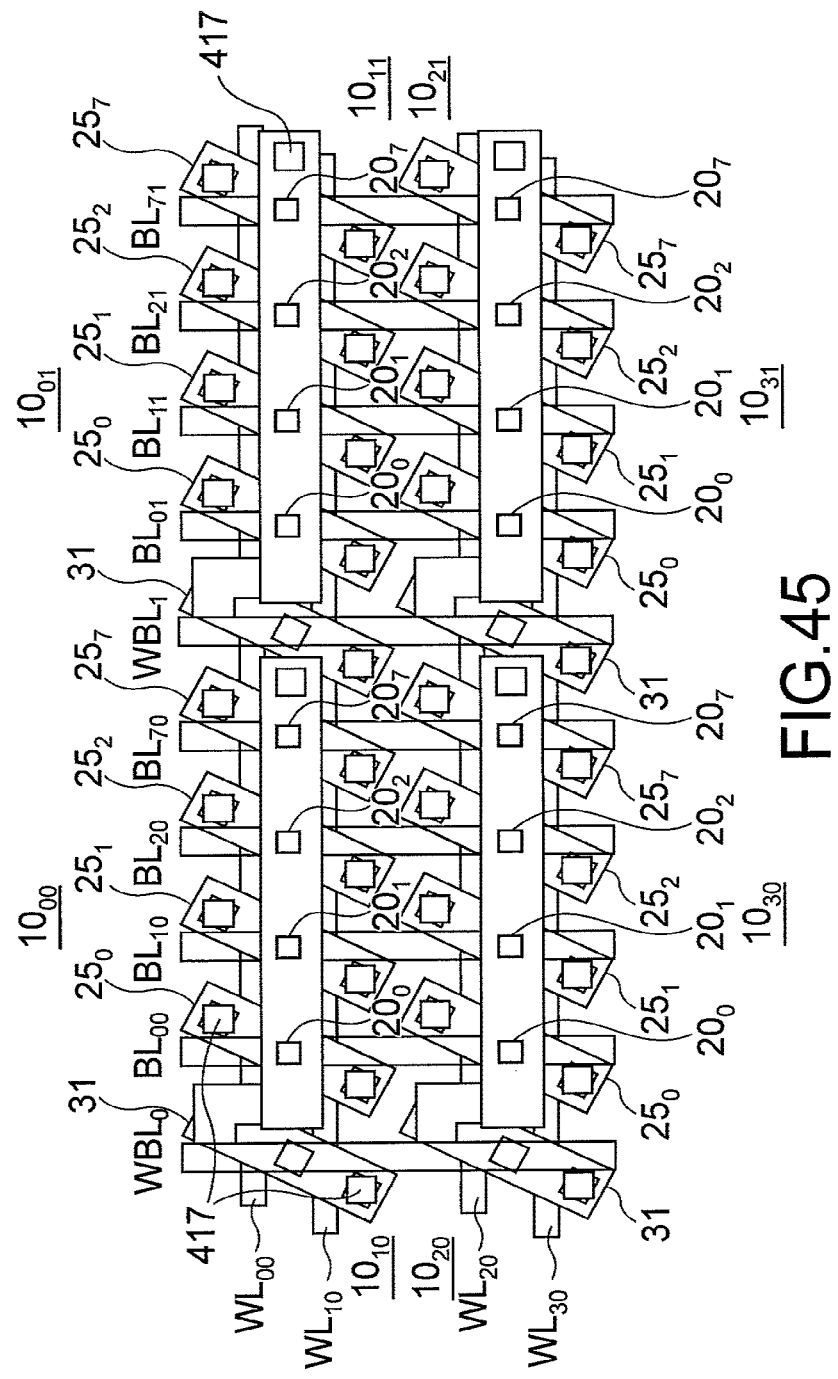

Next, as shown in FIG. 45, vias 417 are formed on the conductive layers 12 of the memory cells $10_{00}$, $10_{01}$, $10_{20}$, and $10_{21}$ and the vias 416.

Figure 46:
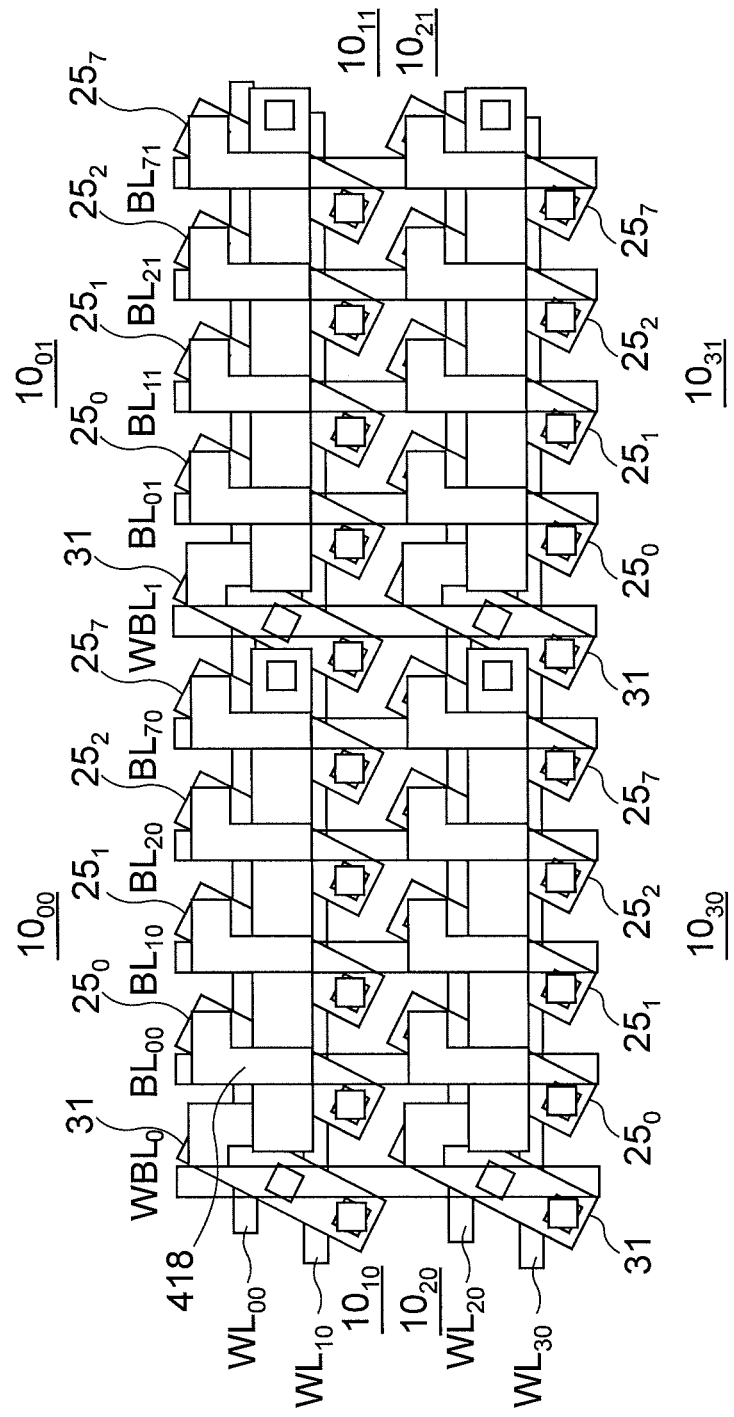

Thereafter, as shown in FIG. 46, metal wiring lines 418 connecting the memory elements of the memory cells $10_{00}$, $10_{01}$, $10_{20}$, and $10_{21}$ and the vias 417 of the selection transistors are formed.

Figure 47:
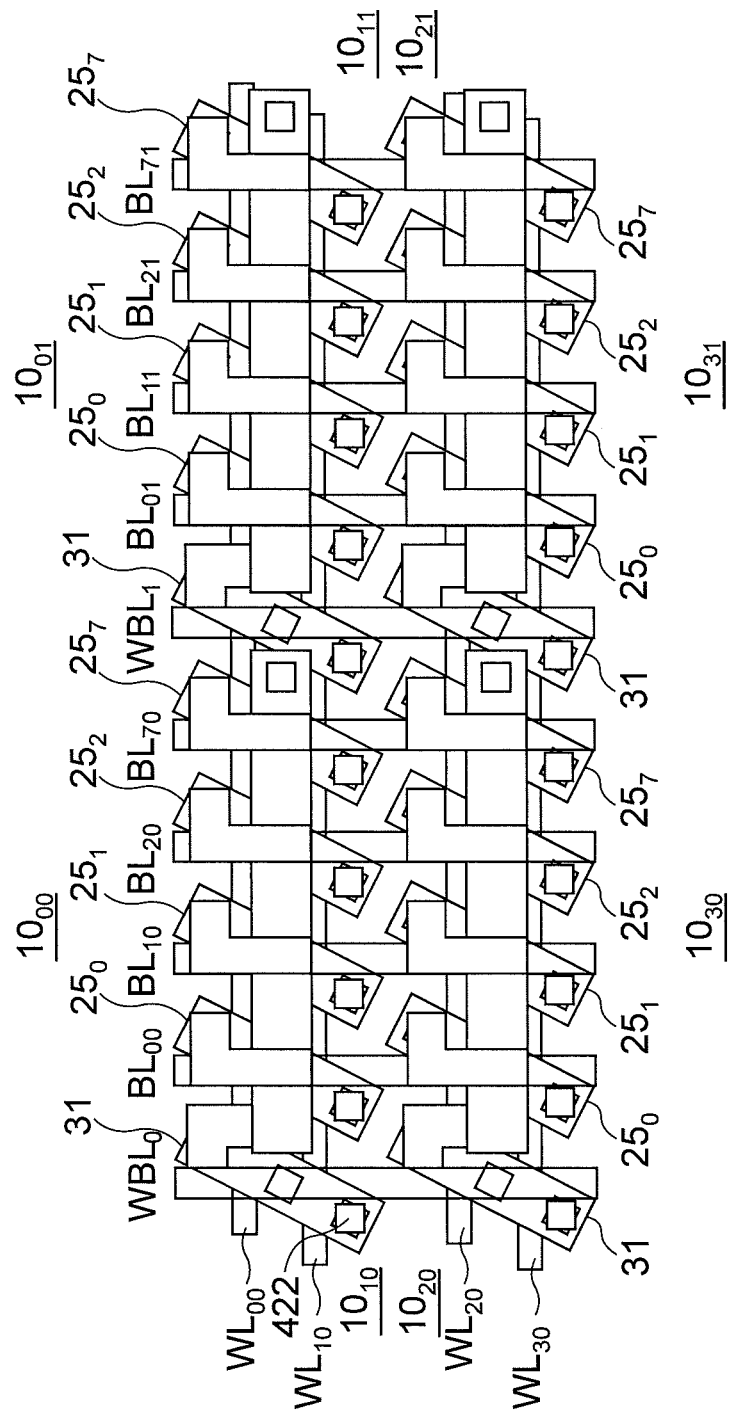
Figure 48:
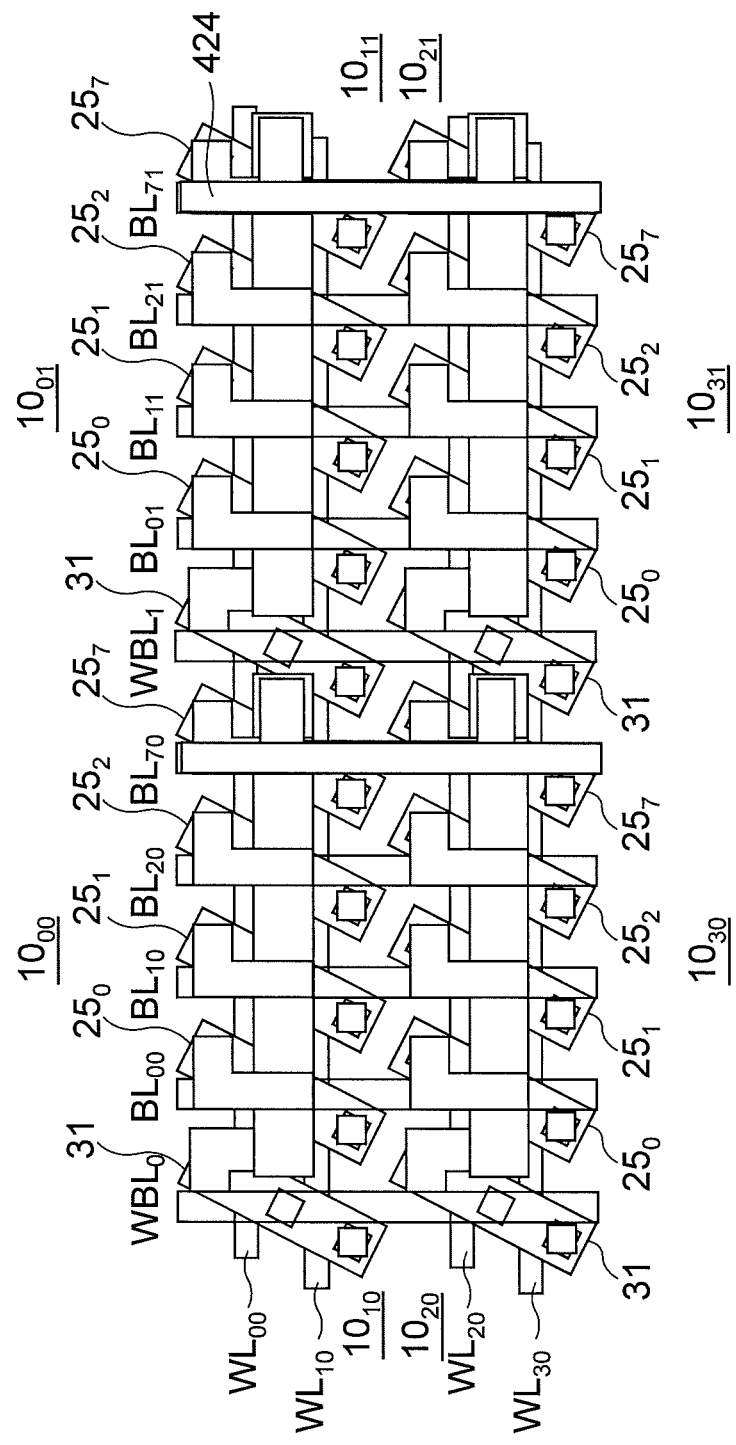

FIGS. 47 and 48 illustrate a process for forming the third level 420. First, vias 422 are formed on the conductive layers 12 of the memory cells $10_{00}$, $10_{01}$, $10_{20}$, and $10_{21}$ and the vias 417 of the selection transistors $25_0$ to $25_7$ connecting to the memory elements of the memory cells $10_{10}$, $10_{11}$, $10_{30}$, and $10_{31}$, as shown in FIG. 47.

Thereafter, metal wiring lines 424 to become the source lines $SL_0$ and $SL_1$ connecting to the vias 417 of the conductive layers 12 of the memory cells $10_{00}$, $10_{01}$, $10_{20}$, and $10_{21}$ are formed, as shown in FIG. 48.

Figure 49:
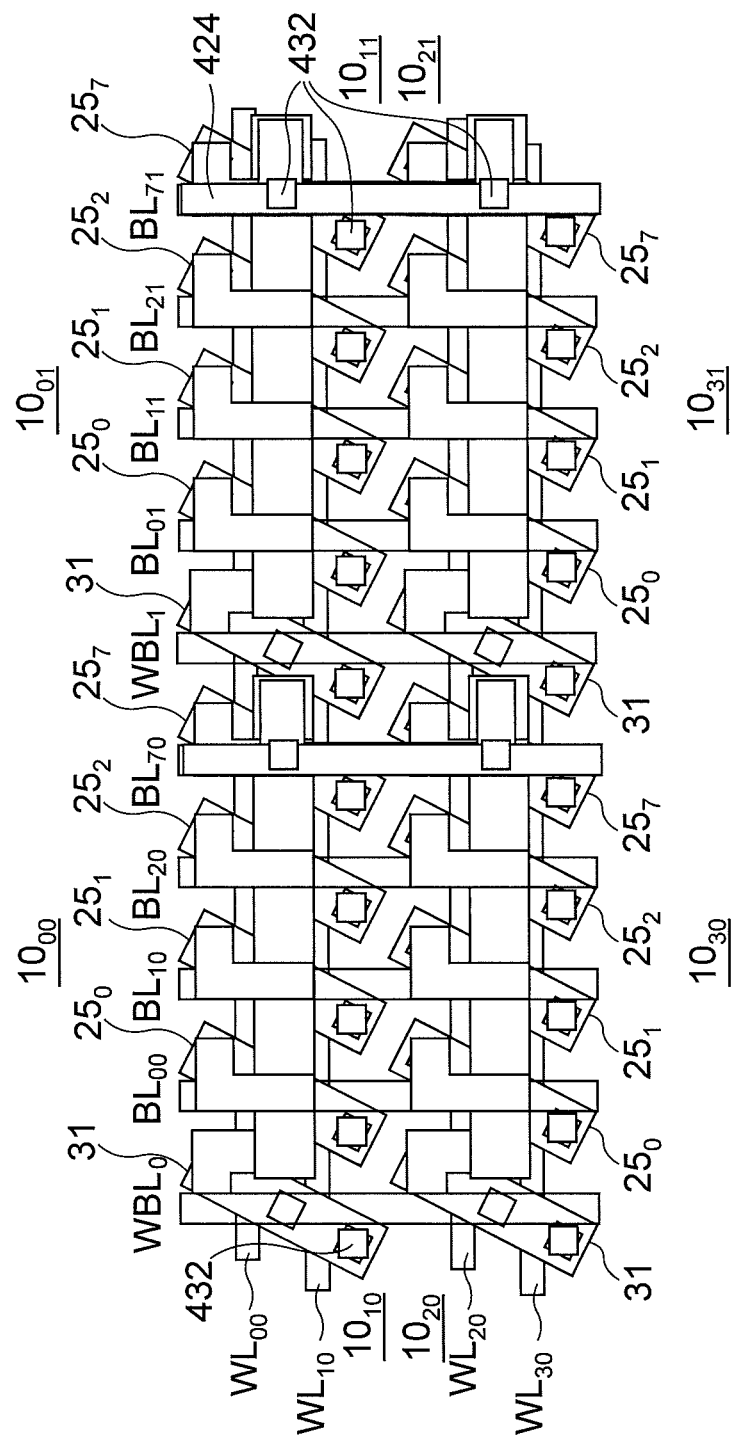

A process for forming the fourth level 430 will be described with reference to FIGS. 49 to 54. First, vias 432 are formed on the source lines $SL_0$ and $SL_1$ and the vias 422 of the selection transistors 31 and $25_0$ to $25_7$ connecting to the conductive layers 12 of the memory cells $10_{10}$, $10_{11}$, $10_{30}$, and $10_{31}$, as shown in FIG. 49.

Figure 50:
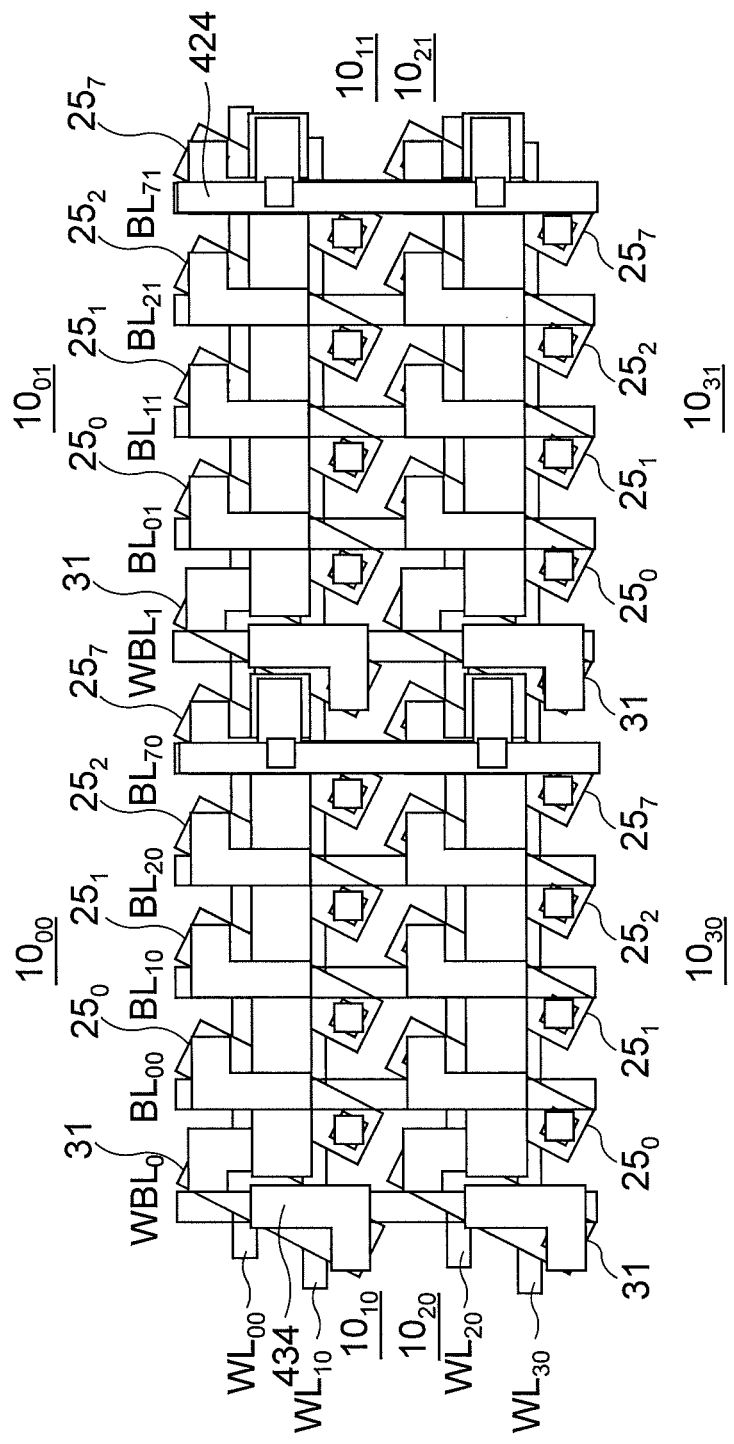

Thereafter, metal wiring lines 434 connecting to the vias 432 of the selection transistors 31 connecting to the conductive layers 12 of the memory cells $10_{10}$, $10_{11}$, $10_{30}$, and $10_{31}$ are formed, as shown in FIG. 50.

Figure 51:
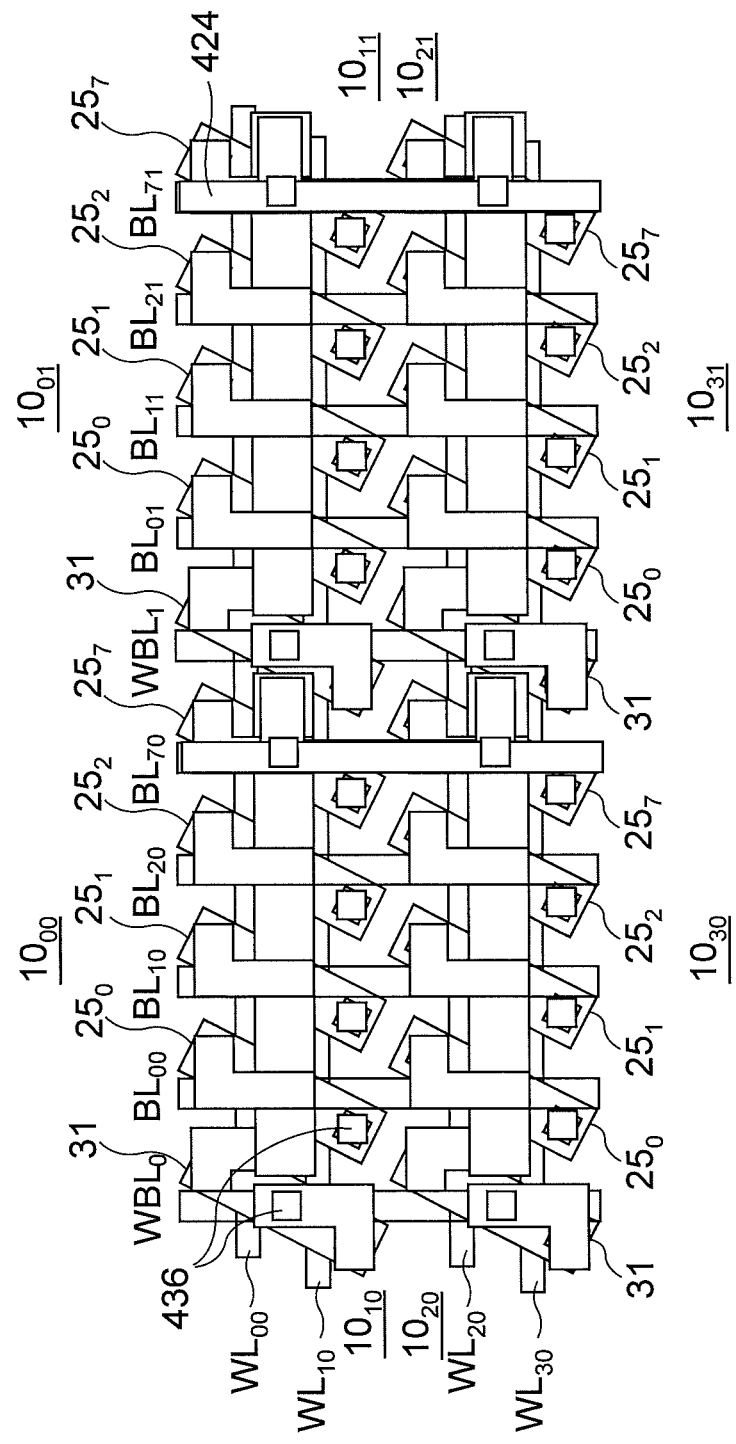

Subsequently, as shown in FIG. 51, vias 436 are formed on the vias 432 on the metal wiring lines 424 to become the source lines $SL_0$ and $SL_1$, metal wirings 434, and selection transistors $25_0$ to $25_7$ connecting to the memory elements of the memory cells $10_{10}$, $10_{11}$, $10_{30}$, and $10_{31}$ are formed.

Figure 52:
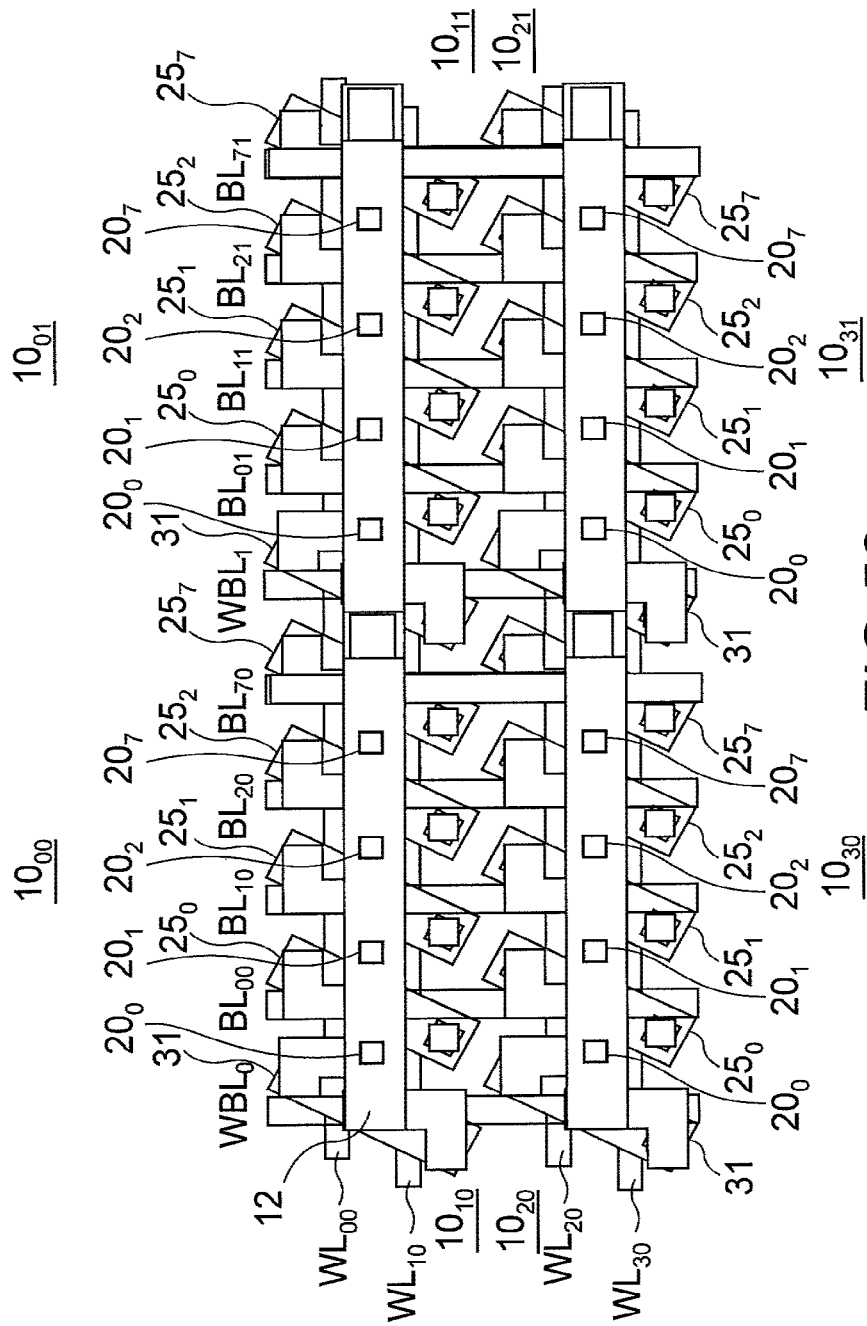

Conductive layers 12 of the memory cells $10_{10}$, $10_{11}$, $10_{30}$, and $10_{31}$ are then formed to connect to the vias 436 connecting to the selection transistors 31 and the vias 436 connecting to the source lines $SL_0$ and $SL_1$, as shown in FIG. 52. Thereafter, the memory elements of the memory cells $10_{10}$, $10_{11}$, $10_{30}$, and $10_{31}$ are formed on the conductive layers 12 of the memory cells $10_{10}$, $10_{11}$, $10_{30}$, and $10_{31}$. The conductive layers and the memory elements may be formed and processed at the same time or different times.

Figure 53:
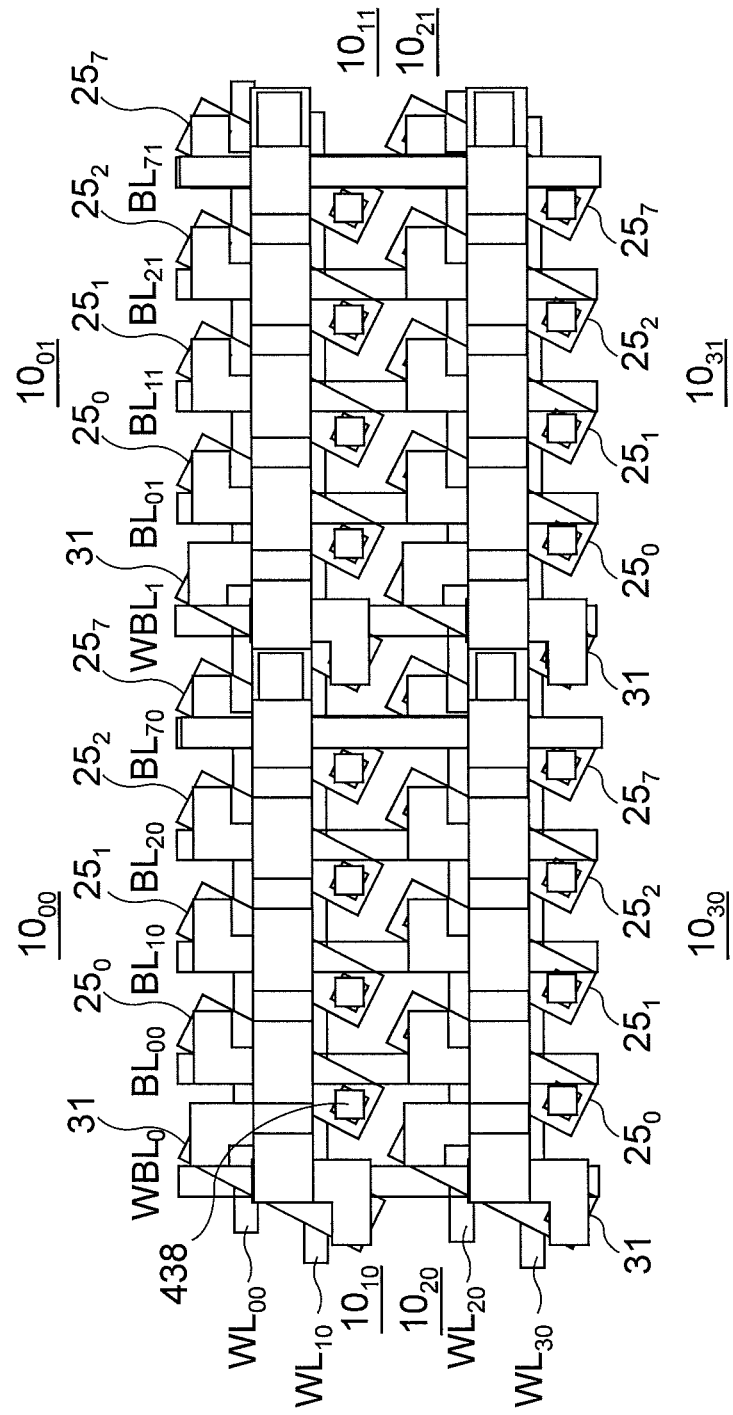

Vias 438 are then formed on the vias 436 of the selection transistors connecting to the memory elements of the memory cells $10_{10}$, $10_{11}$, $10_{30}$, and $10_{31}$, as shown in FIG. 53.

Figure 54:
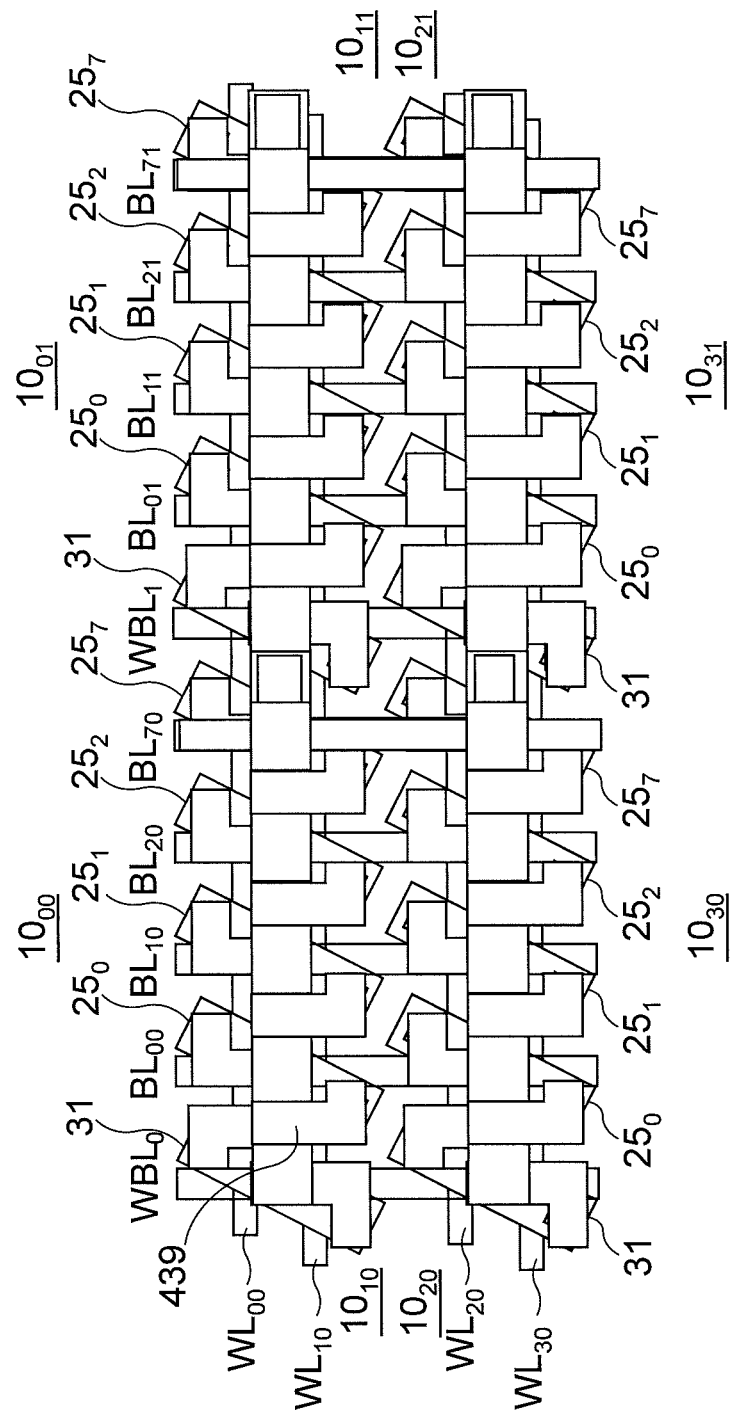

Wiring lines 439 connecting the vias 438 of the selection transistors and corresponding memory elements of the memory cells $10_{10}$, $10_{11}$, $10_{30}$, and $10_{31}$ are then formed, as shown in FIG. 54.

In all of the processes, the shapes of the metal wiring lines and vias are not limited to those illustrated in the drawings. As long as the electric connections are correct, the shapes are not limited to rectangles as shown in the drawings, but may be oval or corrugated shapes.

Figure 55:
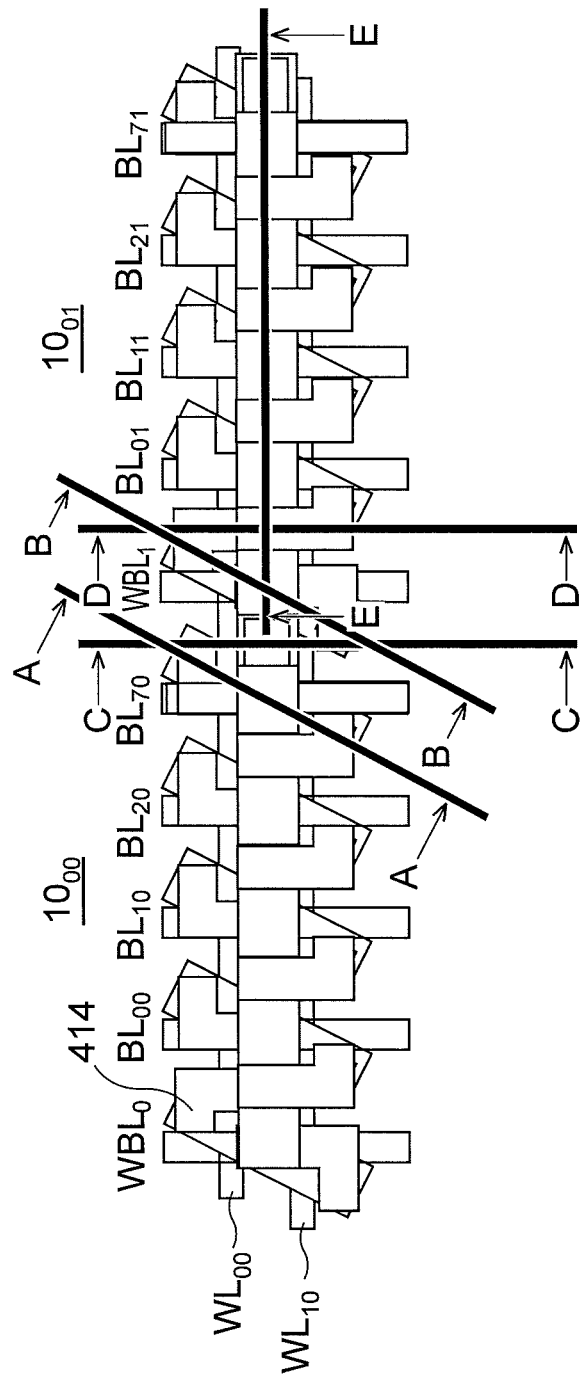
FIG. 55 is a plan view for explaining cross sections of the magnetic memory according to the second embodiment.
Figure 56A:
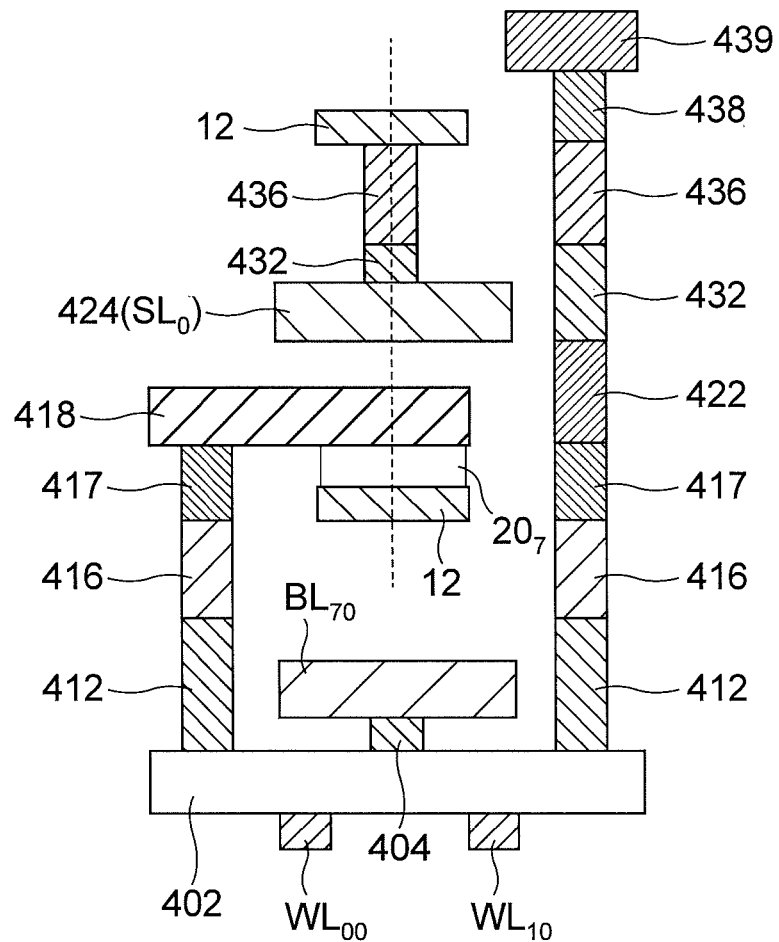
FIG. 56A is a cross-sectional view taken along line A-A in FIG. 55.
Figure 56E:
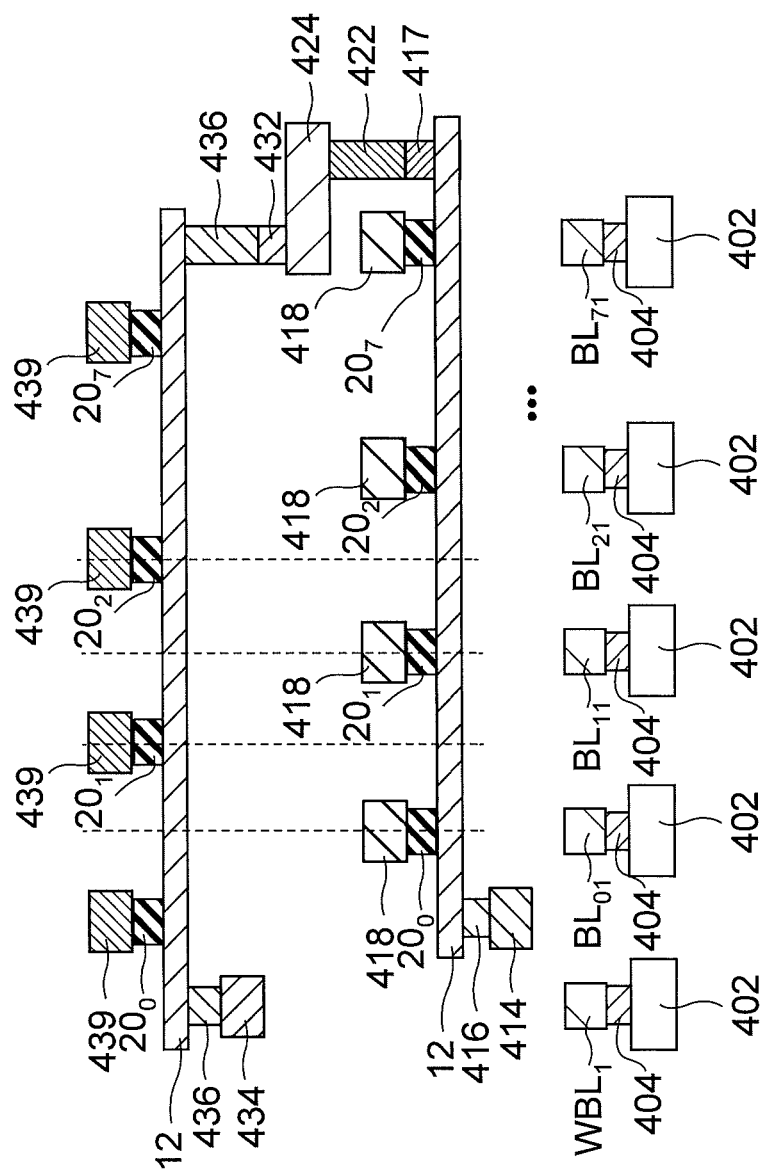
FIG. 56E is a cross-sectional view taken along line E-E in FIG. 55.

FIG. 56A is a cross-sectional view of the magnetic memory according to the second embodiment thus manufactured, taken along line A-A of FIG. 55, FIG. 56B is a cross-sectional view taken along line B-B, FIG. 56C is a cross-sectional view taken along line C-C, FIG. 56D is a cross-sectional view taken along line D-D, and FIG. 56E is a cross-sectional view taken along line E-E. The cross-sectional views show the up-and-down and left-and-right positional relationships in the layered structure, but do not define physical dimensions. In the actual manufacturing process, the shapes and the dimensions of the elements are designed in accordance with the alignment accuracy of the device or the process so as to ensure the connections of the vias and the metal wiring lines.

FIG. 56A is a cross-sectional view taken along the active area 402 of the selection transistor $25_7$ connecting to the bit line $BL_{70}$ to which the memory cells $10_{00}$ and $10_{10}$ are connected. The word lines $WL_{00}$ and $WL_{10}$ are disposed under the active area 402. The bit line $BL_{70}$ is disposed above the active area 402, and connected to the active area 402 by the via 404. The conductive layer 12 and the memory element $20_7$ of the memory cell $10_{00}$ are disposed above the bit line $BL_{70}$, the memory element $20_7$ being connected to the metal wiring line 418. The metal wiring line 418 is connected to the active area 402 by the vias 412, 416, and 417. The metal wiring line 424 to become the source line $SL_0$ is disposed above the metal wiring line 418, and connected to the conductive layer 12 of the memory cell $10_{10}$ by the vias 432 and 436. The metal wiring line 439 is disposed above the active area 402 and connected to the active area 402 by the vias 412, 416, 417, 422, 432, 436, and 438.

FIG. 56B is a cross-sectional view takes along the active area 402 of the selection transistor 31 for the memory cells $10_{01}$ and $10_{11}$. The write bit line WBL1 is disposed above the active area 402 and connected to the active area 402 by the via 404. The metal wiring line 414 is disposed above a region of the active area 402 where the word line $WL_{00}$ is disposed, and connected to the active area 402 by the via 412. The metal wiring line 434 is disposed above a region of the active area 402 where the word line $WL_{10}$ is disposed, and connected to the active area 402 by the vias 412, 416, 417, 422, and 432. The conductive layer 12 is disposed above the metal wiring line 434 and connected to the metal wiring line 434 by the via 436.

FIG. 56C is a cross-sectional view showing the connection of the conductive layer 12 and the source line in a direction parallel to the short sides of the conductive layer 12 in the memory cell $10_{00}$. The conductive layer 12 is disposed above a region between the word line $WL_{00}$ and the word line $WL_{10}$, and the metal wiring line 424 is disposed above the conductive layer 12 and connected to the conductive layer 12 by the vias 417 and 422. The metal wiring line 434 is disposed above the word line $WL_{10}$.

FIG. 56D is a cross-sectional view of the memory cells $10_{01}$ and $10_{11}$ taken in a direction parallel to the short sides of the conductive layer 12. The metal wiring line 414 is disposed above a region of the active area 402 where the word line $WL_{00}$ is disposed, and the conductive layer 12 of the memory cell $10_{01}$ is disposed above the metal wiring line 414 and connected to the metal wiring line 414 by the via 416. The metal wiring line 439 is disposed above a region of the active area 402 where the word line $WL_{10}$ is disposed, the memory element $20_0$ of the memory cell $10_{11}$ is disposed below the metal wiring line 439, and the conductive layer 12 is disposed below the memory element $20_0$.

FIG. 56E is a cross-sectional view of the memory cell $10_{01}$ and $10_{11}$ taken in a direction along the long sides of the conductive layer 12. The metal wiring line 414 is disposed above a region between the write bit line $WBL_1$ and the bit line $BL_{01}$, and the conductive layer 12 of the memory cell $10_{01}$ is disposed above the metal wiring line 414 and connected to the metal wiring line 414 by the via 416. The memory elements $20_0$ to $20_7$ are disposed on the conductive layer 12. The metal wiring line 424 is disposed above the conductive layer 12 and connected to the conductive layer 12 by the vias 417 and 422, and the conductive layer 12 of the memory cell $10_{11}$ is disposed above the metal wiring line 424 and connected to the metal wiring line 424 by the vias 432 and 436. The memory elements $20_0$ to $20_7$ are disposed on the conductive layer 12, and the metal wiring lines 439 are disposed above corresponding memory elements $20_0$ to $20_7$. The metal wiring line 434 is disposed below the conductive layer 12 and connected to the conductive layer 12 by the via 436.

As can be understood from the above cross-sectional views, the memory elements are disposed on the conductive layers 12. The memory elements of the memory cells $10_{00}$ and $10_{01}$ are on the same line extending in the row direction (horizontal direction), and the memory elements of the memory cells $10_{01}$ and $10_{11}$ are not on the same line but shifted alternately to the left and to the right in the column direction (vertical direction). In other words, the memory elements of the memory cells $10_{00}$ and $10_{01}$ and the memory elements of the memory cells $10_{01}$ and $10_{11}$ are on the same line when viewed from above, but shifted by half a pitch when viewed from the front. As described in the descriptions of the first embodiment, the distance between adjacent memory elements is preferably set as large as possible. Thus, the diagonal arrangement of the memory elements, instead of the grid arrangement, is preferable from the viewpoint of the interference between memory elements.

As described above, according to the second embodiment, a magnetic memory with memory cells with memory cells arranged with a high density may be provided, like the first embodiment.

Third Embodiment

A magnetic memory according to a third embodiment will be described with reference to FIGS. 57 to 60. The magnetic memory according to the third embodiment includes at least four memory cells. Two of the four memory cells have the structure identical to that of the memory cell according to the second embodiment, or the memory cell shown in FIG. 1. The other two memory cells have a structure in which one of the source and the drain of the transistor for selecting the conductive layer 12 is connected to the second terminal 12b of the conductive layer 12, the other is connected to the source line SL, and the gate (control terminal) is connected to the word line. In each of the four memory cells, memory elements $20_0$ to $20_N$ are disposed on the conductive layer 12. Each memory element $20_j$ (j=0, . . . , N) has a structure that is the same as the structure of the memory element 20 shown in FIG. 2. Therefore, in each memory element $20_j$ (j= 0, . . . , N), the reference layer 23 is disposed above the conductive layer 12, the storage layer 21 is disposed between the conductive layer 12 and the reference layer 23, and the nonmagnetic layer 22 is disposed between the storage layer 21 and the reference layer 23.

Figure 57:
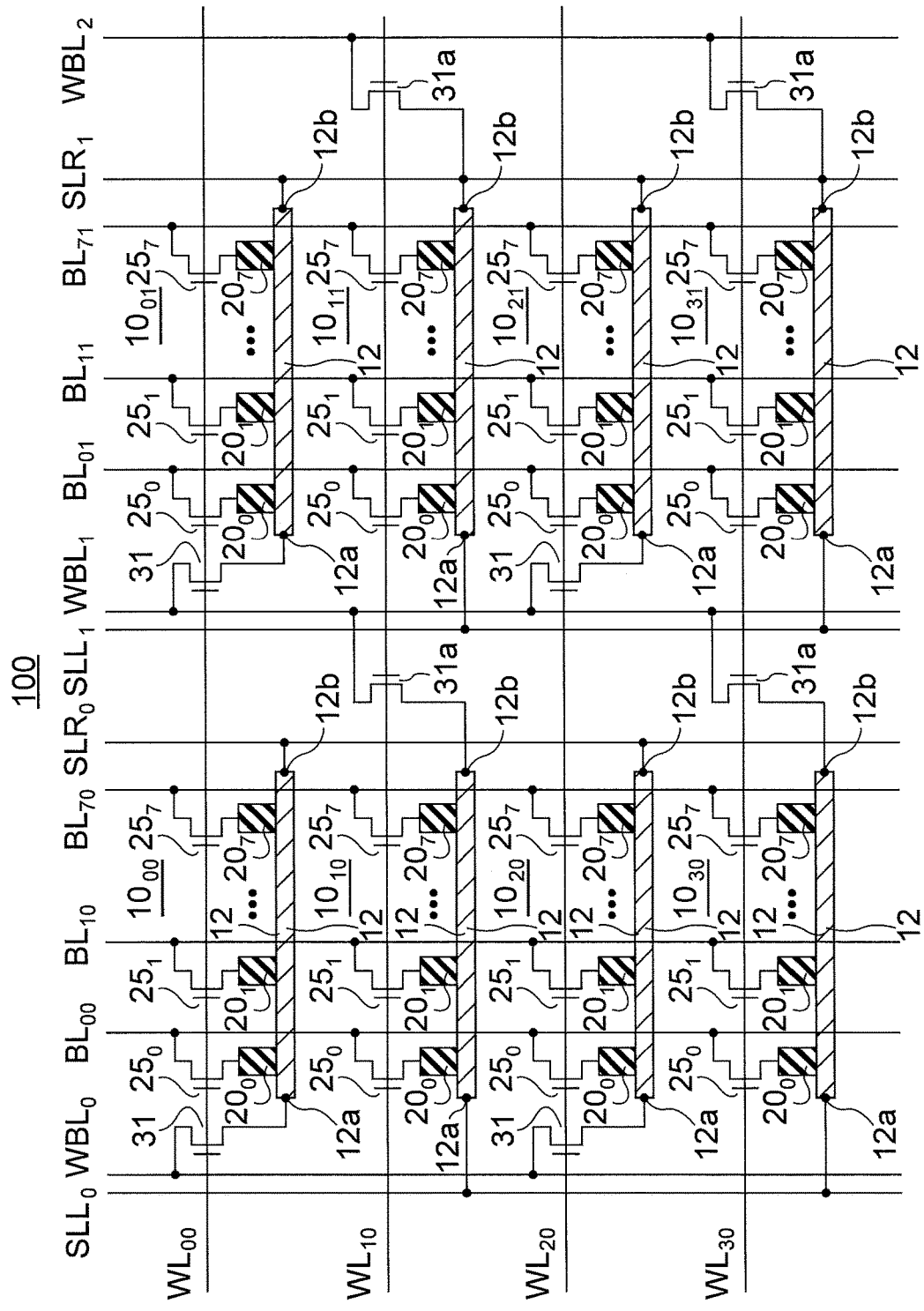
FIG. 57 is a circuit diagram illustrating a magnetic memory according to a third embodiment.

FIG. 57 illustrates a magnetic memory according to the third embodiment including a memory cell array 100 with memory cells $10_{00}$ to $10_{31}$ arranged in a 4×2 array form. Each of the memory cells $10_{00}$, $10_{01}$, $10_{20}$, and $10_{21}$ has a structure obtained by replacing the N (N-bit) memory elements $20_0$ to $20_N$ of the memory cell 10 shown in FIG. 1 with eight (eight-bit) memory elements $20_0$ to $20_7$. Each of the memory cells $10_{10}$, $10_{11}$, $10_{30}$, and $10_{31}$ has a structure obtained by replacing the N (N-bit) memory elements $20_0$ to $20_N$ of the memory cell 10 shown in FIG. 1 with eight (eight-bit) memory elements $20_0$ to $20_7$ and replacing the selection transistor 31 with a selection transistor 31a.

In the memory cell $10_{i0}$ (i=0, . . . , 3), one of the source and the drain of the selection transistor $25_j$ (j=0, . . . , 7) is electrically connected to the corresponding memory element $25_j$, the other is electrically connected to the bit line $BL_{j0}$, and the gate is electrically connected to the word line $WL_{i0}$.

In the memory cell $10_{i1}$ (i=0, . . . , 3), one of the source and the drain of the selection transistor $25_j$ (j=0, . . . , 7) is electrically connected to the corresponding memory element $25_j$, the other is electrically connected to the bit line $BL_{j1}$, and the gate is electrically connected to the word line $WL_{i0}$.

In the memory cell $10_{i0}$ (i=0, 2), one of the source and the drain of the selection transistor 31 is electrically connected to the first terminal 12a of the corresponding conductive layer 12, the other is electrically connected to the write bit line $WBL_0$, and the gate is electrically connected to the word line $WL_{i0}$. The second terminal 12b of the conductive layer 12 is electrically connected to the source line $SLR_0$.

In the memory cell $10_{i1}$ (i=0, 2), one of the source and the drain of the selection transistor 31 is electrically connected to the first terminal 12a of the corresponding conductive layer 12, the other is electrically connected to the write bit line $WBL_1$, and the gate is electrically connected to the word line $WL_{i0}$. The second terminal 12b of the conductive layer 12 is electrically connected to the source line $SLR_1$.

In the memory cell $10_{i0}$ (i=1, 3), one of the source and the drain of the selection transistor 31a is electrically connected to the second terminal 12b of the conductive layer 12, the other is electrically connected to the write bit line $WBL_1$, and the gate is electrically connected to the word line $WL_{i0}$. The first terminal 12a of the conductive layer 12 is electrically connected to the source line $SLL_0$.

In the memory cell $10_{i1}$ (i=1, 3), one of the source and the drain of the selection transistor $31a$ is electrically connected to the second terminal $12b$ of the corresponding conductive layer 12, the other is electrically connected to the write bit line $WBL_2$, and the gate is electrically connected to the word line $WL_{i0}$. The first terminal $12a$ of the conductive layer 12 is electrically connected to the source line $SLL_1$.

Thus, the four memory cells that are adjacent in the left-and-right and top-and-bottom directions, for example the memory cells $10_{00}$, $10_{01}$, $10_{10}$, and $10_{11}$, of the magnetic memory shown in FIG. 57 form an array as a unit. The memory cells adjacent to each other in the top-and-bottom direction share a bit line. However, the write bit line and the source line are shared by ever other memory cells arranged in the top-and-bottom direction. Each memory cell is connected to a different word line. The memory cells adjacent to each other in the left-and-right direction are connected to different bit lines, write bit lines, and source lines. However, the memory cells that are diagonally adjacent to each other in the same unit, for example the memory cells $10_{10}$ and the $10_{01}$ share a write word line. The memory cells arranged in the same row share a word line. The area in which the word line is shared by the memory cells may be shortened or elongated in consideration of the specification of the memory chip. The memory cells that share a word line may be arranged in a layered structure. The memory cell array 100 shown in FIG. 57 includes the memory cells arranged in the 4×2 array. However, it may be an m×n memory cell array where m and n are even numbers that are 2 or more.

If each of the memory cells $10_{00}$, $10_{01}$, $10_{20}$, and $10_{21}$ shown in FIG. 57 is the memory cell 10A shown in FIG. 3, each of the selection transistors 32 is electrically connected to the second terminal $12b$ of the corresponding conductive layer 12 and the corresponding source line $SLR_0$ or $SLR_1$. If each of the memory cells $10_{10}$, $10_{11}$, $10_{30}$, and $10_{31}$ is the memory cell 10A shown in FIG. 3, each of the selection transistors 31 is electrically connected to the first terminal $12a$ of the corresponding conductive layer 12 and the corresponding source line $SLL_0$ or $SLL_1$, and each of the selection transistors 32 shown in FIG. 3 is replaced by the selection transistor $31a$ shown in FIG. 57.

Figure 58:
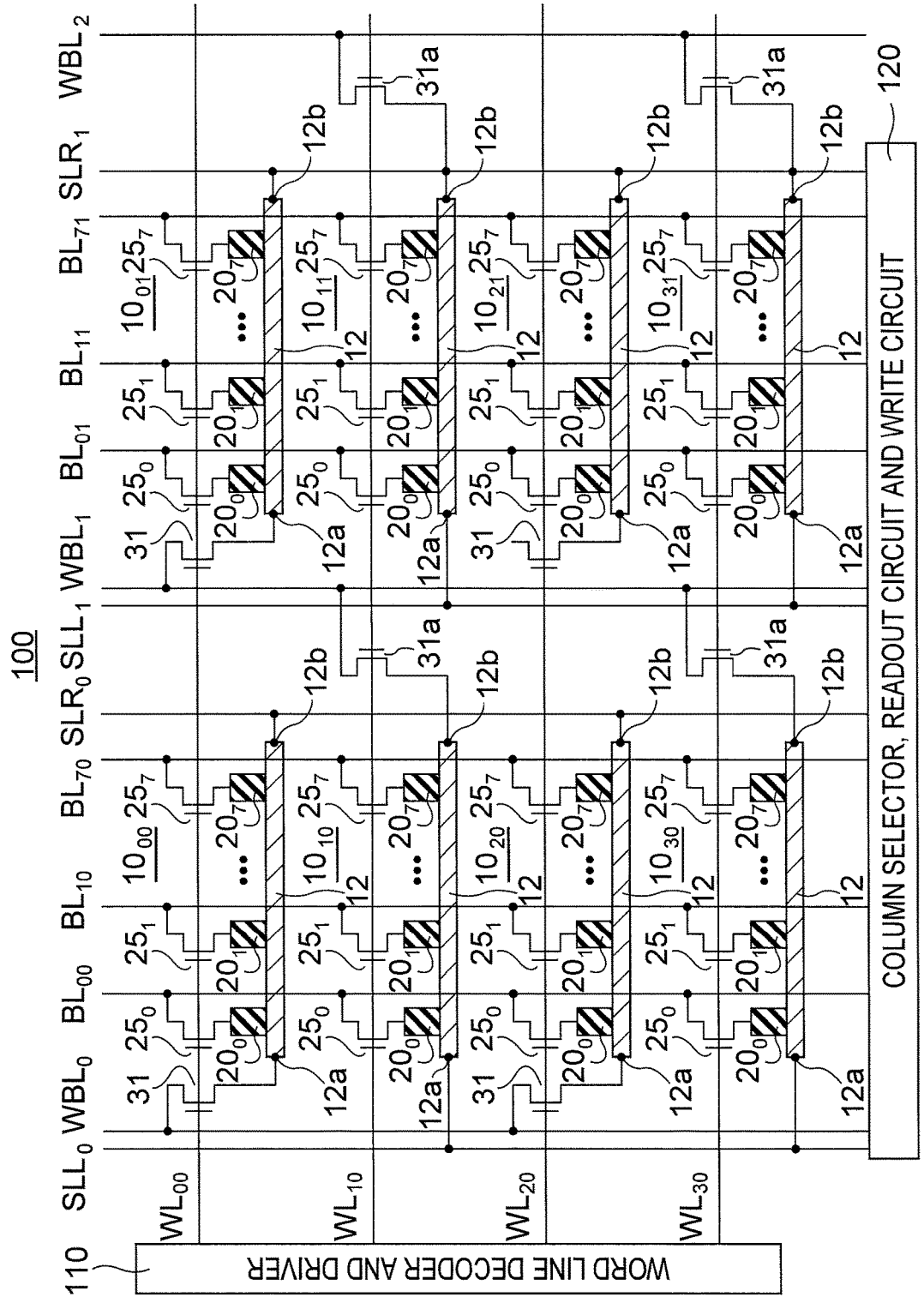
FIG. 58 is a circuit diagram illustrating the magnetic memory according to the third embodiment including a memory cell array and peripheral circuits.

FIG. 58 shows a magnetic memory including the memory cell array 100 shown in FIG. 57 and peripheral circuits. The magnetic memory shown in FIG. 58 includes the memory cell array 100 shown in FIG. 57, a word line decoder and driver 110, and a column selector, readout circuit and write circuit 120.

The word lines $WL_{00}$, $WL_{10}$, $WL_{20}$, and $WL_{30}$ are connected to the word line decoder and driver 110, the bit lines $BL_{00}$ to $BL_{71}$, the write bit lines $WBL_0$ and $WBL_1$, and the source lines $SLL_0$, $SLR_0$, $SLL_1$, and $SLR_1$ are connected to the column selector, readout circuit and write circuit 120. The write operation and the read operation which are described in the descriptions of the first embodiment are performed by using the word line decoder and driver 110 and the column selector, readout circuit and write circuit 120.

In the magnetic memory according to the third embodiment shown in FIG. 57, the memory elements that are adjacent to each other in the top-and-bottom direction in the memory cells that are adjacent to each other in the top-and-bottom direction share a bit line. The memory elements that are adjacent to each other in the top-and-bottom direction do not share a write bit line WBL and a source line. These wiring lines are shared by memory elements that are alternately arranged in the top-and-bottom direction in the drawing. The wiring lines are not shared by the memory cells that are arranged in the top-and-bottom direction in the drawing.

The bit lines, the write bit lines, and the source lines are not shared by the memory cells that are arranged in the left-and-right direction. However, the memory cells that are diagonally arranged share a write bit line. The memory elements that are arranged in the left-and-right direction share a word line. The area in which the word line is shared by the memory cells may be shortened or elongated in consideration of the specification of the memory chip. The memory cells that share a word line may be arranged in a layered structure.

With such a circuit configuration, the layout of the memory cells may be symmetrically formed except for the vias extending in the vertical direction, which will be described later. Therefore, the imbalance in a parasitic component in the memory elements may be reduced.

(Three-Dimensional Structure)

Figure 59:
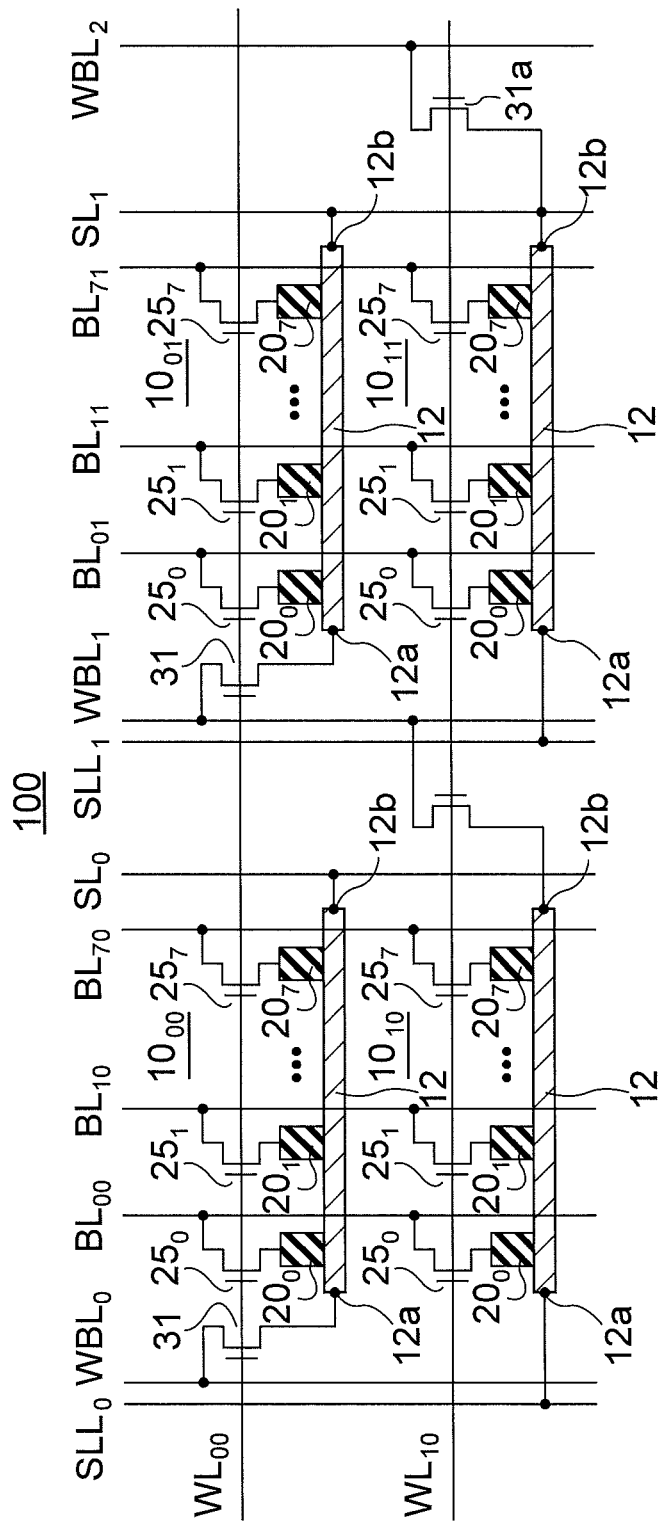
FIG. 59 is a circuit diagram illustrating the magnetic memory according to the third embodiment.
Figure 60:
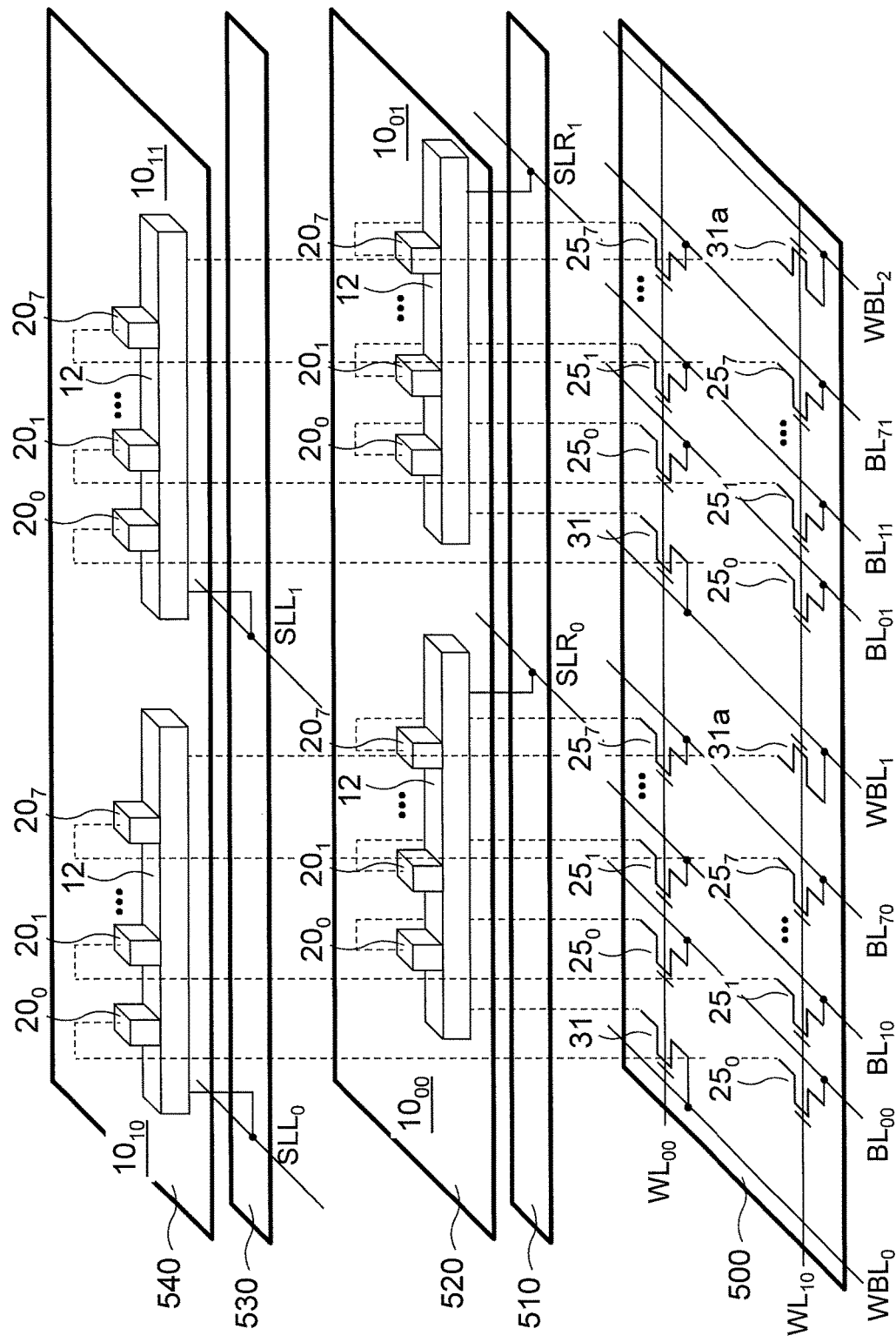
FIG. 60 is a diagram illustrating a three-dimensional structure of the magnetic memory according to the third embodiment.

FIG. 60 illustrates a three-dimensional structure of a magnetic memory according to the third embodiment including a memory cell 100 shown in FIG. 59 having a 2×2 array. As can be understood from FIG. 60, memory cells $10_{00}$, $10_{01}$, $10_{10}$, and $10_{11}$ of the magnetic memory are arranged in first to fifth levels 500, 510, 520, 530, and 540, and each memory cell includes eight memory elements (magnetoresistive elements) $20_0$ to $20_7$ arranged on a conductive layer 12.

The first level 500 includes selection transistors 31 and $31a$ for selecting a conductive layer, selection transistors $25_0$ to $25_7$ for selecting memory elements of the memory cells $10_{00}$, $10_{01}$, $10_{10}$, and $10_{11}$, write bit lines $WBL_0$ and $WBL_1$, and bit lines $BL_{00}$ to $BL_{71}$.

The second level 510 includes vias and wiring lines connecting to the first level 500, and source lines $SLR_0$ and $SLR_1$.

The third level 520 includes vias and wiring lines connecting to the second level 510, and the conductive layers 12 and the memory elements $20_0$ to $20_7$ of the memory cells $10_{00}$ and $10_{01}$.

The fourth level 530 includes vias and wiring lines connecting to the third level 520, and source lines $SLL_0$ and $SLL_1$.

The fifth level 540 includes vias and wiring lines connecting to the fourth level 530, and the conductive layers 12 and the memory elements $20_0$ to $20_7$ of the memory cells $10_{10}$ and $10_{11}$.

Like the second embodiment, the conductive layers 12 are disposed under the memory elements in the third embodiment. Therefore, the terminals of the reference layer side, which connect to the selection transistors for selecting the memory elements, are on the top side of the memory elements. Therefore, a space is needed for disposing the wiring lines. However, the third level 520 does not have a space in which the conductive layers 12 and the memory elements $20_0$ to $20_7$ of the memory cells $10_{00}$, $10_{01}$, $10_{10}$, and $10_{11}$ are arranged in a line.

Therefore, in this embodiment, the third level 520 includes the conductive layers 12 and the memory elements $20_0$ to $20_7$ of the memory cells $10_{00}$ and $10_{01}$, and the fifth level 540 includes the conductive layers 12 and the memory elements $20_0$ to $20_7$ of the memory cells $10_{10}$ and $10_{11}$. This allows the conductive layers 12 and the memory elements $20_0$ to $20_7$ to have the same sizes as those in the first embodiment.

The second level 510 in which the source line $SLR_0$ and the source line $SLR_1$ are disposed may be located between the first level 500 and the third level 520. The second level 510 in which the source line $SLR_0$ and the source line $SLR_1$ are disposed may be located between the third level 520 and the fifth level 540. The fourth level 530 in which the source line $SLL_0$ and the source line $SLL_1$ are disposed may be located between the third level 520 and the fifth level 540. The fourth level 530 in which the source lines $SLL_0$ and the source line $SLL_1$ are disposed may be located above the fifth level 540.

(Manufacturing Method)

A method of manufacturing a magnetic memory having the above-described three-dimensional structure will be described with reference to FIGS. 61 to 75. The magnetic memory manufactured by this method includes the memory cell array 100 shown in FIG. 5, including the memory cells $10_{00}$ to $10_{31}$ arranged in a 4×2 array.

Figure 61:
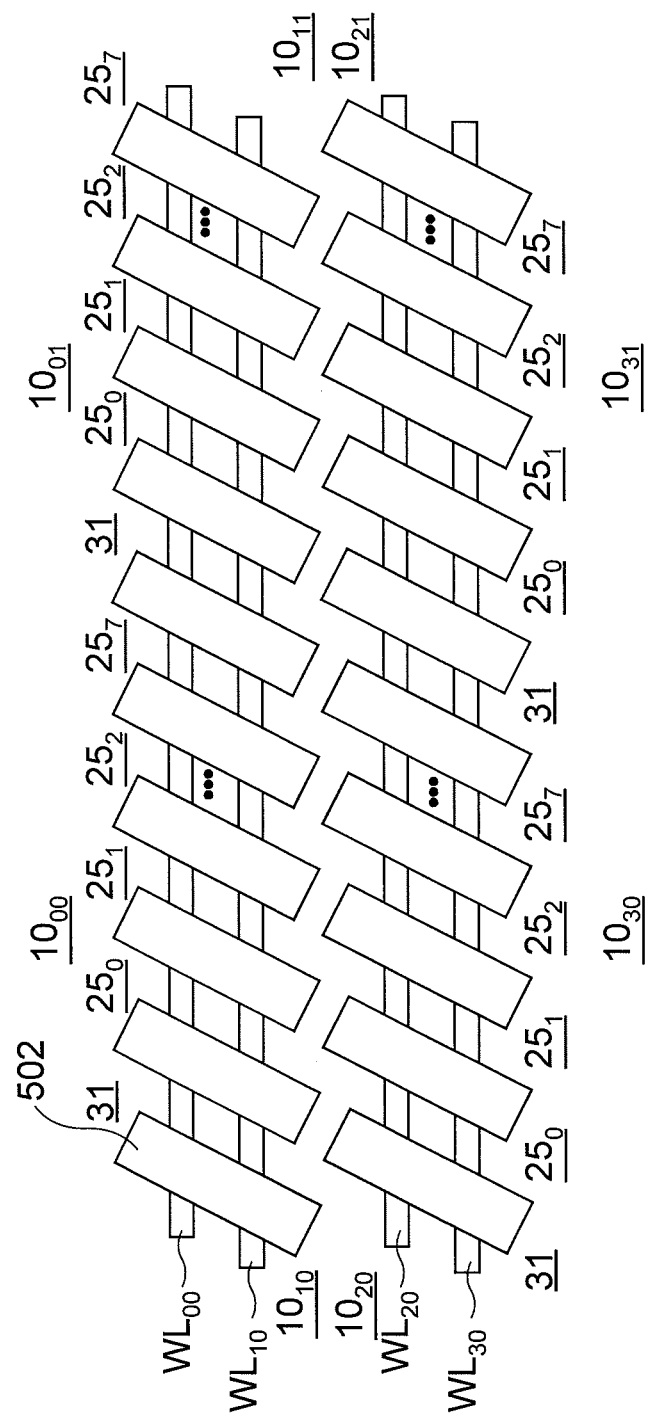
FIGS. 61 to 76 are plan views showing a process for manufacturing the magnetic memory according to the third embodiment.
Figure 62:
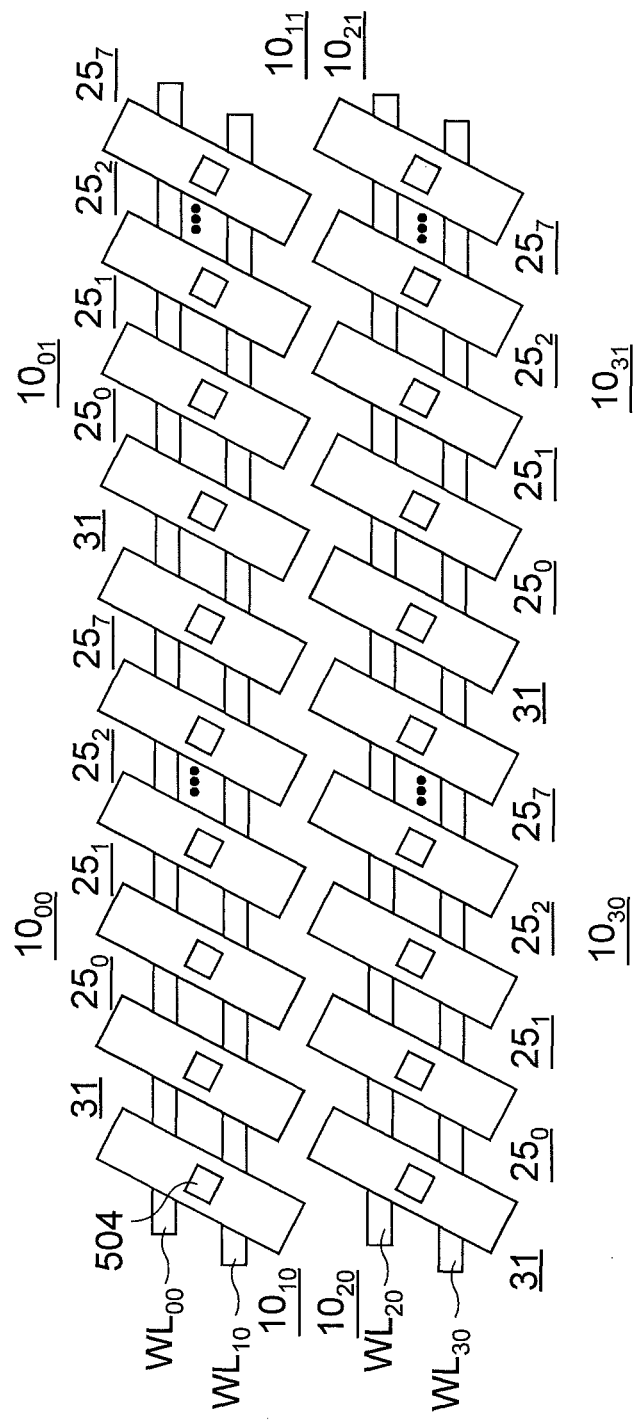
Figure 63:
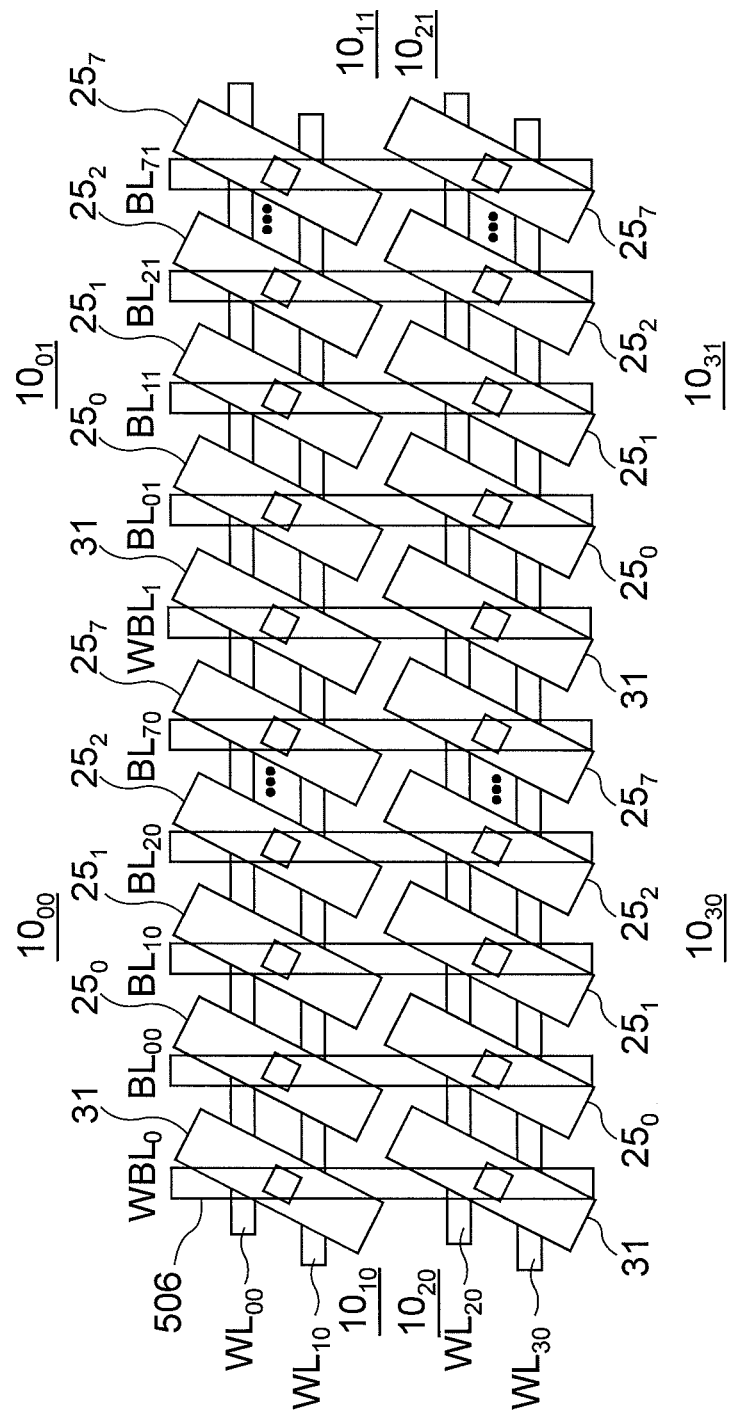

FIGS. 61 to 63 illustrate a process for forming the first level 500. In the process for forming the first level 500, embedded word lines $WL_{00}$ to $WL_{30}$ are formed, and active areas 502 serving as device portions of planar transistors are then formed (FIG. 61). The active areas 502 have the same size, and arranged with the same intervals in the top and bottom direction, and the left and right direction. This is important for processing minute devices with a good yield. However, there is a case where required transistor characteristics differ between the selection transistors 31 for selecting the conductive layers and the selection transistors $25_0$ to $25_7$ for selecting the memory elements. In such a case, the transistors may be formed in a different manner such as with a different doping concentration.

FIG. 62 shows that a via 504 is formed on the common drain of each transistor in the process for forming the first level 500.

FIG. 63 shows that metal wiring lines 506 to become the bit lines $BL_{00}$ to $BL_{17}$ and the write bit lines $WBL_0$ and $WBL_1$ are formed and connected to the corresponding vias 504. The transistors connecting to the write bit lines $WBL_0$ and $WBL_1$ are the selection transistors 31 for selecting the conductive layers, and the transistors connecting to the bit lines $BL_{ij}$ (i=0, 1, j=0, ..., 7) are the selection transistors $25_j$. In FIG. 63, each bit line $BL_{ij}$ (i=0, 1, j=0, ..., 7) has a rectangular shape. However, this is simply an example, and it may be bent to have, for example, a corrugated shape.

Figure 64:
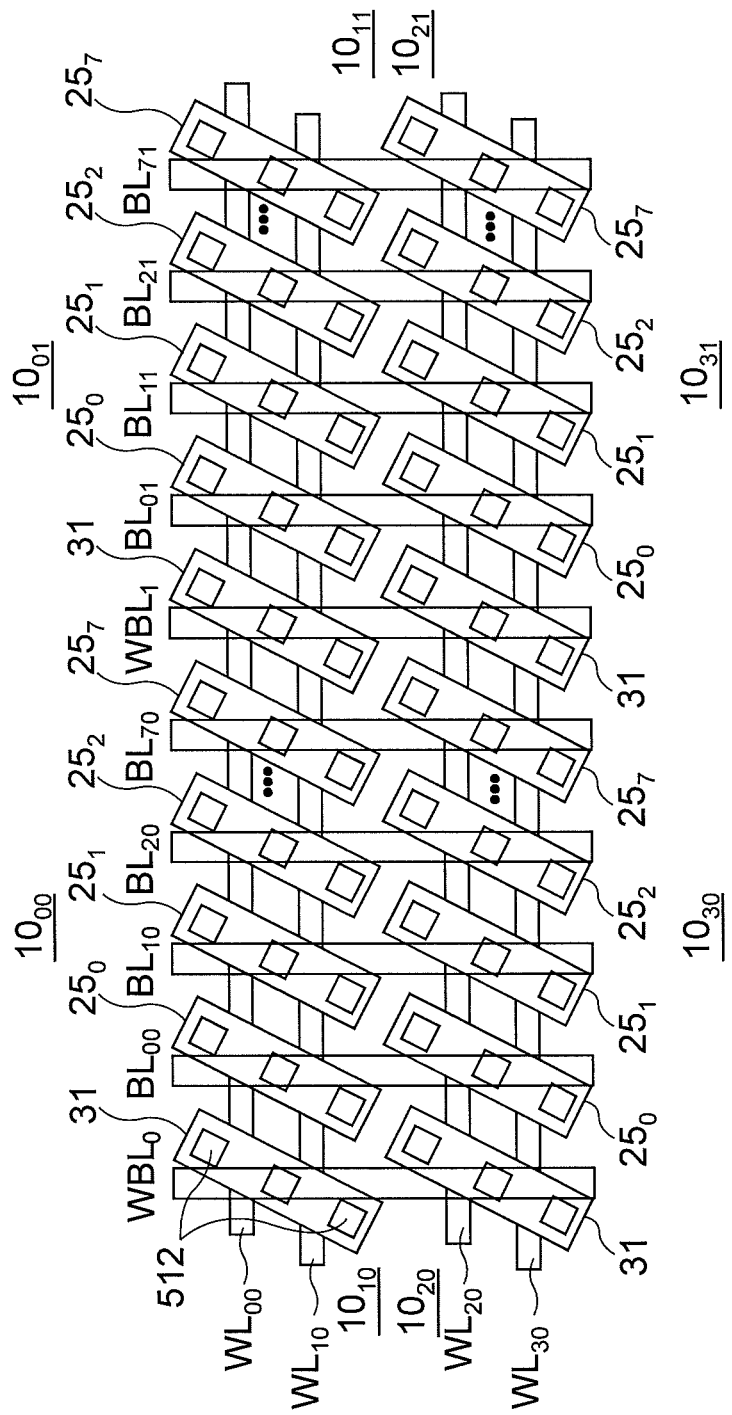

A process for forming the second level 510 will then be described with reference to FIGS. 64 and 65. In the process for forming the second level 510, vias 512 are formed on the sources of the transistors as shown in FIG. 64.

Figure 65:
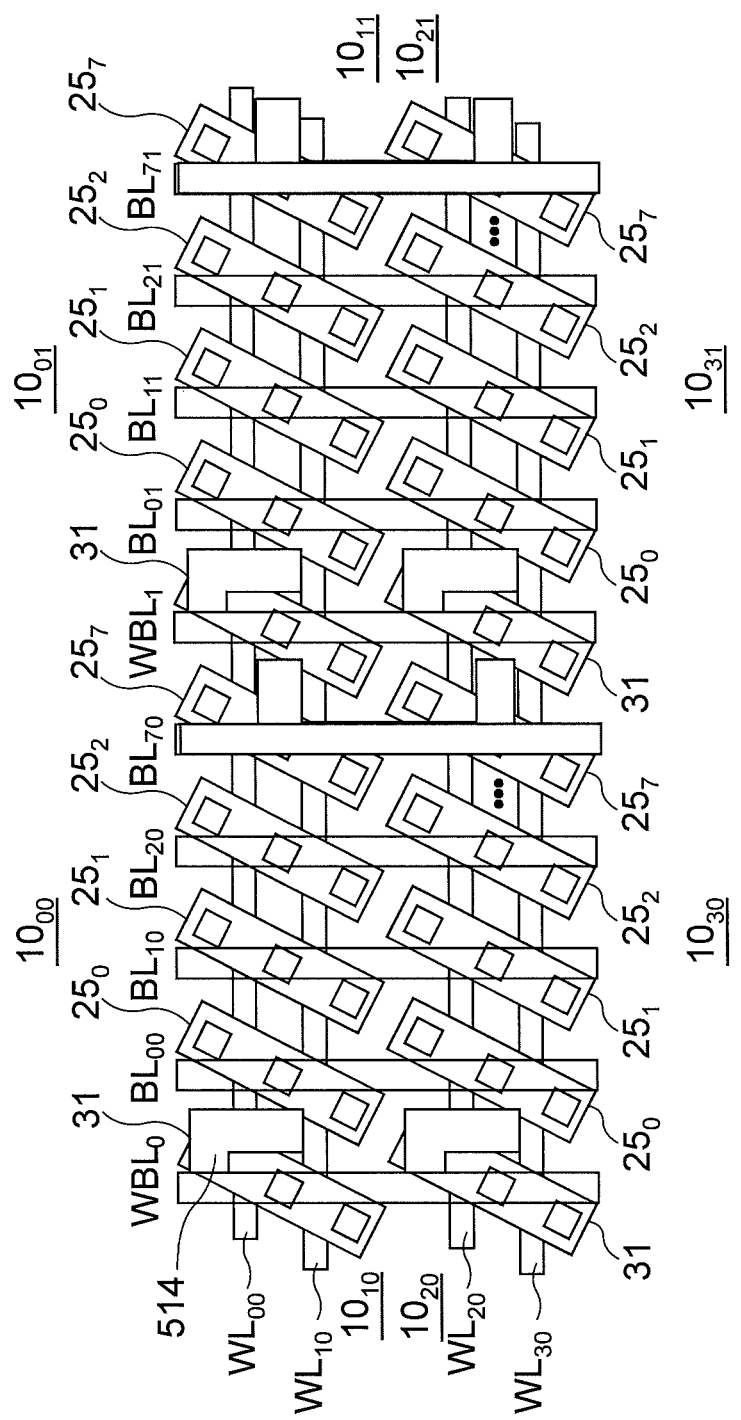

A metal wiring line 514 is then disposed to connect to the via 512 of the source of each of the selection transistors $25_0$ to $25_7$, as shown in FIG. 65. The metal wiring line 514 will become a wiring line connecting to the conductive layer 12 that will be formed later and each of the selection transistors $25_0$ to $25_7$. The metal wiring lines 514 will also become the source line $SLR_0$ and $SLR_1$. Although each of the metal wiring lines 514 to become the source lines $SLR_0$ and $SLR_1$ has a rectangular shape in FIG. 65, this is simply an example, and it may be bent to have a corrugated shape to ensure electrical insulation with respect to the vias 512.

Figure 66:
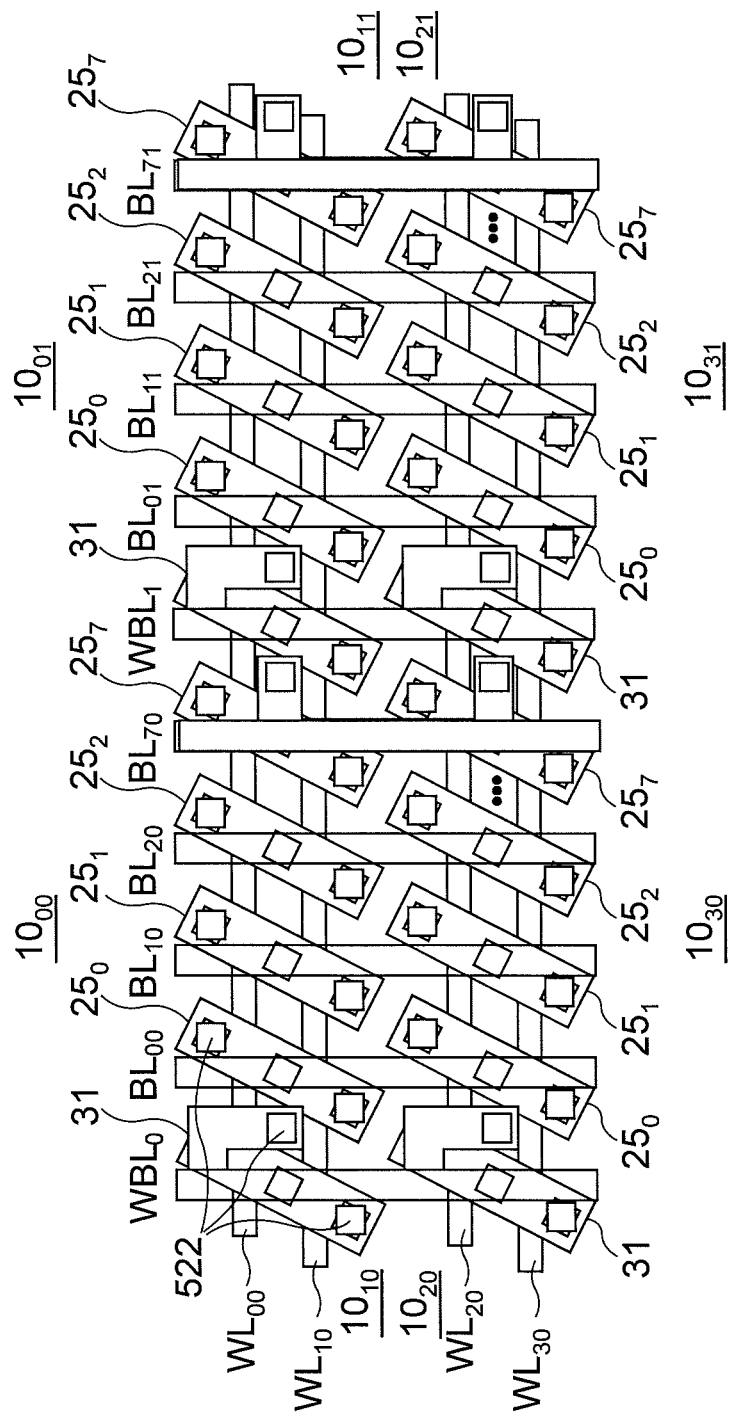

FIGS. 66 to 69 illustrate a process for forming the third level 520. In the process for forming the third level 520, vias 522 are formed, as shown in FIG. 66, on the vias 512 connecting to the selection transistors $25_0$ to $25_7$ and on the metal wiring lines 514 formed in the process for forming the second level 510 shown in FIG. 65.

Figure 67:
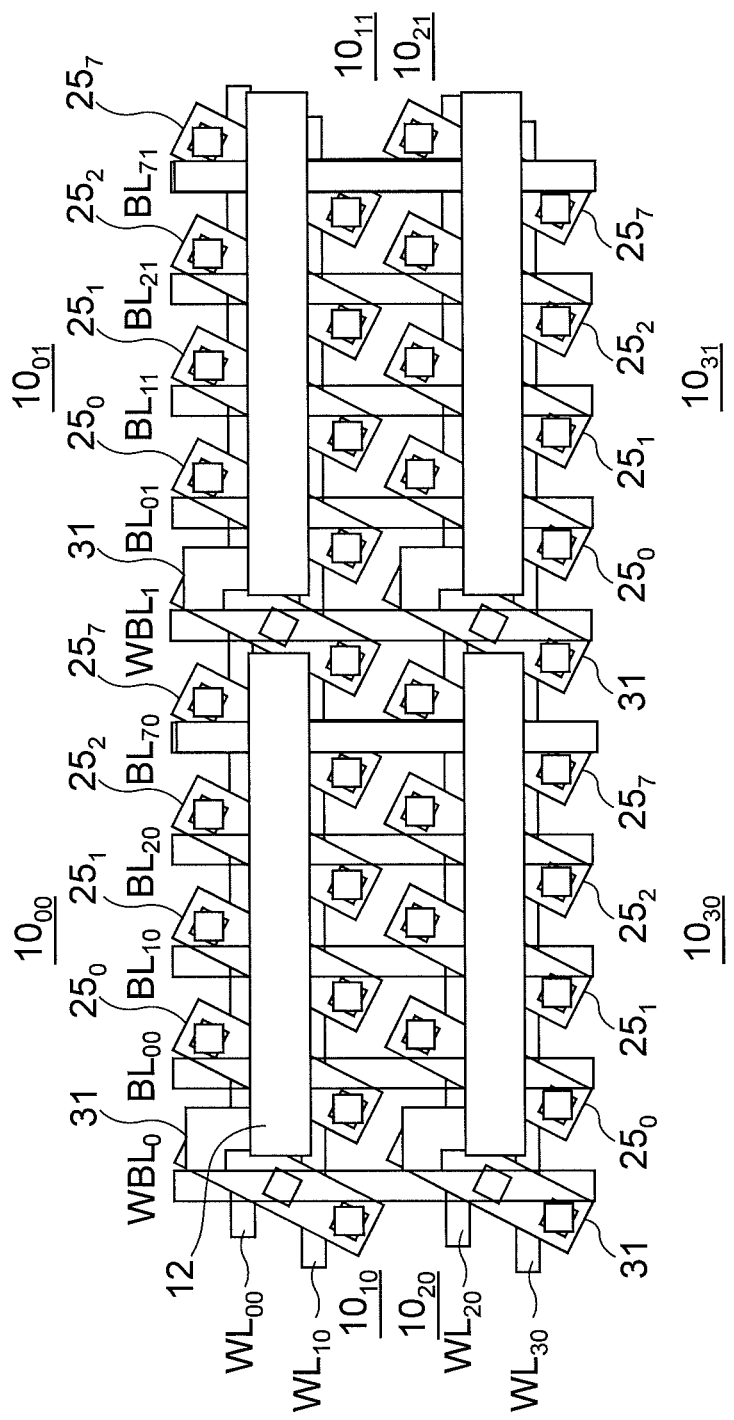

Subsequently, the conductive layers 12 are formed so as to connect to the vias 522 connecting to the selection transistors $25_0$ to $25_7$, as shown in FIG. 67. The memory elements $20_0$ to $20_7$ of the memory cells $10_{00}$, $10_{01}$, $10_{20}$, and $10_{21}$ are then formed on the conductive layers 12. The conductive layers and the memory elements may be formed and processed at the same time or different times.

Figure 68:
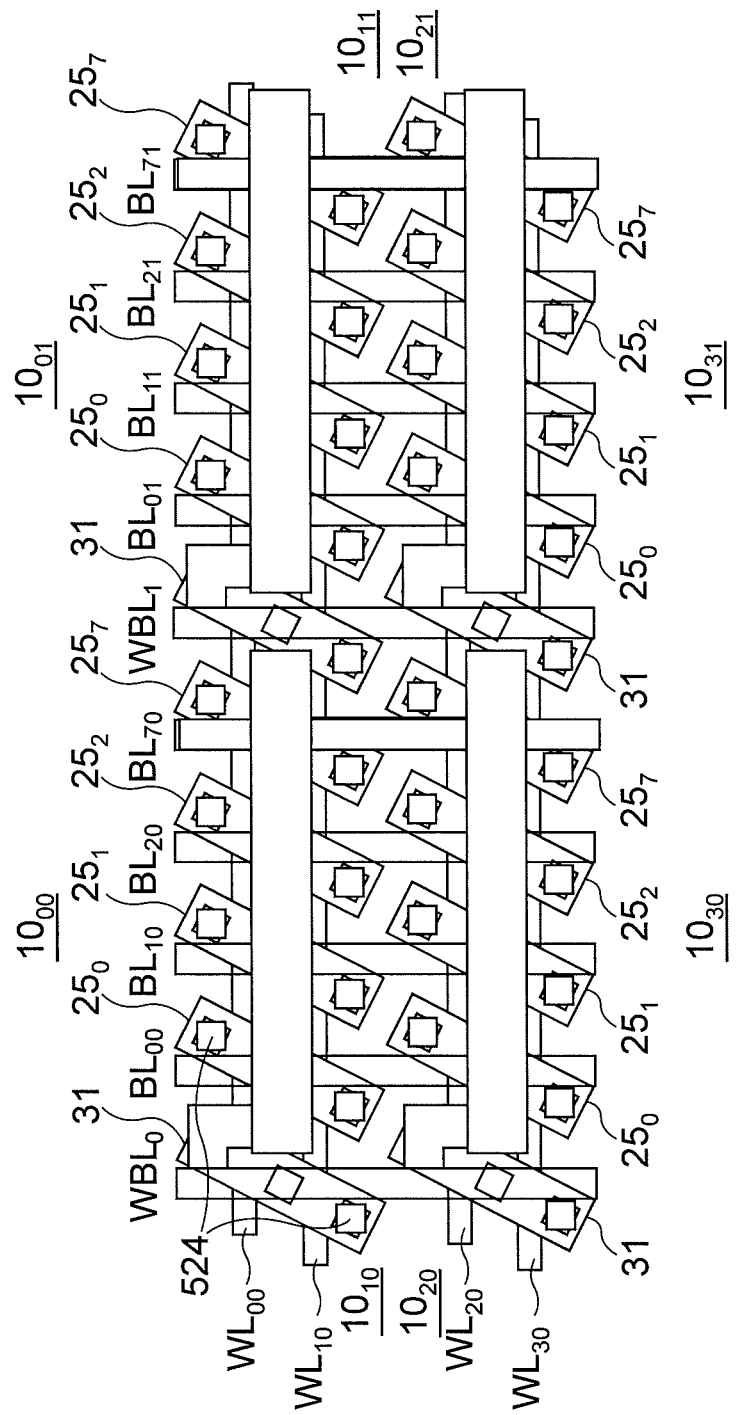

Next, as shown in FIG. 68, vias 524 are formed on the vias 522 shown in FIG. 66, the vias 524 being formed on the conductive layers 12 and the selection transistors $25_0$ to $25_7$.

Figure 69:
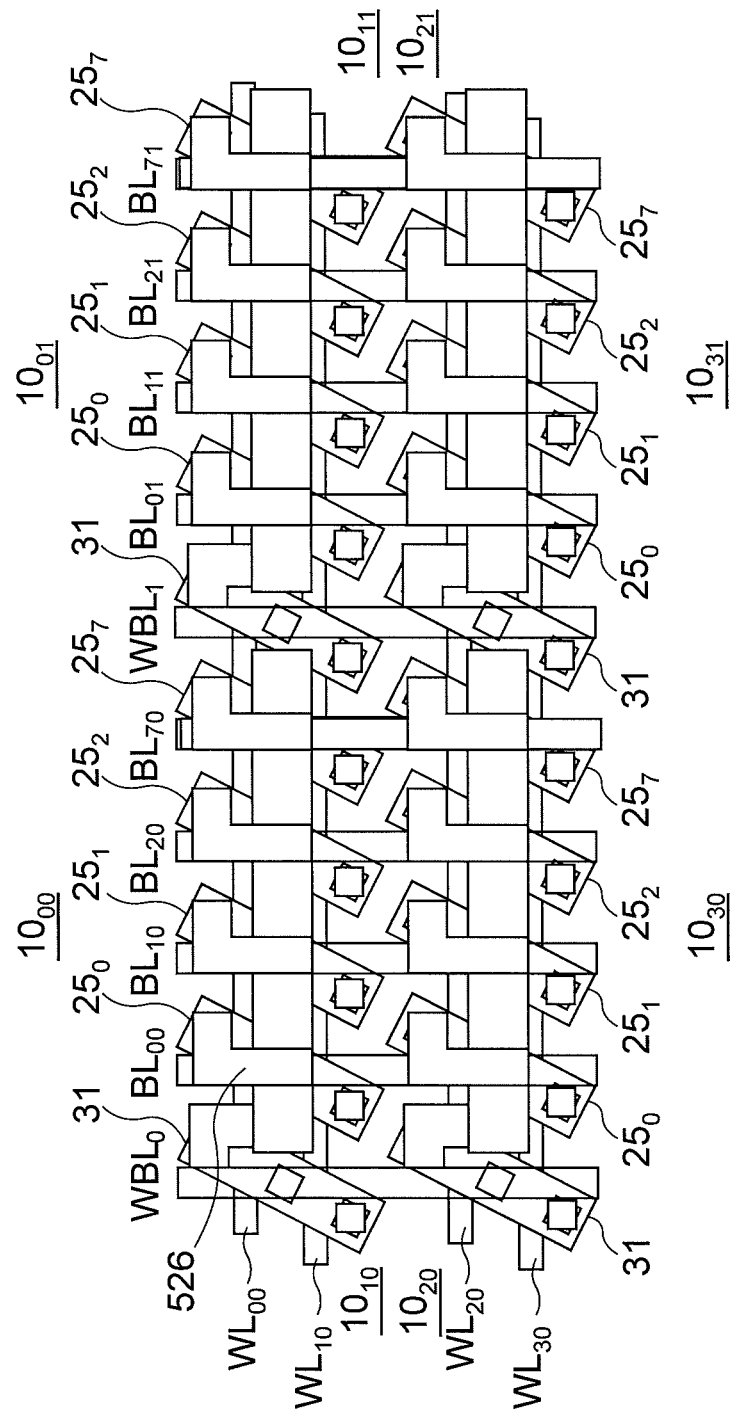

Subsequently, as shown in FIG. 69, metal wiring lines 526 are formed to connect the memory elements $20_0$ to $20_7$ of the memory cells $10_{00}$, $10_{01}$, $10_{20}$, and $10_{21}$ and the vias 524 connecting to the selection transistors $25_0$ to $20_7$.

Figure 70:
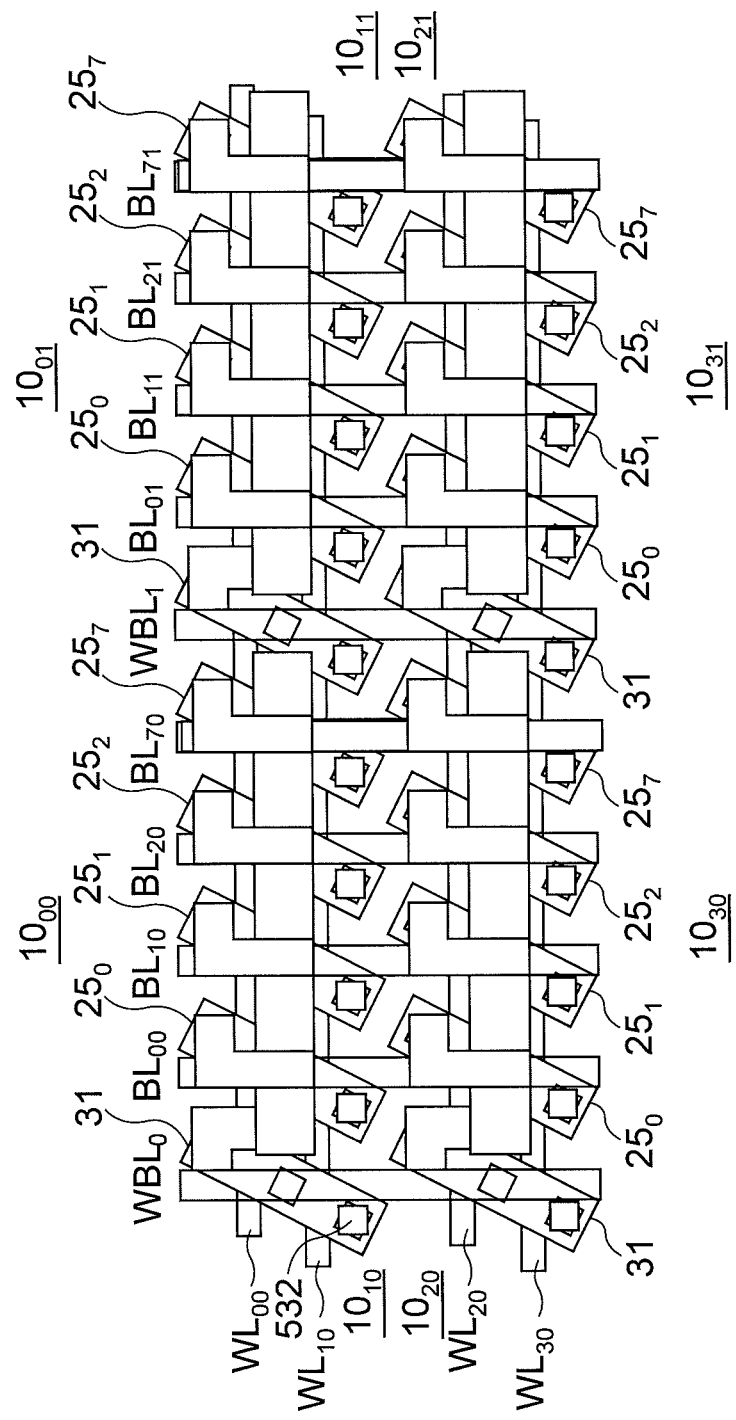
Figure 71:
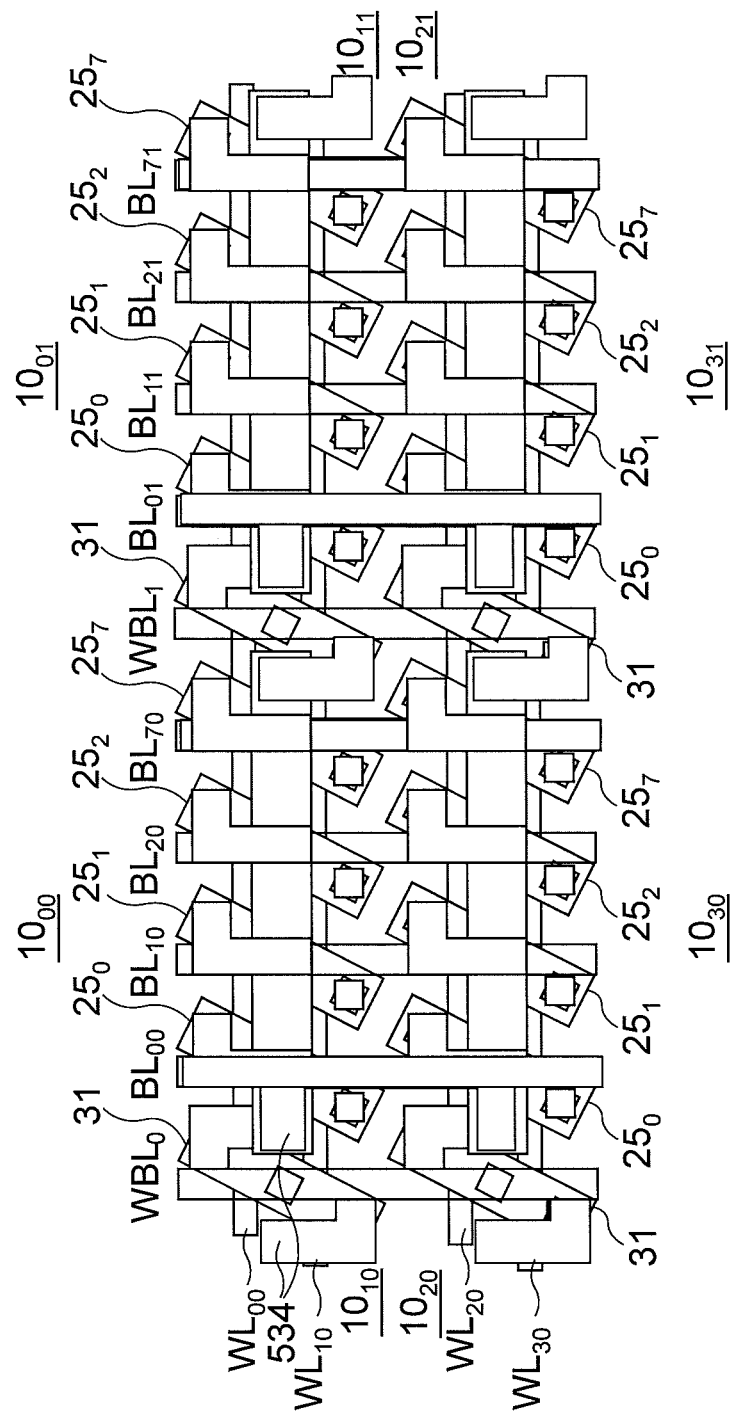

FIGS. 70 and 71 illustrate a process for forming the fourth level 530. First, vias 532 are formed on the vias 524 on the conductive layers 12 and the selection transistors $25_0$ to $25_7$ as shown in FIG. 70.

Thereafter, metal wiring lines 534 connecting to the vias 532 connecting to the sources of the selection transistors 31 are formed as shown in FIG. 71. The wiring lines 534 will also connect the conductive layers 12 and the selection transistors $25_0$ to $25_7$ of the memory cells $10_{10}$, $10_{11}$, $10_{30}$, and $10_{31}$, which will be formed later. At the same time, the metal wiring lines 534 to become the source lines $SLL_0$ and $SLL_1$ are formed. Although each of the metal wiring lines 534 to become the source line $SLL_0$ or $SLL_1$ has a rectangular shape in FIG. 71, this is simply an example, and it may be bent to have a corrugated shape to ensure electrical insulation with respect to the vias 532.

Figure 72:
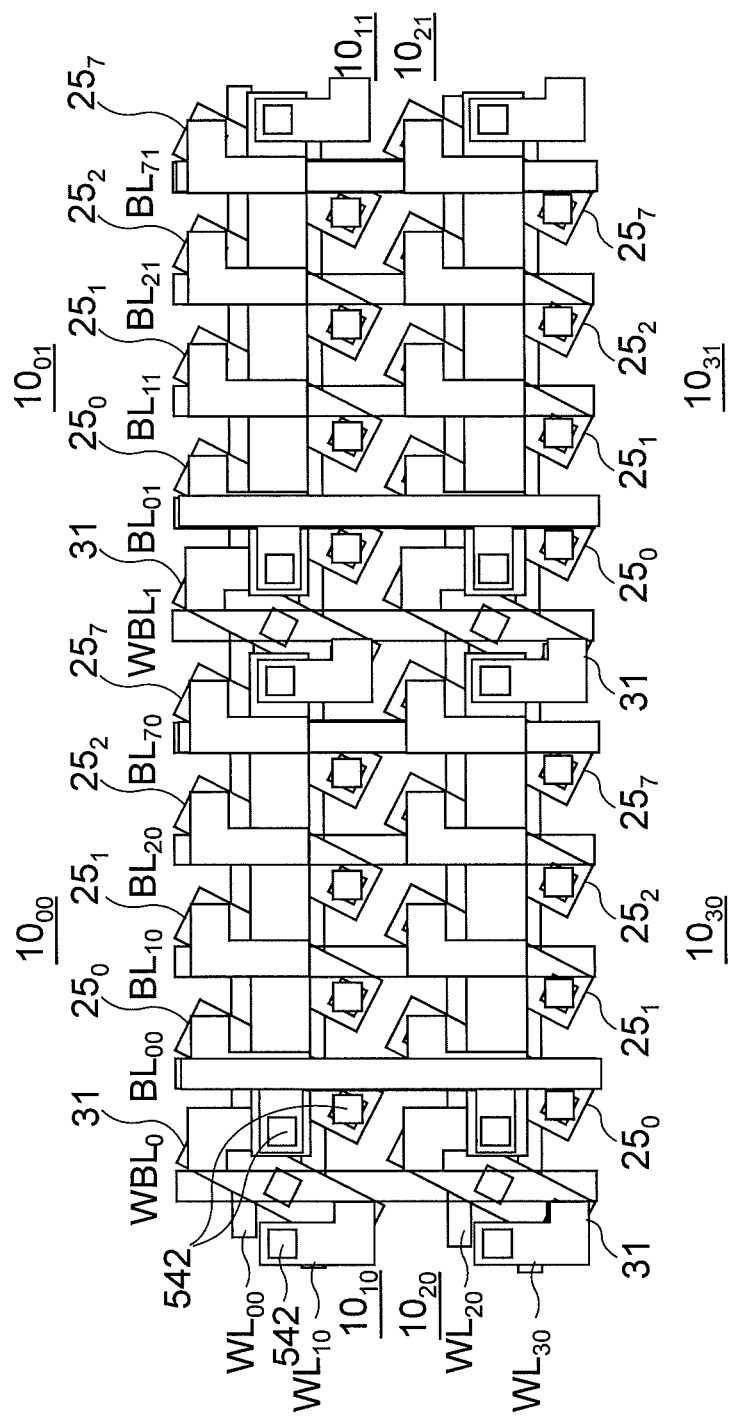
Figure 73:
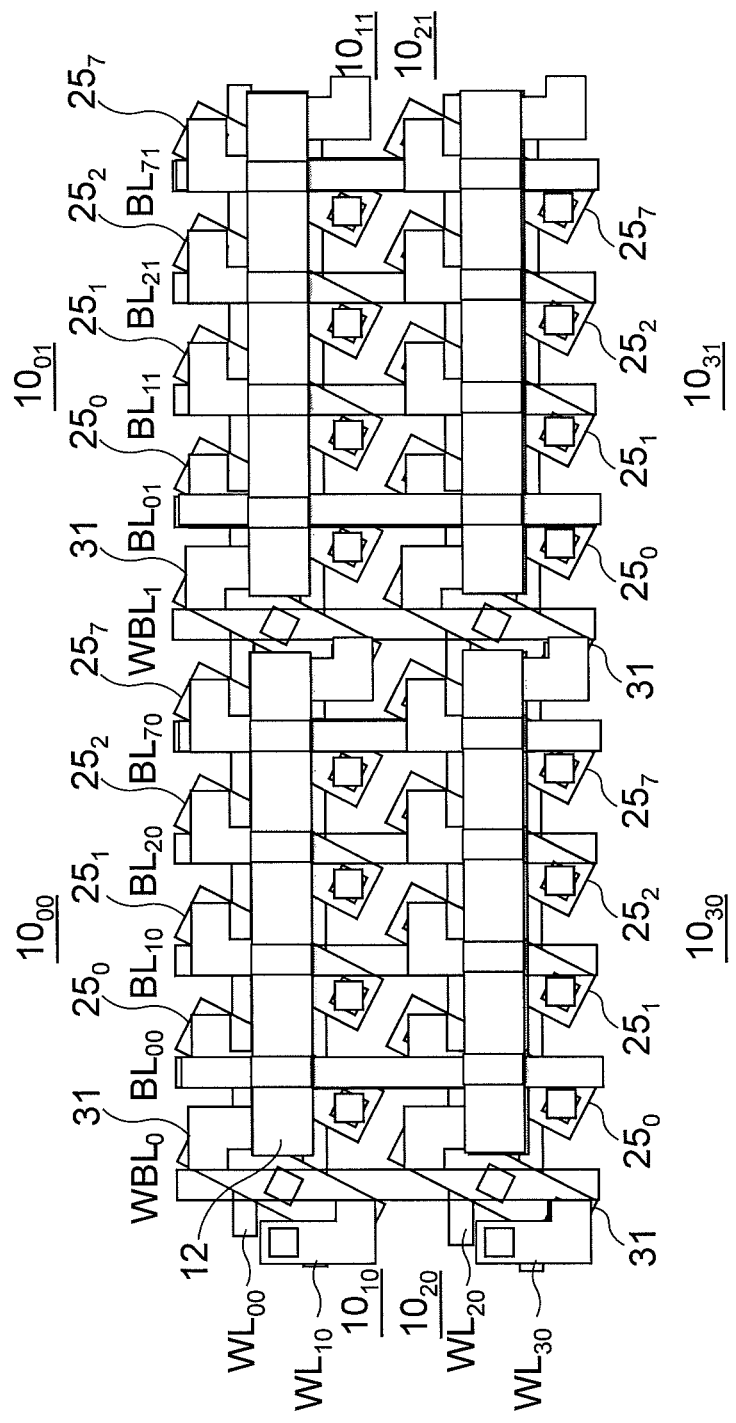

FIGS. 72 and 73 illustrate a process for forming the fifth level 540. In the process for forming the fifth level 540, as shown in FIG. 72, vias 542 are formed on the metal wiring lines 534 formed in the process for forming the fourth level 530 shown in FIG. 71 and the vias 532 connecting to the selection transistor $25_0$ to $20_7$ connecting to the memory elements of the memory cells $10_{10}$, $10_{11}$, $10_{30}$, and $10_{31}$.

Thereafter, as shown in FIG. 73, the conductive layers 12 of the memory cells $10_{10}$, $10_{11}$, $10_{30}$, and $10_{31}$ are formed to connect to the vias 542 connecting to the selection transistors 31 and the vias 542 connecting to the source lines 534. The memory elements of the memory cells $10_{10}$, $10_{11}$, $10_{30}$, and $10_{31}$ are formed on the conductive layers 12. The conductive layers and the memory elements may be formed and processed at the same time or different times.

Figure 74:
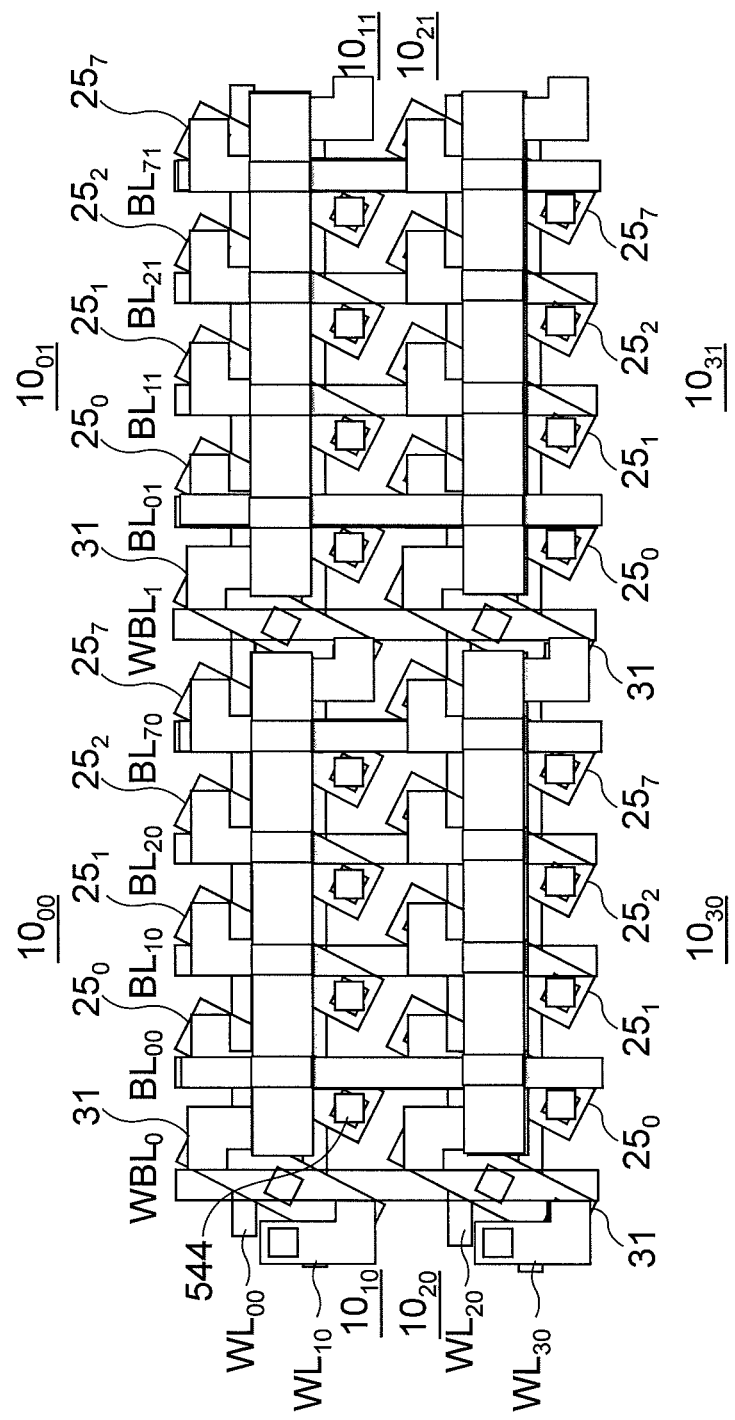

Thereafter, as shown in FIG. 74, vias 544 are formed on the vias 542 connecting to the selection transistors $25_0$ to $25_7$ connecting to the memory elements of the memory cells $10_{10}$, $10_{11}$, $10_{30}$, and $10_{31}$.

Figure 75:
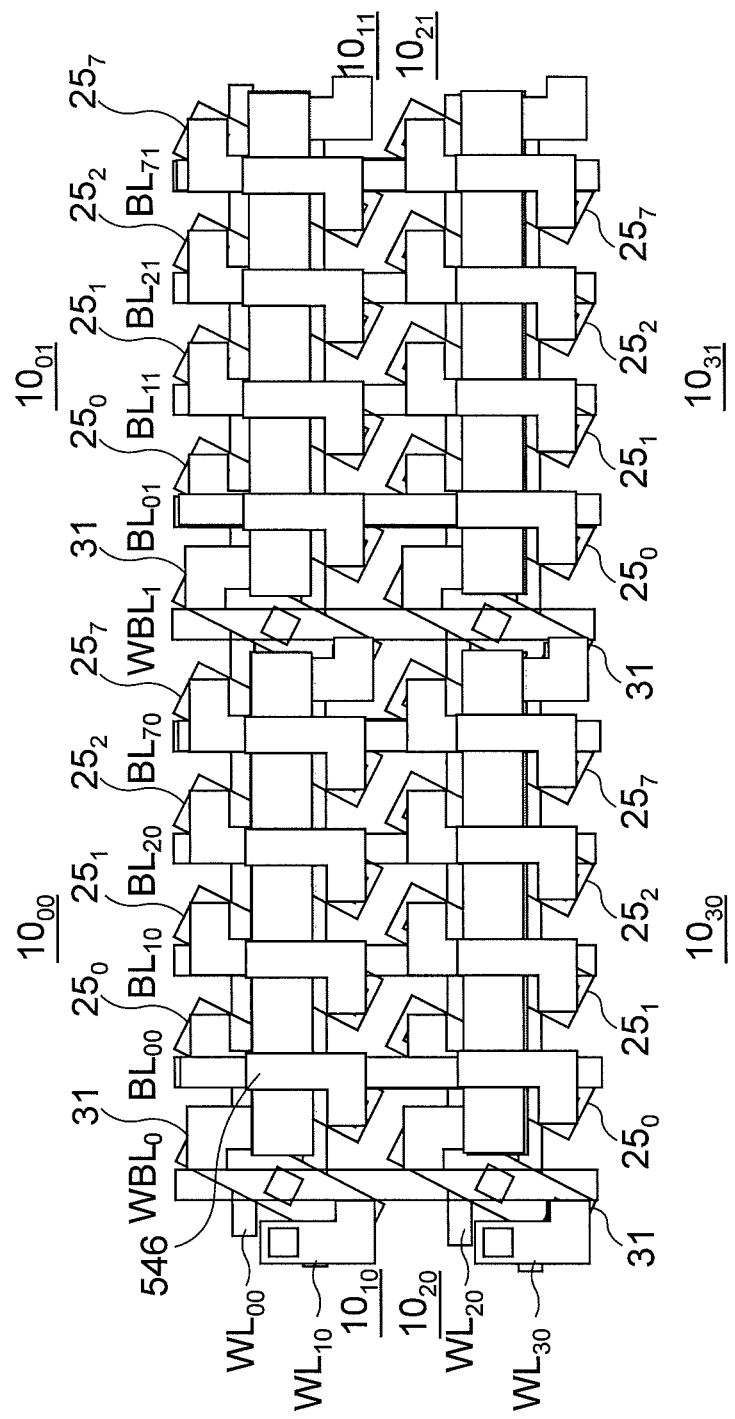

Subsequently, as shown in FIG. 75, metal wiring lines 546 connecting the vias 544 connecting to the selection transistors $25_0$ to $25_7$ and the memory elements of the memory cells $10_{10}$, $10_{11}$, $10_{30}$, and $10_{31}$ are formed.

In the second embodiment, the vias extending in the vertical direction and connecting the selection transistors for the memory elements and the memory elements, the connections of the selection transistors and the conductive layers, and the connections of the conductive layers and the source lines are asymmetric among the memory cells. In the third embodiment, however, the layout of the memory cells is symmetric except for the vias extending in the vertical direction. Therefore, the imbalance in a parasitic component in the memory elements may be reduced.

In all of the processes of the method according to the third embodiment, the shapes of the metal wiring lines and vias are not limited to those illustrated in the drawings. As long as the electric connections are correct, the shapes are not limited to rectangles as shown in the drawings, but may be oval or corrugated shapes.

Figure 76:
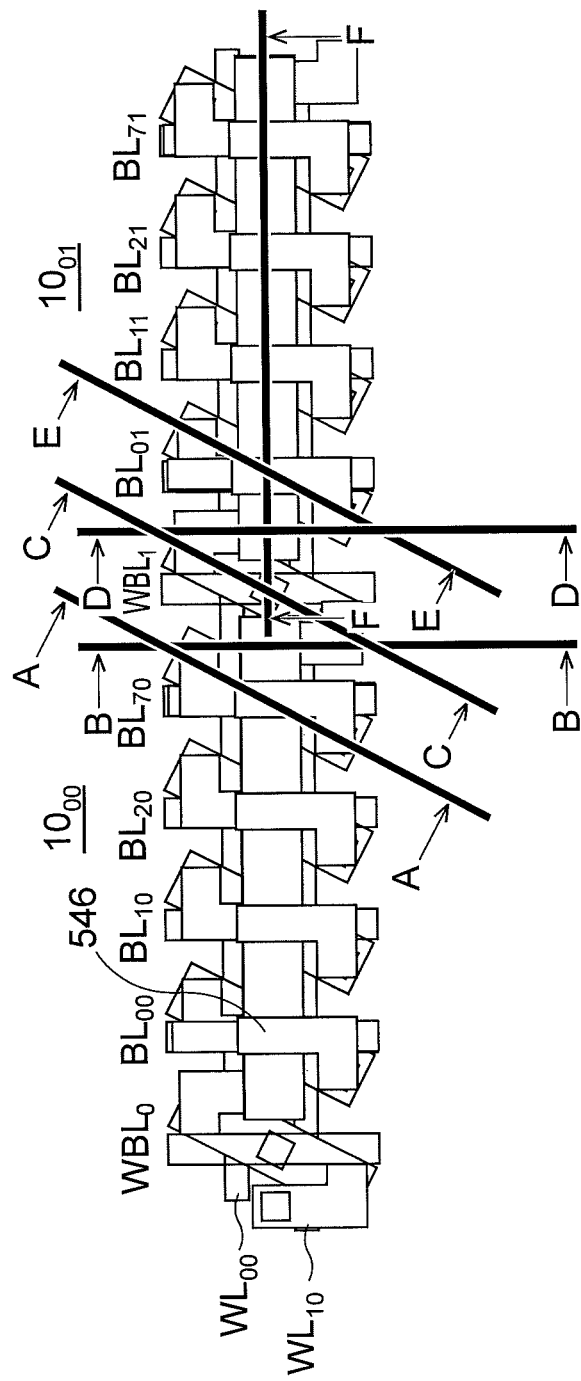
Figure 77E:
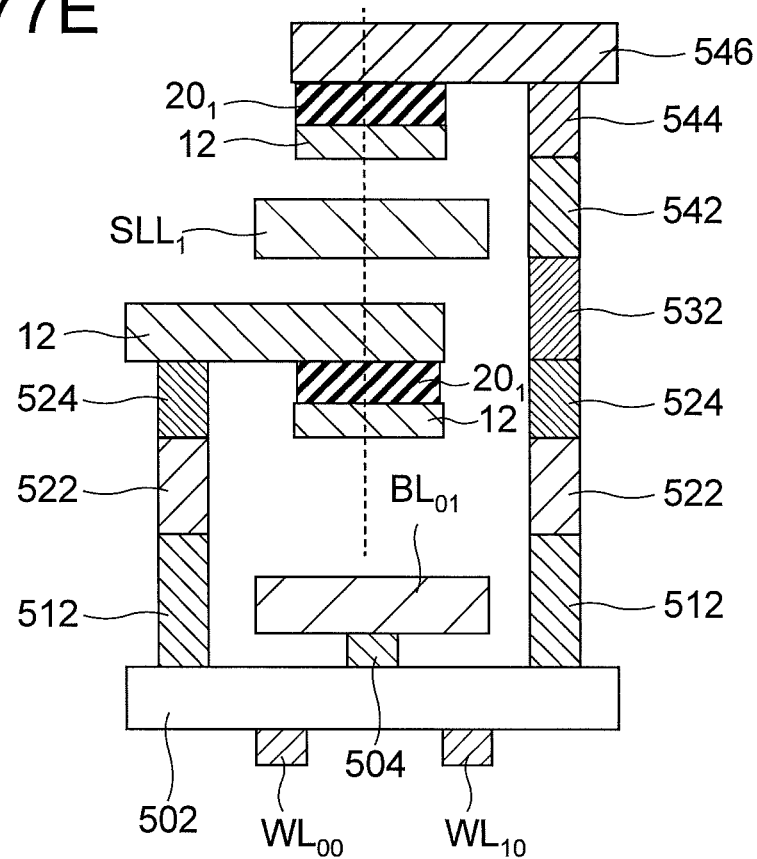
FIG. 77E is a cross-sectional view taken along line E-E in FIG. 76.
Figure 77F:
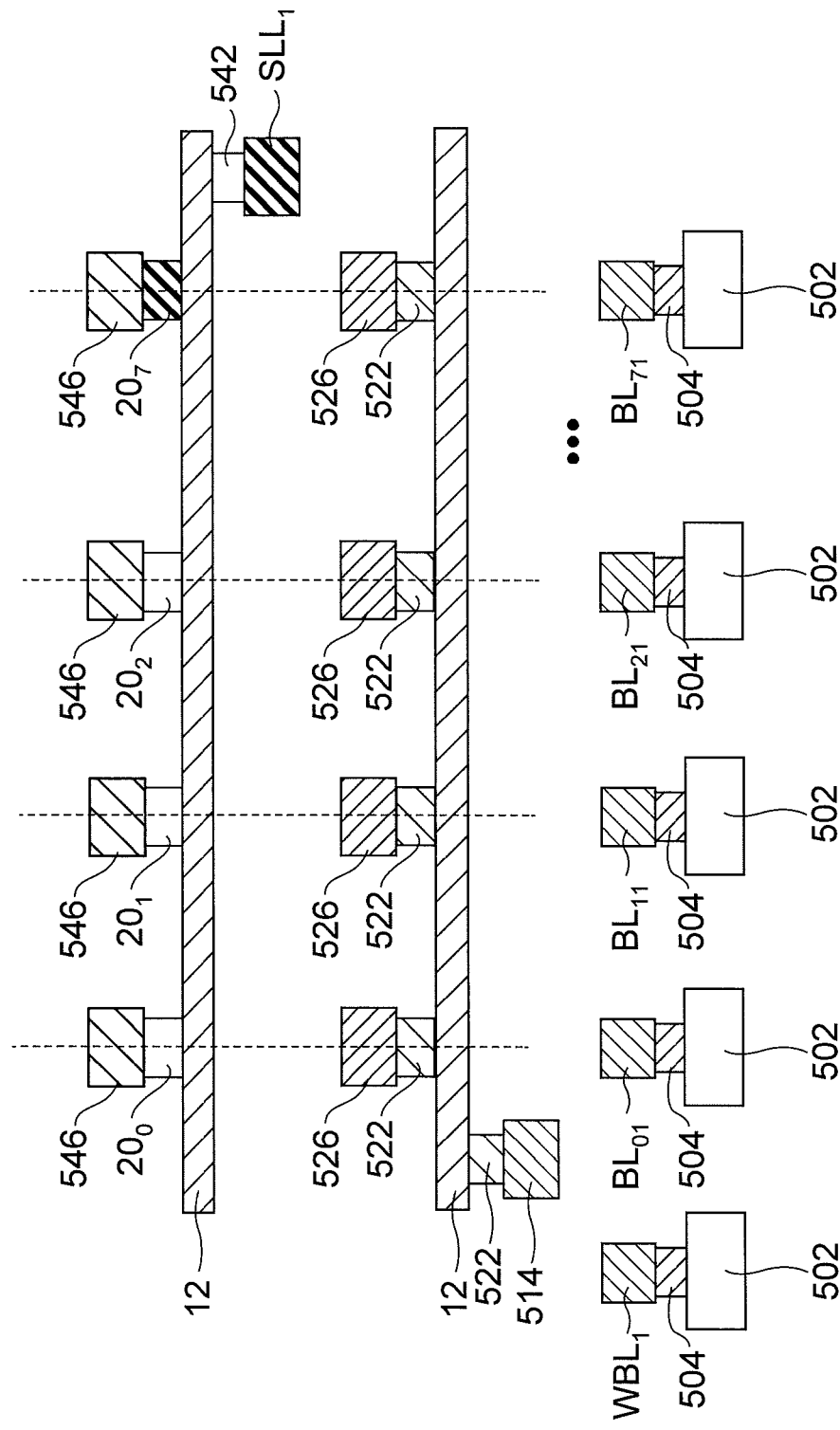
FIG. 77F is a cross-sectional view taken along line F-F in FIG. 76.

FIG. 77A is a cross-sectional view of the magnetic memory according to the third embodiment thus manufactured, taken along line A-A of FIG. 76, FIG. 77B is a cross-sectional view taken along line B-B, FIG. 77C is a cross-sectional view taken along line C-C, FIG. 77D is a cross-sectional view taken along line D-D, FIG. 77E is a cross-sectional view taken along line E-E, and FIG. 77F is a cross-sectional view taken along line E-E. The cross-sectional views show the up-and-down and left-and-right positional relationships in the layered structure, but do not show physical dimensions. In the actual manufacturing process, the shapes and the dimensions of the elements are designed in accordance with the alignment accuracy of the device or the process so as to ensure reliable connections of the vias and the metal wiring lines.

FIG. 77A is a cross-sectional view taken along the active area 502 of the selection transistor $25_7$ connecting to the bit line $BL_{70}$ to which the memory cells $10_{00}$ and $10_{10}$ are connected. The active area 502 to which the word lines $WL_{00}$ and $WL_{10}$ are connected is disposed on the word lines $WL_{00}$ and $WL_{10}$, and the source line $SLR_0$ is disposed above the active area 502 and connected to the active area 502 by the via 504. The metal wiring line 526 is disposed above the active area 502 and connected to the active area 502 by the vias 512, 522, and 524. The memory element $20_7$ of the memory cell $10_{00}$ is disposed under the metal wiring line 526, and the conductive layer 12 is disposed under the memory element $20_7$. The metal wiring line 546 is disposed above the active area 502, and connected to the active area 502 by the vias 512, 522, 524, 532, 542, and 544. The memory element $20_7$ of the memory cell $10_{10}$ is disposed under the metal wiring line 546, and the conductive layer 12 is disposed under the memory element $20_7$.

FIG. 77B is a cross-sectional view showing the connection of the source line $SLR_0$ and the conductive layer 12 in a direction parallel to the short sides of the conductive layers 12 for the memory cells $10_{00}$ and $10_{10}$. The source line $SLR_0$ is disposed above a region between the word line $WL_{00}$ and the word line $WL_{10}$, and the conductive layer 12 is disposed above the source line $SLR_0$ and connected to the source line $SLR_0$ by the via 522. The metal wiring line 534 is disposed above the conductive layer 12, and another conductive layer 12 is disposed above the metal wiring line 534 and connected to the metal wiring line 534 by the via 542.

FIG. 77C is a cross-sectional view taken along the active area 502 for the selection transistors 31 and 31a connecting to the write bit line $WBL_1$ to which the memory cells $10_{01}$ and $10_{10}$ are connected. The write bit line $WBL_1$ is disposed above the active areas 502 and connected to the active area 502 by the via 504. The metal wiring line 514 is disposed above the active area 502 and connected to the active area 502 by the via 512. The metal wiring line 534 is disposed above the active area 502 and connected to the active area 502 by the vias 512, 522, 524, and 532.

FIG. 77D is a cross-sectional view showing the connection of the source line $SLL_1$ and the conductive layers 12 in the direction parallel to the short sides of the conductive layers 12 for the memory cells $10_{01}$ and $10_{11}$. The metal wiring line 526 is disposed above the region between word line $WL_{00}$ and the word line $WL_{10}$, and the conductive layer 12 of the memory cell $10_{01}$ is disposed above the metal wiring line 526 and connected to the metal wiring line 526 by the via 522. The source line $SLL_1$ is disposed above the conductive layer 12, and the conductive layer 12 of the memory cell $10_{11}$ is disposed above the source line $SLL_1$ and connected to the source line $SLL_1$ by the via 542.

FIG. 77E is a cross-sectional view taken along the active area 502 of the selection transistor $25_0$ connecting to the bit line $BL_{01}$ to which the memory cells $10_{01}$ and $10_{11}$ are connected. The bit line $BL_{01}$ is disposed above the active area 502 and connected to the active area 502 by the via 504. The metal wiring line 526 is disposed above the active area 502 and connected to the active area 502 by the vias 512, 522, and 524, and the memory element $20_1$ of the memory cell $10_{01}$ is disposed under the metal wiring line 526. The conductive layer 12 is disposed under the memory element $20_1$. The metal wiring line 546 is disposed above the active area 502 and connected to the active area 502 by the vias 512, 522, 524, 532, 542, and 544. The memory element $20_1$ of the memory cell $10_{11}$ is disposed under the metal wiring line 546, and the conductive layer 12 is disposed under the memory element $20_1$.

FIG. 77F is a cross-sectional view taken in a direction parallel to the long sides of the conductive layers 12 of the memory cells $10_{01}$ and $10_{11}$. The metal wiring line 514 is disposed above a region between the write bit line $WBL_1$ and the bit line $BL_{01}$. The conductive layer 12 of the memory cell $10_{01}$ is disposed above the metal wiring line 514 and connected to the metal wiring line 514 by the via 522, and a plurality of metal wiring lines 526 is disposed above the conductive layer 12 and connected to the conductive layer 12 by a plurality of vias 522. The conductive layer 12 of the memory cell $10_{11}$ is disposed above the metal wiring lines 526, the memory elements $20_0$ to $20_7$ are disposed on the conductive layer 12, and a metal wiring line 546 is disposed on each memory element. The source line $SLL_1$ is disposed below the conductive layer 12 of the memory cell $10_{11}$ and connected to the conductive layer 12 by the via 542.

As can be understood from FIGS. 77A to 77F, the memory elements are disposed on the conductive layer and in contact with the conductive layer. The memory elements $20_0$ to $20_7$ of the memory cells $10_{00}$, $10_{01}$, $10_{20}$, and $10_{21}$ and the memory elements $20_0$ to $20_7$ of the memory cells $10_{10}$, $10_{11}$, $10_{30}$, and $10_{31}$ are on the same line in the row direction (horizontal direction) but also on the same line in the column direction (vertical direction). The problem of interference between memory elements is solved by the first embodiment and the second embodiment. If, however, memory elements that are adjacent to each other in the row direction are satisfactorily spaced apart from each other, no interference occurs between the memory elements. Therefore, the arrangement of the memory elements according to the third embodiment is possible.

As has been described above, according to the third embodiment, a magnetic memory with memory cells arranged with a high density may be provided.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A magnetic memory comprising:
a first wiring, a second wiring, a third wiring, and a fourth wiring;
a first terminal, and a second terminal electrically connected to the fourth wiring;
a first conductive layer including a first region, a second region, and a third region, the second region being between the first region and the third region, the first region being electrically connected to the first terminal, and the third region being electrically connected to the second terminal;
a first magnetoresistive element disposed corresponding to the second region and including a first magnetic layer, a second magnetic layer disposed between the first magnetic layer and the second region, and a first nonmagnetic layer disposed between the first magnetic layer and the second magnetic layer;
a first transistor including a third terminal electrically connected to the first magnetic layer, a fourth terminal electrically connected to the third wiring, and a first control terminal electrically connected to the first wiring; and
a second transistor including a fifth terminal electrically connected to the first terminal, a sixth terminal electrically connected to the second wiring, and a second control terminal electrically connected to the first wiring,
wherein the first wiring, the second wiring, the third wiring, the first transistor, and the second transistor are disposed on a first level, the first conductive layer and the first magnetoresistive element are disposed on a second level that is above the first level, and the fourth wiring is disposed on a third level that is above the second level.

2. The magnetic memory according to claim 1, further comprising:
a fifth wiring;
a second magnetoresistive element; and
a third transistor including a seventh terminal, an eighth terminal, and a third control terminal,
wherein
the first conductive layer further includes a fourth region disposed between the second region and the third region,
the second magnetoresistive element is disposed corresponding to the fourth region, and includes a third magnetic layer, a fourth magnetic layer disposed between the fourth region and the third magnetic layer, and a second nonmagnetic layer disposed between the third magnetic layer and the fourth magnetic layer, and
the seventh terminal of the third transistor is electrically connected to the third magnetic layer, the eighth terminal is electrically connected to the fifth wiring, and the third control terminal is electrically connected to the first wiring.

3. The magnetic memory according to claim 1, further comprising a fourth transistor including a ninth terminal electrically connected to the second terminal, a tenth terminal electrically connected to the fourth wiring, and a fourth control terminal electrically connected to the first wiring.

4. The magnetic memory according to claim 1, wherein directions in which the second wiring, the third wiring, and the fourth wiring extend intersect with a direction in which the first wiring extends.

5. A magnetic memory, comprising:
a first wiring, a second wiring, a third wiring, and a fourth wiring;
a first terminal, and a second terminal electrically connected to the fourth wiring;
a first conductive layer including a first region, a second region, and a third region, the second region being between the first region and the third region, the first region being electrically connected to the first terminal, and the third region being electrically connected to the second terminal;
a first magnetoresistive element disposed corresponding to the second region and including a first magnetic layer, a second magnetic layer disposed between the first magnetic layer and the second region, and a first nonmagnetic layer disposed between the first magnetic layer and the second magnetic layer;
a first transistor including a third terminal electrically connected to the first magnetic layer, a fourth terminal electrically connected to the third wiring, and a first control terminal electrically connected to the first wiring; and
a second transistor including a fifth terminal electrically connected to the first terminal, a sixth terminal electrically connected to the second wiring, and a second control terminal electrically connected to the first wiring,
wherein the first wiring, the second wiring, the third wiring, the first transistor, and the second transistor are disposed on a first level, the first conductive layer and the first magnetoresistive element are disposed on a second level that is above the first level, the fourth wiring is disposed on a third level that is above the second level, and the first magnetoresistive element is disposed above the first conductive layer.

6. A magnetic memory comprising:
a first wiring, a second wiring, a third wiring, a fourth wiring, and a fifth wiring;
a first terminal, a second terminal, a third terminal, and a fourth terminal, the second terminal and the fourth terminal being electrically connected to the fifth wiring;
a first conductive layer including a first region, a second region, and a third region, the second region being between the first region and the third region, the first region being electrically connected to the first terminal, and the third region being electrically connected to the second terminal;
a second conductive layer including a fourth region, a fifth region, and a sixth region, the fifth region being between the fourth region and the sixth region, the fourth region being electrically connected to the third terminal, and the sixth region being electrically connected to the fourth terminal;
a first magnetoresistive element disposed corresponding to the second region and including a first magnetic layer, a second magnetic layer disposed between the first magnetic layer and the second region, and a first nonmagnetic layer disposed between the first magnetic layer and the second magnetic layer;
a second magnetoresistive element disposed corresponding to the fifth region and including a third magnetic layer, a fourth magnetic layer disposed between the third magnetic layer and the fifth region, and a second nonmagnetic layer disposed between the third magnetic layer and the fourth magnetic layer;
a first transistor including a fifth terminal electrically connected to the first magnetic layer, a sixth terminal electrically connected to the third wiring, and a first control terminal electrically connected to the first wiring;
a second transistor including a seventh terminal electrically connected to the first terminal, an eighth terminal electrically connected to the second wiring, and a second control terminal electrically connected to the first wiring,
a third transistor including a ninth terminal electrically connected to the third magnetic layer, a tenth terminal electrically connected to the third wiring, and a third control terminal electrically connected to the fourth wiring; and a fourth transistor including an eleventh terminal electrically connected to the third terminal, a twelfth terminal electrically connected to the second wiring, and a fourth control terminal electrically connected to the fourth wiring, wherein the first wiring, the second wiring, the third wiring, the fourth wiring, the first transistor, the second transistor, the third transistor, and the fourth transistor are disposed on a first level, the first conductive layer and the first magnetoresistive element are disposed on a second level that is above the first level, the fifth wiring is disposed on a third level that is above the second level, and the second conductive layer and the second magnetoresistive element are disposed on a fourth level that is above the third level.

7. The magnetic memory according to claim 6, wherein the first magnetoresistive element is disposed above the first conductive layer, and the second magnetoresistive element is disposed above the second conductive layer.

8. The magnetic memory according to claim 6, further comprising:

a sixth wiring;

a third magnetoresistive element and a fourth magnetoresistive element;

a fifth transistor including a thirteenth terminal, a fourteenth terminal, and a fifth control terminal; and a sixth transistor including a fifteenth terminal, a sixteenth terminal, and a sixth control terminal, wherein the first conductive layer further includes a seventh region disposed between the second region and the third region, the second conductive layer further includes an eighth region disposed between the fifth region and the sixth region, the third magnetoresistive element is disposed corresponding to the seventh region and includes a fifth magnetic layer, a sixth magnetic layer disposed between the seventh region and the fifth magnetic layer, and a third nonmagnetic layer disposed between the fifth magnetic layer and the sixth magnetic layer, the fourth magnetoresistive element is disposed corresponding to the eighth region and includes a seventh magnetic layer, an eighth magnetic layer disposed between the eighth region and the seventh magnetic layer, and a fourth nonmagnetic layer disposed between the seventh magnetic layer and the eighth magnetic layer, the thirteenth terminal of the fifth transistor is electrically connected to the fifth magnetic layer, the fourteenth terminal is electrically connected to the sixth wiring, and the fifth control terminal is electrically connected to the first wiring, and the fifteenth terminal of the sixth transistor is electrically connected to the seventh magnetic layer, the sixteenth terminal is electrically connected to the sixth wiring, and the sixth control terminal is electrically connected to the fourth wiring.

9. The magnetic memory according to claim 8, wherein the fifth transistor and the sixth transistor are disposed on the first level.

10. The magnetic memory according to claim 6, wherein directions in which the second wiring, the third wiring, and the fifth wiring extend intersect with directions in which the first wiring and the fourth wiring extend.

* * * * *